(12) United States Patent
Koike et al.

(10) Patent No.: US 6,965,191 B2
(45) Date of Patent: Nov. 15, 2005

(54) DISPLAY FILTER, DISPLAY APPARATUS, AND METHOD FOR PRODUCTION OF THE SAME

(75) Inventors: Katsuhiko Koike, Sodegaura (JP); Tomoyuki Okamura, Sodegaura (JP); Toshihisa Kitagawa, Sodegaura (JP); Hiroaki Saigo, Sodegaura (JP); Shin Fukuda, Sodegaura (JP); Fumiharu Yamazaki, Nagoya (JP); Taizo Nishimoto, Sodegaura (JP); Tsutami Misawa, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 206 days.

(21) Appl. No.: 10/182,774

(22) PCT Filed: Feb. 1, 2001

(86) PCT No.: PCT/JP01/00695

§ 371 (c)(1),
(2), (4) Date: Nov. 13, 2002

(87) PCT Pub. No.: WO01/57833

PCT Pub. Date: Aug. 9, 2001

(65) Prior Publication Data

US 2003/0156080 A1    Aug. 21, 2003

(30) Foreign Application Priority Data

Feb. 1, 2000 (JP) .......................................... 2000-24183
Feb. 1, 2000 (JP) .......................................... 2000-24184
Feb. 1, 2000 (JP) .......................................... 2000-24185
Jun. 15, 2000 (JP) ....................................... 2000-180501
Jul. 13, 2000 (JP) ....................................... 2000-213431
Dec. 18, 2000 (JP) ....................................... 2000-38410

(51) Int. Cl.$^7$ ...................... H01J 5/16; H01J 61/40; H01K 1/26; H01K 1/30

(52) U.S. Cl. ................... 313/112; 313/477 R; 313/461; 359/585; 427/66; 428/690

(58) Field of Search ................................. 313/112, 461, 313/477 R, 478, 479, 480; 359/359, 360, 585, 589; 428/690; 427/162, 64, 66

(56) References Cited

U.S. PATENT DOCUMENTS 4,841,372 A * 6/1989 Lee ............................. 348/824
5,271,872 A   12/1993 Sallavanti et al.
5,506,079 A    4/1996 Grigoryan et al.

(Continued)

FOREIGN PATENT DOCUMENTS

CN    1087206 A    5/1994
EP    0 596 531 A1  5/1994

(Continued)

OTHER PUBLICATIONS

Encyclopedia of Adhesion and Viscosity, Japan, published by Asakura Publishing Co., Ltd., Feb. 15, 1986, pp. 280–283.

Fujitsu Limited, Image Site, Catalog AD 25–90004–2C, Japan, Apr. 1997.

*Primary Examiner*—Joseph Williams
*Assistant Examiner*—Kevin Quarterman
(74) *Attorney, Agent, or Firm*—Burns, Doane, Swecker & Mathis, LLP

(57) ABSTRACT

The display filter is constituted by laminating a transparent adhesive layer (C) 31 containing dye, a polymer film (B) 20, a transparent electrically conductive layer (D) 10, a transparent adhesive layer (E) 40, and a functional transparent layer (A) 60 having an anti-reflection property, a hard coat property, a gas barrier property, an antistatic property and an anti-fouling property sequentially in this order, adhered on a display area 00; on this occasion, the transparent electrically conductive layer (D) 10 is grounded to a ground terminal of the display via an electrode 50 and an electrically conductive copper foil adhesive tape 80.

57 Claims, 12 Drawing Sheets

U.S. PATENT DOCUMENTS

| | | | |
|---|---|---|---|
| 5,597,405 A | | 1/1997 | Grigoryan et al. |
| 5,879,217 A | * | 3/1999 | Saito et al. .................... 445/23 |
| 5,945,209 A | | 8/1999 | Okazaki et al. |
| 6,104,530 A | * | 8/2000 | Okamura et al. ........... 359/359 |
| 6,225,778 B1 | | 5/2001 | Hayama et al. |
| 6,255,778 B1 | | 7/2001 | Yoshikawa et al. |
| 6,333,592 B1 | | 12/2001 | Sasa et al. |
| 6,678,016 B1 | * | 1/2004 | Hanaoka ..................... 348/841 |
| 6,797,396 B1 | * | 9/2004 | Liu et al. .................... 428/483 |

FOREIGN PATENT DOCUMENTS

| | | |
|---|---|---|
| JP | 58-153904 | 9/1983 |
| JP | 59-221943 | 12/1984 |
| JP | 60-22102 | 2/1985 |
| JP | 08-037105 A | 2/1996 |
| JP | 8-220303 | 8/1996 |
| JP | 9-51494 | 2/1997 |
| JP | 9-230797 | 9/1997 |
| JP | 9-247582 A | 9/1997 |
| JP | 10-75087 | 3/1998 |
| JP | 10-119164 A | 5/1998 |
| JP | 10-156991 | 6/1998 |
| JP | 10-180947 A | 7/1998 |
| JP | 10-187056 A | 7/1998 |
| JP | 10-188822 | 7/1998 |
| JP | 10-211668 | 8/1998 |
| JP | 11-65463 | 3/1999 |
| JP | 11-119673 A | 4/1999 |
| JP | 11-126024 A | 5/1999 |
| JP | 11-130971 A | 5/1999 |
| JP | 11-185641 A | 7/1999 |
| JP | 11-204046 | 7/1999 |
| JP | 99-39224 A1 | 8/1999 |
| JP | 11-212475 A | 8/1999 |
| JP | 11-233992 | 8/1999 |
| JP | 11-251782 | 9/1999 |
| JP | 11-281816 A | 10/1999 |
| JP | 11-282365 | 10/1999 |
| JP | 11-344935 A | 12/1999 |
| JP | 2000-059085 A | 2/2000 |
| JP | 2000-98131 | 4/2000 |
| JP | 2000-216589 A | 8/2000 |
| JP | 2000-258626 A | 9/2000 |
| JP | 2001-013877 A | 1/2001 |

* cited by examiner

DISPLAY FILTER, DISPLAY APPARATUS, AND METHOD FOR PRODUCTION OF THE SAME

TECHNICAL FIELD

This invention relates to a display filter which is disposed on a screen of a display such as a plasma display (PDP), a Braun tube (CRT), and a liquid crystal display apparatus (LCD) and which has filter characteristics that are capable of shielding other electromagnetic waves than a visible light from among electromagnetic waves to be generated from the display screen and/or other filter characteristics that are capable of correcting a visible light spectrum, a display apparatus mounted with the filter and a method for production of the same.

BACKGROUND ART

With the rapid development of information system in society, a photoelectronic component and equipment have been markedly advanced and popularized. Among other things, a display has spread wide for use in a television set, a personal computer, or the like, and the display is required for increasing a size thereof as well as decreasing thickness thereof. A plasma display has attracted attention as a thin-type display in a large size. However, on the basis of a structure and an operational principle thereof, the plasma display emits an intense leakage electromagnetic field and a near-infrared ray from a display screen.

In recent years, an influence of the leakage electromagnetic wave on the human body and other electronic equipment has come to be a topic to be discussed, and, for example, it has become necessary to keep the leakage electromagnetic wave within limits set by VCCI (Voluntary Control Council for Interference by Data Processing Equipment and Electronic Office Machines) in Japan.

Moreover, there is a possibility that the near-infrared ray emitted from the display screen may act on the electronic equipment such as a cordless phone located around the display and cause malfunction thereof. Since near-infrared rays having wavelengths of 820 nm, 880 nm, 980 nm and the like are used in a remote controller and optical communication by a transmission system, it is necessary to suppress light having a wavelength in a range of from 800 to 1100 nm which is in a near-infrared region to such a level as does not cause a problem in practical use.

With regard to cutting-off of the near-infrared ray, it has been known that a near-infrared absorption filter produced by using a near-infrared absorbing dye is used. However, since the near-infrared absorbing dye is liable to be deteriorated by environmental factors such as humidity, heat and light, there is a tendency that the near-infrared absorption filter which uses the dye may undergo changes in optical properties such as decrease in near-infrared ray cutting-off capacity, and a change of a color transmitted through the filter with the lapse of time.

Since the plasma display emits the intense near-infrared ray over a wide wavelength range, it is necessary to use the near-infrared absorption filter having a high absorption index for the near-infrared region over a wide wavelength range. However, in a conventional near-infrared absorption filter, only a near-infrared absorption filter in which visible light ray transmittance is low has been realized.

In order to cut off the leakage electromagnetic wave, it is necessary to cover a surface of the display screen with an electrically conductive substance having high electric conductivity. A transparent electrically conductive layer is ordinarily used as such a method and, on this occasion, such transparent electrically conductive layers are broadly classified into 2 categories: an electrically conductive mesh; and a transparent electrically conductive thin film. As the electrically conductive mesh, ordinarily used is a grounded metallic mesh, a synthetic fiber mesh or a metallic fiber mesh which has been coated with a metal, an etched film which has been produced by first forming a metallic film and then performing an etching treatment on the thus-formed film in a lattice pattern manner or the like.

There is a method to use a transparent electrically conductive thin film comprising a metallic thin film, an oxide semiconductor thin film and the like as an electromagnetic wave shielding layer, instead of using the electric conductive mesh. However, the metallic thin film can obtain favorable electric conductivity, but fails to provide a high visible light ray transmittance owing to reflection and absorption by the metal over a wide wavelength range. The oxide semiconductor thin film has higher transparency than that of the metallic thin film, but is inferior in electric conductivity and near-infrared reflectivity. As described above, with reference to the transparent electrically conductive layer for the purpose of cutting-off the leakage electromagnetic field, there are many cases in which, when the shield capacity thereof is regarded as being important, the electrically conductive mesh is used while, when cost performance is regarded as being important, the transparent electrically conductive thin film is used.

Further, a method using a dye for trying to improve a color purity of the display is described in, for example, Japanese Unexamined Patent Publication JP-A 58-153904 (1983), JP-A 60-22102 (1985), or JP-A 59-221943 (1984) and the like. An application thereof to a plasma display panel is recited in JP-A 58-153904.

However, in these prior arts, there is no recitation on a combination of a transparent electrically conductive layer as electromagnetic wave shielding which is essential when applied to the plasma display panel and a dye, and there is also no specific recitation on the dye to be used.

It is considered that a plasma display filter is formed separately from the display and, then, disposed as a front surface panel of the display for the purposes of cutting off the near-infrared rays and electromagnetic waves, and protecting the display screen. However, such a front surface panel method brings about a cost increase owing to a many number of components and/or production processes of the plasma display filter whereupon it becomes difficult to allow the plasma display filter to be smaller in thickness and lighter in weight.

Further, reflection on a surface of a representation portion of the plasma display is not ordinarily decreased and reflectance of a glass substrate is maintained; on this occasion, when the front surface panel is disposed apart from the representation portion from a viewpoint of thermal design and the like, a reflected image becomes double-or-more-images caused by reflections of external light on the display surface and the front surface panel whereupon there is a case in which visibility of the display is deteriorated. Still further, the plasma display has characteristics that, due to reflection of glass or phosphor on the surface of the screen, contrast in a bright place is low as well as a color reproduction gamut of luminescence is narrow.

On the other hand, methods of removing the front surface panel and, then, directly bonding an optical film on the display panel are proposed in Japanese Unexamined Patent Publications JP-A 10-156991 (1998), JP-A 10-188822 (1998), JP-A 2000-98131 (2000) and the like. However, any of these prior arts does not define total thickness of a whole transparent polymer film and does not specifically recite provision of shock resistance.

To contrast, in Japanese Unexamined Patent Publication JP-A 10-211688 (1998), it is proposed that, in order to absorb shock from outside, an optical film for use in direct bonding is laminated on a transparent polymer sheet having a thickness of 1 mm or more and the resultant laminate is used. However, it is difficult from a practical point of view that the transparent polymer sheet having a thickness of 1 mm or more in roll form is subjected to a continuous bonding process or is directly bonded on the display and, as seen in an embodiment, since bonding is performed to an acrylic sheet having a thickness of 3 mm, it is apparent that an improvement of a known front surface panel type filter based on sheet bonding has been intended.

Ordinarily, the transparent polymer film having various types of functions in application fields according to the present invention is used in roll form and, from the standpoint of operational efficiency and the like, the transparent polymer film having a thickness of from 75 to 100 $\mu$m is used. Therefore, when 2 sheets of the transparent polymer films each having a function are simply bonded with each other, a total thickness merely comes to be less than 0.3 mm. Further, as an anti-reflection film, that having a thickness of 188 $\mu$m has been used in some cases and, in these cases, a base film thereof was polyethylene terephthalate (PET); however, since it is inferior in an anti-reflection property to triacetyl cellulose (TAC) in which a favorably used base film is 80 $\mu$m thick, it is not used in a positive manner for the purpose of bonding films with each other.

Further, when a film is directly bonded on a display panel body, since the display itself is expensive, it is indispensable to remove the film for a treatment at the time a problem occurs; however, in the foregoing patent, there is no recitation on workability of this type. Still further, though bonding of the film to the display has already been performed in a liquid crystal display, a flat television set and the like, since the plasma display comes to be substantially large in size, there are operational problems that it is troublesome to require much force in removing the film therefrom than that in a conventional display, a paste tends to remain on the surface of the display and the like.

Further, in an electromagnetic wave shielding body, it is necessary to establish conduction between the transparent electrically conductive layer and an outside by using an electrode which leads the electromagnetic wave out to the outside as an electric current. As a method to attain such a necessity, there is mentioned that, when a film is bonded on the transparent electrically conductive layer for a protection purpose and the like, the film is bonded such that a portion of the layer is exposed on a periphery of the filter to allow the thus-exposed portion to become a position which performs electric conduction with the outside as an electrode. Conventionally, the electromagnetic wave shielding body obtained by bonding the film to the front surface panel has established conduction with the outside by this method. As methods of exposing the transparent electrically conductive layer, various types of methods have been performed, for example, a method in which a surface area of the film to be bonded on the transparent electrically conductive layer is allowed to be a little smaller than that of the transparent electrically conductive layer and other methods.

When this method is applied, since it is necessary to perform a two-step bonding operation in which a film comprising a transparent electrically conductive layer is first bonded in a sheet state to a plate having high rigidity or the like and, then, a protective film having a little smaller area than that of the resultant bonded material is further bonded in a sheet state to the resultant bonded material, there is a problem in productivity.

Further, in the electromagnetic wave shielding body conventionally obtained by bonding the film to the front surface panel, an electrode has been disposed on an entire peripheral portion thereof. When such a method is used, since it is necessary to perform an electrode forming operation in a sheet state, there is a problem in productivity.

In view of the conventional methods, it is an object of the invention to provide a display filter which has desired filter characteristics such as electromagnetic wave shielding capacity, near-infrared ray cutting-off capacity, and image improvement capacity and which is capable of aiming for improvements such as a low cost, a lighter weight, a smaller thickness, a panel protection, workability when a trouble occurs, and enhancement of productivity, a display apparatus mounted with the filter, and a method for production of the same.

DISCLOSURE OF INVENTION

As a result of intensive investigations conducted in order to solve the problems, the present inventors have found that 1) a transparent electrically conductive layer having a surface resistance of from 0.01 to 30 $\Omega$/square is necessary to shield an extremely intense electromagnetic wave emitted from a plasma display; 2) a display apparatus using the plasma display excellent in electromagnetic wave shielding capacity, near-infrared ray cutting-off capacity and an image/visibility/a cost can be obtained by forming an electromagnetic wave shielding body equipped with such a transparent electrically conductive layer directly on a surface of the plasma display; 3) the display apparatus using a display excellent in the image/visibility/the cost can be obtained by forming a light control film which has a specified layer constitution, contains a dye and has visible light ray transmittance of from 30 to 85% directly on the surface of the display; 4) On a basis of attaining lighter weight and smaller thickness as well as panel protectivity, an enhancement of workability can be attained by setting a total thickness of a transparent polymer film which constitutes an optical filter to be 0.3 mm or more and, then, bonding the thus-set film directly on a front surface of the display; and 5) an electrode formation can be performed by a roll-to-roll method which has high production efficiency by setting limits on a position at which the electrode is formed, for example, forming the electrode only on a pair of two sides of an optical filter facing with each other when the optical filter is rectangular and, at the same time, by devising an appropriate shape of the electrode, and other things. The invention has been completed on the basis of this finding.

The invention provides a display filter capable of being adhered to a display screen and having predetermined filter characteristics, comprising:

a functional transparent layer (A) disposed in an atmospheric side, having an anti-reflection property and/or an anti-glare property;

a transparent adhesive layer (C) disposed in a display side, for allowing the display filter to be adhered to the screen; and a polymer film (B) disposed as a substrate between the functional transparent layer (A) and the transparent adhesive layer (C).

In the invention, it is preferable that a transparent electrically conductive layer (D) having a surface resistance of from 0.01 to 30 Ω/square is disposed between the functional transparent layer (A) and the polymer film (B) and/or between the polymer film (B) and the transparent adhesive layer (C).

In the invention, it is preferable that a portion or entirety of the transparent electrically conductive layer (D) is constituted by an electrically conductive mesh.

In the invention, it is preferable that the transparent electrically conductive layer (D) is constituted by firstly laminating a repeating unit (Dt)/(Dm) comprising a high-refractive-index transparent thin film layer (Dt) and a metallic thin film layer (Dm) while repeating the repeating unit from 2 times to 4 times and, then, on the resultant laminate, further laminating a high-refractive-index thin film layer (Dt).

In the invention, it is preferable that at least one layer of a plurality of high-refractive-index transparent thin film layers (Dt) is formed by an oxide containing, as a major component, at least one metal selected from the group consisting of indium, tin and zinc.

In the invention, it is preferable that at least one layer of a plurality of metallic thin film layers (Dm) is formed of silver or an alloy comprising silver.

In the invention, it is preferable that the functional transparent layer (A) further has at least one function selected from the group consisting of a hard coat property, an antistatic property, an anti-fouling property, a gas barrier property and an ultraviolet cutting-off property.

In the invention, it is preferable that an adhesive layer (E) is disposed between the functional transparent layer (A) and the polymer film (B).

In the invention, it is preferable that a hard coat layer (F) is formed on both surfaces or one surface of the polymer film (B).

In the invention, it is preferable that at least one dye is contained in at least one layer selected from the group consisting of: the functional transparent layer (A), the polymer film (B), the transparent adhesive layer (C), a transparent electrically conductive layer (D), the adhesive layer (E) and the hard coat layer (F).

In the invention, it is preferable that a dye having an absorption maximum in a wavelength range from 570 to 605 nm is contained.

In the invention, it is preferable that the dye is a tetraazaporphyrin compound.

In the invention, it is preferable that the tetraazaporphyrin compound is expressed by the following formula (1):

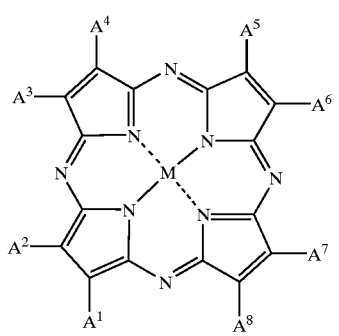

(1)

wherein $A^1$ to $A^8$ each individually represent a hydrogen atom, a halogen atom, a nitro group, a cyano group, a hydroxy group, a sulfonic acid group, an alkyl group having carbon atoms of from 1 to 20, a halogenoalkyl group, an alkoxy group, an alkoxyalkyl group, an aryloxy group, a monoalkylamino group, dialkylamino group, an aralkyl group, an aryl group, a heteroaryl group, an alkylthio group, or an arylthio group; combinations of $A^1$ and $A^2$, $A^3$ and $A^4$, $A^5$ and $A^6$, and $A^7$ and $A^8$ may each individually form a ring except an aromatic ring via a connecting group; and M represents two hydrogen atoms, a divalent metal atom, a trivalent metal atom having one substituent, a tetravalent metal atom having two substituents, or an oxy metal atom.

In the invention, it is preferable that a near-infrared ray absorption dye having an absorption maximum in a wavelength range of from 800 to 1100 nm is contained.

In the invention, it is preferable that visible light ray reflectance on a surface of the functional transparent layer (A) is 2% or less.

In the invention, it is preferable that visible light ray transmittance is from 30 to 85%.

In the invention, it is preferable that transmittance minimum in a wavelength range of from 800 to 1100 nm is 20% or less.

In the invention, it is preferable that a total thickness of the polymer film in entirety of the filter is 0.3 mm or more.

In the invention, it is preferable that a polymer film for increasing a total thickness capable of containing a dye is provided.

In the invention, it is preferable that an electrode electrically connected with the transparent electrically conductive layer (D) is formed.

In the invention, it is preferable that the electrode electrically contacting with the transparent electrically conductive layer (D) is continuously formed along a circumferential direction in a peripheral portion of the filter.

In the invention, it is preferable that an electrode is formed in an electrically conducting portion a part of which is exposed.

In the invention, it is preferable that the filter is shaped into a rectangle and electrodes are formed in two surrounding sides facing to each other.

In the invention, it is preferable that the electrode electrically connected with the transparent electrically conductive layer (D) is formed on a surface of a peripheral edge of the filter.

In the invention, it is preferable that a communicating hole which communicates from an outermost surface of the filter through to at least the transparent electrically conductive layer (D) is formed along a thickness direction of the filter wherein an electrode which electrically is connected with the transparent electrically conductive layer (D) is formed inside the communication hole.

In the invention, it is preferable that an electrically conductive tape is interposed between the transparent electrically conductive layer (D) and a layer adjacent to the transparent electrically conductive layer (D).

The invention also provides a display apparatus, comprising:

a display for representing an image; and a display filter, disposed on a display screen.

The invention also provides a method for production of a display apparatus, comprising the steps of:

laminating a display filter on a display screen of a display apparatus via a transparent adhesive layer (C); and electrically connecting a ground conductor of the display apparatus and the electrode of the transparent electrically conductive layer (D).

The invention also provides a method of production of a display apparatus, comprising the steps of:

laminating a laminate filter comprising a polymer film (B), a transparent electrically conductive layer (D), and a transparent adhesive layer (C) on a display screen via the transparent adhesive layer (C);

arranging a functional transparent layer (A) having an anti-reflection property and/or an anti-glare property on the laminate filter directly or via a second adhesive layer; and electrically connecting a ground conductor of the display apparatus and the transparent electrically conductive layer (D).

The invention also provides a method for production of a display apparatus, characterized by comprising the steps of:

arranging an adhesive layer on a display screen of a display apparatus;

bonding a laminate filter comprising a polymer film (B), a transparent electrically conductive layer (D), and a functional transparent layer (A) having an anti-reflection property and/or an anti-glare property on the display screen via the adhesive layer; and electrically connecting a ground conductor and the transparent electrically conductive layer (D).

The invention also provides a method for production of a display apparatus, comprising the steps of:

arranging an adhesive layer on a display screen;

bonding a laminate filter comprising a polymer film (B), and a transparent electrically conductive layer (D) on the display screen via the adhesive layer;

arranging a functional transparent layer (A) having an anti-reflection property and/or an anti-glare property on the laminate filter directly or via a second adhesive layer; and electrically connecting a ground conductor and the transparent electrically conductive layer (D).

BRIEF DESCRIPTION OF DRAWINGS

Other and further objects, features, and advantages of the invention will be more explicit from the following detailed description taken with reference to the drawings wherein.

BEST MODE FOR CARRYING OUT THE INVENTION

Figure 1:
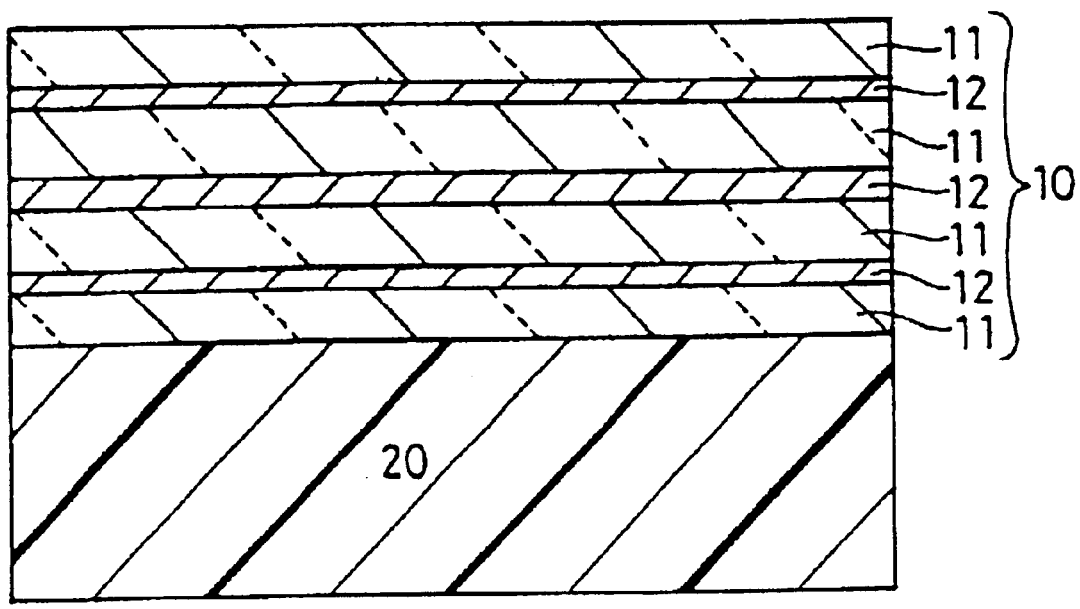
FIG. 1 is a cross-sectional view of an example of a polymer film (B)/a transparent electrically conductive layer (D) according to the present invention.

A display filter, a display apparatus and a method for production of the same according to the present invention are now described in detail with reference to the preferred embodiments shown in the accompanying drawings.

The display filter according to the invention functions as a light control film having filter characteristics which correct a visible light spectrum of a display screen by containing a dye having an absorption maximum in a wavelength range of from 570 to 605 nm.

Further, the display filter according to the invention functions as an electromagnetic wave shielding body having filter characteristics which shield an electromagnetic wave from a display screen by comprising a transparent electrically conductive layer having a surface resistance of from 0.01 to 30 Ω/square.

Further, the display filter according to the invention functions as a near-infrared ray filter having filter characteristics which shield a near-infrared ray from the display screen by containing a near-infrared absorbing dye having an absorption maximum in a wavelength range of from 800 to 1100 nm.

The display filter having such functions is bonded directly on a surface of the display such as a plasma display whereby improvements such as cost reduction, a weight reduction/a thickness reduction, an enhancements of a panel protection property, workability at the time of a problem occurrence, and productivity can be aimed for.

The electromagnetic wave shielding body according to the present invention comprises at least a transparent electrically conductive layer (D), having at least a surface resistance of from 0.01 to 30 Ω/square, which has been formed on one major surface of a polymer film (B) and a transparent adhesive layer (C) formed on the other major surface of the polymer film (B), and further comprises an electrically conducting portion formed on the transparent electrically conductive layer (D), and a functional transparent layer (A) formed thereon directly or via the transparent adhesive layer.

Further, the electromagnetic wave shielding body according to the invention comprises at least a transparent electrically conductive layer (D), having at least a surface resistance of from 0.01 to 30 Ω/square, which has been formed on one major surface of a polymer film (B) and a functional transparent layer (A) formed on the other major surface of the polymer film (B), and further comprises a electrically conductive adhesive layer and a transparent adhesive layer (C) on the transparent electrically conductive layer (D) Further, the electromagnetic wave shielding body according to the invention comprises at least a polymer film (B), a transparent electrically conductive layer (D), having at least a surface resistance of from 0.01 to 30 Ω/square, which has been formed on one major surface of a polymer film (B), a transparent adhesive layer (C) and a functional transparent layer (A) formed on the other major surface of the polymer film (B).

Further, the light control film according to the invention comprises at least a polymer film (B), a functional transparent layer (A), having an anti-reflection property and/or an anti-glare property, which has been formed on one major surface of the polymer film (B), a transparent adhesive layer (C) formed on the other major surface of the polymer film (B), and further comprises a dye, and has visible light ray transmittance of from 55 to 90%.

1. Polymer Film (B)

A polymer film (B) functions as a substrate of a filter, for example, the substrate for forming a transparent electrically conductive layer (B) and, since a display filter according to the invention is formed directly on a surface of the display, a transparent polymer film is used.

The polymer film (B) is not particularly limited so long as it is transparent in a visible wavelength region. Specific examples thereof include polyethylene terephthalate, polyethersulfone, polystyrene, polyethylene naphthalate, polyarylate, polyether ether ketone (PEEK), polycarbonate, polyethylene, polypropylene, a polyamide such as nylon 6, a polyimide, a cellulose type resin such as triacetylcellulose, polyurethane, a fluorine type resin such as polytetrafluoroethylene, a vinyl compound such as polyvinyl chloride, polyacrylic acid, a polyacrylic ester, polyacrylonitrile, an addition polymer of a vinyl compound, polymethacrylic acid, a polymethacrylate, a vinylidene compound such as polyvinylidene chloride, a vinylidene fluoride/trifluoroethylene copolymer, a vinyl compound such as ethylene/vinyl acetate copolymer, and, further, a copolymer of a fluorine type compound, a polyether such as polyethylene oxide, an epoxy resin, polyvinyl alcohol, and polyvinyl butyral; however, the invention is not limited to these examples.

The polymer film is ordinarily in a thickness of from 10 to 250 μm. When the polymer film is unduly thin, it is difficult to form a filter directly on a surface of the display and flexibility thereof is restricted. Therefore, it is favorable that the thickness of the polymer film (B) is 50 μm or more, and more preferably 75 μm or more. Further, when the thickness thereof is more than 250 μm, flexibility is unduly scarce whereupon there is a case in which it is not suitable to utilize the film wound in roll form. Further, in such an application which requires high transparency as in applications according to the invention, the polymer film having a thickness of about 100 μm has broadly been used.

The transparent polymer film to be used in the invention has flexibility whereupon a transparent electrically conductive layer can continuously be formed thereon by a roll-to-roll method; hence, along transparent laminate having a large area can efficiently be produced. Further, a filter in film form can easily be formed directly on a surface of the display by means of lamination. Still further, it is favorable that, when a substrate glass of the display is broken, the filter, in which the polymer film is a substrate, bonded directly on the surface of the display can prevent glass pieces from being scattered.

In the invention, a surface of the polymer film (B) may previously be subjected to a sputtering treatment, a corona discharge treatment, a flame treatment, an etching treatment such as ultraviolet ray irradiation and electron beam irradiation, and prime coating thereby improving adhesiveness of the overlying transparent electrically conductive layer (D) to the polymer film (B). Further, any desired inorganic material layer, for example, made of a metal or the like may be formed between the polymer film (B) and the transparent electrically conductive layer (D). Furthermore, if necessary, a dust prevention treatment such as solvent cleaning and ultrasonic cleaning may be performed, before a transparent electrically conductive film is formed.

Further, a hard coat film (F) may have been formed on at least one major surface of the polymer film (B) so as to increase scratch resistance of the transparent laminate.

2. Hard Coat Layer (F)

As a hard coat film which comes to be a hard coat layer (F), mentioned is a thermosetting resin, a photo-curable type resin or the like, such as an acrylic type resin, a silicone type resin, a melamine type resin, a urethane type resin, an alkyd type resin, and a fluorocarbon type resin; on this occasion, there is no particular limitation on a type and a forming method thereof. Thickness of the film is from about 1 to about 100 μm. Further, it is permissible that the hard coat layer (F) may contain at least one dye to be described below.

3. Transparent Electrically Conductive Layer (D)

In the electromagnetic wave shielding body according to the invention, a transparent electrically conductive layer (D) is formed on one major surface of a polymer film (B). The term "transparent electrically conductive layer (D)" as used herein is intended to include any transparent electrically conductive film composed of a mono-layered thin film or a multi-layered thin film. Further, the term "transparent laminate (H)" as used herein is intended to include any member in which the transparent electrically conductive layer (D) is formed on a major surface of the polymer film (B).

As the mono-layered transparent electrically conductive film, mentioned is an electrically conductive mesh such as the metallic mesh, an electrically conductive film having a lattice type pattern or a transparent electrically conductive thin film such as a metallic thin film and an oxide semiconductor thin film.

As the multi-layered transparent electrically conductive film, mentioned is a multi-layered thin film in which a metallic thin film and a high-refractive-index transparent thin film are laminated to each other. The multi-layered thin film in which the metallic thin film and the high refractive-index transparent thin film are laminated to each other has advantageous characteristics in any one of electric conductivity, near-infrared ray cutting-off capacity and visible light ray transmittance, due to electric conductivity which a metal such as silver has and a near-infrared ray reflection characteristics which a free electron of the metal has and, further, prevention of reflection to be caused by a metal in a specified wavelength region by means of the high-refractive-index transparent thin film.

In order to obtain a display filter having both electromagnetic wave shielding capacity and near-infrared ray cutting-off capacity, a multi-layered thin film in which a metallic thin film having both high electric conductivity for absorbing the electromagnetic wave and a multiplicity of reflection interfaces for reflecting the electromagnetic wave, and the high-refractive-index transparent thin film are laminated to each other is preferable.

While, according to the VCCI, Class A, which sets a regulated limit for industrial use, indicates that a radiation field intensity should be less than 50 dB$\mu$V/m, whereas Class B, which sets a regulated limit for domestic use, indicates that the radiation-field intensity should be less than 40 dB$\mu$V/m. However, in a frequency band extending from 20 MHz to 90 MHz, the radiation field intensity from the plasma display exceeds 40 dB$\mu$V/m in the plasma display having a diagonal size of about 20 inches and 50 dB$\mu$V/m in the plasma display having a diagonal size of about 40 inches. Thus, these types of plasma displays can not be put to domestic use as they are.

As a size of a screen and electric power consumption thereof become higher, the radiation field intensity of the plasma display becomes higher whereupon it is necessary to use an electromagnetic wave shielding material having high shielding effectiveness.

The present inventors have conducted an intensive study and found that; in order to obtain electromagnetic wave shielding capacity necessary for the plasma display as well as high visible light ray transmittance and low visible light ray reflectance, it is necessary that the transparent electrically conductive layer (D) has electric conductivity of a low resistance such that a surface resistance thereof is from 0.01 to 30 Ω/square, more preferably from 0.1 to 15 Ω/square, and still more preferably from 0.1 to 5 Ω/square. The visible light ray transmittance and the visible light ray reflectance, as used herein, indicate values calculated in accordance with JIS (R-3106) on the basis of the wavelength dependence of transmittance and reflectance.

Further, the present inventors have found that; in order to shield an intense near-infrared ray emitted from the plasma display up to such a level as causes no problem in actual use, it is required to allow a light ray transmittance minimum in a wavelength range of from 800 to 1100 nm of the near-infrared ray in the display filter to be 20% or less and, further, in order to satisfy such a requirement, it is necessary that the transparent electrically conductive layer itself has a near-infrared ray cutting-off property from the reason that a number of constitutional members is required to be decreased and there is a limitation on a near-infrared ray absorption by using a dye. Reflection by the free electron of the metal can be utilized, in order to cut off the near-infrared ray in the transparent electrically conductive layer.

As the metallic thin film layer becomes thicker, the visible light ray transmittance becomes lower, while as the metallic thin film layer becomes thinner, the reflection of the near-infrared ray becomes weaker. However, by superimposing at least one layer of a laminate constitution in which the metallic thin film layer having a given thickness is interposed between the high-refractive-index transparent thin film layers, it is possible to enhance the visible light ray transmittance and, at the same time, increase a total thickness of the metallic thin film layer. Further, by controlling a number of layers and/or thickness of each layer, it is possible to allow the visible light ray transmittance, the visible light ray reflectance, the near-infrared ray transmittance, a transmitted color and a reflected color to be changed within a given range.

Ordinarily, as the visible light ray reflectance becomes higher, lighting equipment and the like are more mirrored in the screen whereupon effect to prevent the reflection on the surface of the representation portion is reduced thereby deteriorating visibility and contrast. Further, as the reflected color, an imperceptible color of, for example, white-, blue- or purple-base is preferable. Under these circumstances, as the transparent electrically conductive layer, a multi-layered lamination which is optically designed and controlled in an easy manner comes to be preferable.

In the electromagnetic wave shielding body according to the invention, it is preferable to use the transparent laminate (H) in which the transparent electrically conductive layer (D) that is a multi-layered thin film is formed on one major surface of the polymer film (B).

A preferable transparent electrically conductive layer (D) according to the invention is formed by firstly laminating a repeating unit (Dt)/(Dm) comprising a high-refractive-index transparent thin film layer (Dt) and one metallic thin film layer (Dm) in this order on the polymer film (B) while repeating such repeating unit from 2 times to 4 times and, then, further, laminating at least one high-refractive-index transparent thin film layer (Dt) on the resultant laminate, is characterized in that a surface resistance thereof is from 0.1 to 5 Ω/square, and has properties excellent in low resistivity for electromagnetic wave shielding capacity, near-infrared ray cutting-off capacity, transparency, and visible light ray reflectance. Further, unless otherwise stated, the term "multi-layered thin film" as used herein is intended to include a transparent electrically conductive film of a multi-layered lamination in which at least one layer of a laminate constitution where a metallic thin film layer is interposed between the high-refractive-index transparent thin film layers is superimposed.

In the transparent electrically conductive layer according to the invention, the repeating unit is preferably laminated from 2 times to 4 times. That is, the transparent laminate (D) according to the invention in which the transparent electrically conductive layer is laminated on one major surface of the polymer film (B) has a layer constitution of (B)/(Dt)/(Dm)/(Dt)/(Dm)/(Dt), (B)/(Dt)/(Dm)/(Dt)/(Dm)/(Dt)/(Dm)/(Dt) or (B)/(Dt)/(Dm)/(Dt)/(Dm)/(Dt)/(Dm)/(Dt)/(Dm)/(Dt). When the repeating unit is laminated more than 5 times, a restriction on a production apparatus and productivity becomes a serious problem, and, further, there is a tendency in which the visible light ray transmittance is deteriorated and the visible light ray reflectance is increased. On the other hand, when a repeating time is one time, it is difficult to simultaneously satisfy the low resistivity, the near-infrared ray cutting-off capacity and the visible light ray reflectance.

Further, the present inventors have found that, in the multi-layered thin film in which the repeating unit is laminated from 2 times to 4 times, in order to allow the near-infrared ray cutting-off capacity, the visible light ray transmittance, and the visible light ray reflectance to be characteristics simultaneously advantageous to the plasma display, a surface resistance thereof is from 0.1 to 5 Ω/square.

Further, it is conceivable that an electromagnetic wave intensity to be emitted from the plasma display is lowered in the future. In such a case, it is anticipated that, even when the surface resistance of the electromagnetic wave shielding body is from 5 to 15 Ω/square, sufficient electromagnetic wave shielding characteristics can be obtained. It is also conceivable that the electromagnetic wave intensity to be emitted from the plasma display is further lowered. In such a case, it is also anticipated that, even when the surface resistance of the electromagnetic wave shielding body is from 15 to 30 Ω/square, sufficient electromagnetic wave shielding characteristics can be obtained. On the other hand, it is also conceivable that, based on a different point of view from an emitted electromagnetic wave intensity, when a larger screen and a smaller thickness of the plasma display is required for, the surface resistance of the electromagnetic wave shielding body is required to be from 0.01 to 1 Ω/square.

As a material of the metallic thin film layer (Dm), silver is advantageous because it is excellent in electric conductivity, an infrared reflection property and visible light ray transmittance when it is laminated in multiple layers However, silver lacks chemical and physical stability whereupon it tends to be deteriorated under actions of a contaminant, water vapor, heat, light and other factors present in the environment. Accordingly, an alloy composed of silver and at least one metal, having high environmental stability, for example, gold, platinum, palladium, copper, indium, tin or the like, and a metal which is stable to these environmental factors can favorably used. Particularly, gold and palladium are favorable because these metals are excellent in environmental resistance and optical characteristics.

Although no particular limitation is placed on a content of silver in such a silver-containing alloy, it is desirable that the electric conductivity and optical characteristics thereof do not differ substantially from those of the silver thin film; on this occasion, the content is in a range of from about 50% by weight or more to less than about 100% by weight. However, since an addition of another metal to silver ordinarily impairs an excellent electric conductivity and optical characteristics of silver, it is desirable that, when a plurality of metallic thin film layers are employed, if possible, at least one of the metallic thin film layers uses silver without allowing silver to be an alloy thereof, or only a metallic thin film layer on a first layer and/or an outermost layer as viewed from the substrate is allowed to be an alloy.

Thickness of the metallic thin film layer (Dm) is determined by optical design and experiment, on the basis of electric conductivity, optical characteristics and the like. No particular limitation is placed on the thickness thereof, provided that the transparent electrically conductive layer has required characteristics. However, it is necessary, based on electric conductivity and the like, that a thin film is not of an island type structure, but in a continuous state and is preferably 4 nm or more. When the metallic thin film layer is unduly thick, there occurs a problem in transparency; therefore, it is preferably 30 nm or less. When a multiple of the metallic thin film layers exist, all of such layers are not necessarily of the same thickness and do not necessarily comprise silver or an alloy thereof.

In order to deposit the metallic thin film layer (Dm), there may be employed any of conventionally known methods such as sputtering, ion plating, vacuum deposition, and metal plating.

No particular limitation is placed on the transparent type film constituting the high-refractive-index transparent thin film layer (Dt), so long as the transparent thin film has transparency in a visible region and have an effect of preventing light reflection in the visible region of the metallic thin film layer; however, a high-refractive-index material having a refractive index of not less than 1.6, preferably not less than 1.8, and more preferably not less than 2.0 against a visible light ray is used. Specific examples of materials which form such a transparent thin film include oxides of metals such as indium, titanium, zirconium, bismuth, tin, zinc, antimony, tantalum, cerium, neodymium, lanthanum, thorium, magnesium, and gallium; mixtures of these metal oxides; and zinc sulfide.

In these oxides and the sulfide, the metal and an oxygen atom or a sulfur atom may be present in nonstoichiometric proportions; however, the oxides and the sulfide are permissible, so long as optical characteristics thereof are not substantially modified. Among the materials, zinc oxide, titanium oxide, indium oxide, and a mixture of indium oxide and tin oxide (ITO) are advantageously used because they not only have high transparency and a high refractive index, but also has a high-speed film formation, good adhesion to the metallic thin film layer and the like.

Thickness of the high-refractive-index transparent thin film layer (Dt) can be determined by an optical design and an experiment, on the basis of the optical characteristics of the polymer film (B) (hereinafter referred to also as "transparent substrate"), thickness and optical characteristics of the metal thin film layer, a refractive index of the transparent thin film layer, and the like; on this occasion, although no particular limitation is placed on the thickness thereof, it is preferably in a range of from 5 to 200 nm and more preferably from 10 to 100 nm. Respective thickness of high-refractive-index transparent thin film layers of from a first layer to a (n+1)th layer (n being equal to or larger than 1) are not necessarily the same there among and, further, the high-refractive-index transparent thin film layers are not necessarily made of the same transparent thin film material.

In order to form the high-refractive-index transparent thin film layer (Dt), there may be employed any of conventionally known methods such as sputtering, ion plating, ion beam assisted deposition, vacuum deposition, and wet coating.

In order to improve the environmental resistance of the transparent electrically conductive layer (D), any desired protective layer of an organic material or an inorganic material may be provided on a surface of the transparent electrically conductive layer to such an extent as does not detract from the electric conductivity and optical characteristics thereof. Further, in order to improve the environmental resistance of the metallic thin film layer, the adhesion between the metallic thin film layer and the high-refractive-index transparent thin film layer and the like, any desired inorganic material layer may be formed between the metallic thin film layer and the high-refractive-index transparent thin film layer to such an extent as does not detract from the electric conductivity and the optical characteristics thereof. Specific examples of these inorganic materials include copper, nickel, chromium, gold, platinum, zinc, zirconium, titanium, tungsten, tin, and palladium and, further, alloys composed of two or more of these metals. Thickness thereof is preferably in a range of from about 0.2 nm to about 2 nm.

In order to obtain a transparent electrically conductive layer (D) having desired optical characteristics, a thin film material of each layer, a number of layers, film thickness of each layer and the like may be determined by performing an optical design which utilizes a vector method using optical constants (refractive index and extinction coefficient) of the transparent polymer film (B) and the thin film material, a method using an admittance diagram and the like while taking into consideration electric conductivity, that is, a type and thickness of the material of the metallic thin film needed for the electromagnetic wave shielding capacity to be aimed for. In this occasion, it is preferable that an adjacent layer which is formed on the transparent electrically conductive layer (D) is taken into consideration. This is attributable to the fact that, since an entrance medium for light entering the transparent electrically conductive layer formed on the transparent polymer film (B) is different from an entrance medium having a refractive index of 1 such as air and vacuum, a transmitted light color (as well as transmittance, reflected light color and reflectance) undergoes changes. Namely, in a case in which the transparent adhesive layer (C) is interposed when the functional transparent layer (A) is formed on the transparent electrically conductive layer (D), designing is performed while taking into consideration an optical constant of the transparent adhesive layer (C). Further, when the functional transparent layer (A) is disposed directly on the transparent electrically conductive layer (D), designing is performed while taking into consideration the optical constant of a material which contacts the transparent electrically conductive layer (D).

It has been found that, by designing the transparent electrically conductive layer (D) in such a manner as described above, when a bottom layer and a top layer as viewed from the polymer film (B) are thinner than any other layer interposed therebetween in the high-refractive-index transparent thin film layer (Dt), or a bottom layer as viewed from the polymer film (B) is thinner than any other layer in the metallic thin film layer (Dm), and an adhesive which has a refractive index of from 1.45 to 1.65, a thickness of from 10 to 50 $\mu$m and an extinction coefficient of about 0 is an adjacent layer, reflectance of the transparent laminate is not significantly increased, that is, an increase of interfacial reflectance by forming the adjacent layer is 2% or less.

It has been found that, particularly in the transparent electrically conductive layer composed by repeating the repeating unit 3 times, that is, by 7 layers, when a second layer in the midst of the metallic thin film layer (Dm) composed of 3 layers is thicker than any other layer, in a case in which the adhesive is the adjacent layer, reflectance of the transparent laminate is not significantly increased.

Further, the optical constant can be measured by using an ellipsometry (elliptically polarized light analytical method) or an Abbe refractometer and, further, film formation can be performed by controlling a number of layers, film thickness and the like while observing the optical characteristics.

An atomic composition of the transparent electrically conductive layer formed in such a manner can be measured according to a method such as Auger electron spectroscopy (AES) inductively coupled plasma (ICP), and Rutherford backscattering spectrometry (RBS). Further, a layer construction and film thickness can be measured by observation in a depth direction by means of Auger electron spectroscopy, observation of a cross-section under a transmission type electron microscope, or the like.

The film thickness is controlled by carrying out film formation on the basis of the previously established relationship between the film-forming conditions and the film formation rate, or by monitoring the film thickness during film formation by means of a quartz oscillator or the like.

Except for a method of using the transparent electrically conductive thin film, there is also a method of using a electrically conductive mesh as the transparent electrically conductive layer. Although a mono-layer metallic mesh is described below as an example of the electrically conductive mesh, the electrically conductive mesh according to the invention is not limited to this example.

In the mono-layered metallic mesh, a copper mesh layer is ordinarily formed on a polymer film. Ordinarily, a copper foil is bonded on the polymer film and, then, the resultant copper foil-bonded polymer film is processed to be in a mesh state.

Both of flat-rolled copper and electrolytic copper are usable as the copper foil to be employed in the invention; however, porous metallic layer is preferably used and, on this occasion, a pore diameter thereof is preferably from 0.5 to 5 $\mu$m, more preferably from 0.5 to 3 $\mu$m, and still more preferably from 0.5 to 1 $\mu$m. When the pore diameter is larger than these pore diameters, there is a fear of causing a problem in patterning, whereas, when the pore diameter is smaller than these pore diameters, it is difficult to expect an enhancement of light ray transmittance. Further, porosity of the copper foil is in a range of preferably from 0.01 to 20% and more preferably from 0.02 to 5%. The term "porosity" as used herein is intended to include a value specified by P/R, wherein R represents a volume; and P represents a pore volume. For example, provided that, when the pore volume of the copper foil against 0.1 cc of the volume thereof is measured by mercury porosity, the pore volume is 0.001 cc, the porosity can be defined as 1%. On this occasion, the copper foil to be used may be such a copper foil as has been subjected to any type of surface treatments. Specific examples of the surface treatments include chromate processing, surface roughening, pickling, and zinc/chromate processing.

Thickness of the copper foil is preferably from 3 to 30 $\mu$m, more preferably from 5 to 20 $\mu$m, and still more preferably from 7 to 10 $\mu$m. When the thickness is more than these thickness, there occurs a problem that a prolonged time is required for etching, while, when the thickness is less than these thickness, there occurs a problem that electromagnetic wave shielding capacity is deteriorated.

An open area ratio of a light transmission part is from 60% to 95%, and more preferably from 65% to 90%, and still more preferably from 70% to 85%. A shape of an open area portion is not particularly limited, but it is preferable that the shape thereof is in a form of an regular triangle, a regular tetragon, a regular hexagon, a circle, a rectangle, a rhombus, or the like, shapes of such open area portions are all alike and the open area portions are aligned within a surface thereof. As for a representative size of the open area portion of the light transmission part, it is preferable that a side or a diameter thereof is in a range of, preferably from 5 to 200 $\mu$m, and more preferably from 10 to 150 $\mu$m. When the size is unduly large, the electromagnetic wave shielding capacity is deteriorated, while, when the size is unduly small, an unfavorable influence will be given to an image on a display. Further, it is preferable that width of a metal in other portions than the open area portions is preferably from 5 to 50 $\mu$m. Namely, a pitch is preferably from 10 to 250 $\mu$m. When the pitch is smaller than such a width, forming itself becomes extremely difficult, while, when the pitch is larger than such width, an unfavorable influence will be given to the image.

A substantial sheet resistance of a metallic layer having the light transmission part, as used herein, is a sheet resistance measured by a 4-terminal method having an interval between electrodes at least 5 times as large as the repeating unit of the pattern by utilizing an electrode at least 5 times as large as the pattern. For example, when the open area portion has a shape of a regular tetragon having a side of 100 $\mu$m, and are regularly aligned, while the metallic layer is 20 $\mu$m wide, measurements can be conducted by disposing electrodes each having a diameter of 1 mm with an interval of 1 mm therebetween. Alternatively, a pattern-bearing film is processed to be in strip form and, then, electrodes are disposed at both ends thereof in a longitudinal direction and, thereafter, resistance (R) thereof is measured to obtain the expression: the substantial sheet resistance=R×b/a, wherein a represents length in a longitudinal direction; and b represents length in a transverse direction. A value obtained in such a manner as described above is preferably from 0.01 $\Omega$/square to 0.5 $\Omega$/square, and more preferably from 0.05 $\Omega$/square to 0.3 $\Omega$/square. When a value which is smaller than these values is tried to obtain, the film becomes unduly thick to be unable to sufficiently obtain the opening area portion, while, when a value becomes larger than these values, sufficient electromagnetic wave shielding capacity can not be obtained.

As for a method of laminating a silver foil on a polymer film, a transparent adhesive is used. Examples of adhesives include those of an acrylic type, a urethane type, a silicone type, and a polyester type; however, adhesives are not particularly limited to these types. A two-component type and a thermosetting type are favorably used. Further, it is preferable that the adhesive is excellent in chemical resistance. It is permissible that, after the adhesive is applied to the polymer film, the silver foil can be bonded to the resultant adhesive-applied polymer film, or the silver foil is applied with the adhesive and then bonded.

As for a method of forming the light transmission part, a printing method and a photo-resist method can be used. In the printing method, it is of a common practice to allow a mask layer to form a pattern by a screen printing method utilizing a printing resist material. In a method of using a photo-resist material, the photo-resist material is solidly formed on a metallic foil by a roll coating method, a spin coating method, an entire-surface printing method, a transfer printing method, or the like and, then, is exposed to light and developed by using photomask to perform resist patterning. After the resist patterning is completed, a metallic portion which will be an opening area portion is removed by a wet etching method whereby a metallic mesh having the light transmission part of a desired opening area shape and opening area ratio can be obtained.

4. Transmission Characteristics

Visible light ray transmittance in a light transmission portion of an electromagnetic wave shielding body is preferably from 30 to 85%, and more preferably from 50 to 80%. When the visible light ray transmittance is less than 30%, luminance is unduly decreased to deteriorate visibility. Further, in order to obtain contrast, there are some cases in which it is necessary that the visible light ray transmittance is 85% or less, and more preferably 80% or less.

Further, the visible light ray transmittance in a light control film is preferably from 55 to 90%, and more preferably from 60 to 85%. When the visible light ray transmittance is less than 55%, the luminance is unduly decreased to deteriorate the visibility. Further, in order to obtain contrast, there are some cases in which it is necessary that the visible light ray transmittance is 85% or less, and more preferably 80% or less.

Further, As used herein, the visible light ray transmittance (Tvis) and the visible light ray reflectance (Rvis) are calculated in accordance with JIS (R-3106) on the basis of the wavelength dependence of transmittance and reflectance.

5. Color Characteristics and Dye

When a transmitted color of a display filter is rich in a tint of from yellowish green tint to green, contrast of the display is decreased and, further, color purity thereof is deteriorated and a white color representation sometimes becomes greenish. This phenomenon is attributable to the fact that light in a wavelength of around 550 nm which is a yellowish green color to green color is the highest in visibility.

When the visible light ray transmittance and the visible light ray reflectance in a multi-layered film are taken into serious consideration, the multi-layered thin film ordinarily lacks in a transmitted color tone. As the electromagnetic wave shielding capacity, that is, electric conductivity and near-infrared ray cutting-off capacity becomes larger, it becomes necessary to allow a total thickness of a metallic thin film to be larger. However, as the total thickness of the metallic thin film becomes larger, there is a tendency in which the color becomes more of from a green color to a yellowish green color. Therefore, it is required that, in the electromagnetic wave shielding body used for a plasma display, the transmitted color thereof is neutral gray or blue gray. This is attributable to a deterioration of the contrast due to strong green color transmission, weak luminescence of blue color compared with that of red or green color, a preference for white color having a slightly higher color temperature than that of a standard white color, and the like. Further, it is desirable that, as the transmission characteristics of the electromagnetic wave shielding body, a chromaticity coordinate of white color representation on the plasma display is as near to a blackbody locus as possible.

When the multi-layered thin film is used in the transparent electrically conductive layer (D), it is important to allow the transmitted color of the electromagnetic wave shielding body to be neutral gray or blue gray by correcting a color tone of the multi-layered thin film. Such a correction of the color tone can be performed if only a dye having absorption in a visible wavelength region is used. For example, when an greenish tint exists in the transmitted color of the transparent electrically conductive layer (D), the correction to gray can be performed by using a dye of red color, while, when a yellowish tint exists in the transmitted color, the correction can be performed by using a dye of from blue to violet color.

In a color plasma display, a red color luminescent phosphor such as (Y, Gd, Eu)BO$_3$, a green color luminescent phosphor such as (Zn, Mn)$_2$SiO$_4$, and a blue color luminescent phosphor such as (Ba, Eu)MgAl$_{10}$O$_{17}$:Eu which emit light by being excited by a vacuum ultraviolet light that is generated by direct or alternating electric current discharge in a rare gas are formed in display cells which constitute pixels. The phosphors are selected on a basis of color purity, a coating property to a discharge cell, a short period of residual luminescent time, luminous efficiency, thermal resistance and the like whereupon many of the phosphors now in practical use have yet to be improved in color purity thereof. Particularly, emission spectrum of the red color luminescent phosphor indicates several luminescent peaks over a wavelength range of from about 580 nm to about 700 nm whereupon, since a luminescent peak in a side of a relatively intense short wavelength is luminescence of from yellow color to orange color, there occurs a problem in which color purity of red color luminescence is deteriorated to approach to that of orange color luminescence. When a mixed gas of Xe and Ne is used as a rare gas, the color purity of the orange color luminescence brought about by radiative relaxation of an Ne-excited state is also deteriorated. As to green color luminescence and blue color luminescence, a position of a peak wavelength and broadness of luminescence are factors of deteriorating the color purity thereof.

Height of the color purity can be indicated, for example, in terms of an area of color reproduction gamut which is shown by an area of a triangle formed by connecting 3 vertices of red, green and blue colors in a coordinate system defined by Commission Internationale d'Eclairage (CIE) in which hue and saturation are represented by abscissa chromaticity x and ordinate chromaticity y, respectively. Due to a low color purity, the color reproduction gamut of luminescence of the plasma display is narrower than that which is shown by chromaticity of 3 colors of RGB defined by an NTSC (National Television System Committee) system.

Further, not only migration of luminescence between display cells, but also a state, in which luminescence of each color contains a broad range of unnecessary light thereby allowing necessary light to be obscure, becomes a factor of deteriorating color purity as well as contrast of the plasma display. Further, the contrast of the plasma display is ordinarily deteriorated at a bright time in which external light emitted from, for example, lighting equipment and the like is present in a room compared with a dark time. This is attributable to the fact that a substrate glass, a phosphor and the like reflect the external light whereupon unwanted light prevents necessary light from being conspicuous. A contrast ratio of the plasma display panel is from 100 to 200 at the dark and from 10 to 30 at the time of the bright occasion of about 100 lx of an environmental luminance whereupon an improvement thereof becomes a target to be pursued. The fact that the contrast is low is also a factor of narrowing the color reproduction gamut.

In order to enhance the contrast, there is a method in which a neutral density (ND) filter is provided in front of the display thereby decreasing transmission over an entire visible wavelength region to reduce the reflection of the external light and the like at the substrate glass or the phosphor; however, in this method, when the visible light ray transmittance is significantly low, luminance and sharpness of the image are deteriorated whereupon no significant improvement on the color purity is not noticed.

The present inventors have found that enhancement of the color purity and contrast of the luminescent color of the color plasma display can be achieved by decreasing the unwanted luminescence and the reflection of the external light which cause to deteriorate the color purity and contrast of the luminescent color.

Further, the present inventors have found that an application of a dye is capable of not only controlling color of the electromagnetic wave shielding body to be neutral gray or neutral blue but also decreasing the unwanted luminescence and the reflection of the external light which cause to deteriorate the color purity and contrast of the luminescent color. Furthermore, the present inventors have found that this is particularly conspicuous when the red color luminescence is near to orange and that the color purity of the red color luminescence can be improved by decreasing the luminescence in a wavelength of from 580 nm to 605 nm which causes such deterioration.

In the display filter according to the invention, decrease of the unwanted luminescence and reflection of the external light can be conducted by allowing a dye having an absorption maximum in a wavelength of from 570 nm to 605 nm to be contained in the shielding body. On this occasion, it is necessary that transmission of light in a wavelength range of from 615 nm to 640 nm in which luminescence peak indicating a red color exists is not markedly impaired.

Ordinarily, a dye has a broad absorption range whereupon there is a risk in which even a dye having a desired absorption peak absorbs luminescence in a favorable wavelength as well by absorbing a trailing end portion thereof simultaneously. When luminescence by Ne is present, orange color luminescence can be decreased to enhance the color purity of the luminescence from RGB display cells.

Further, green color luminescence of the color plasma display has a broad band and there is a case in which a peak position thereof exists, for example, in a side of somewhat longer wavelength than that of green color required by the NTSC system, that is, in a side of yellowish green.

The present inventors have found that the color purity can be enhanced by absorption of a short wavelength side of a dye having an absorption maximum at a wavelength of from 570 nm to 605 nm thereby absorb-trimming a long wavelength side of the green color luminescence and, further, trimming the unwanted luminescence, and/or shifting the peak.

In order to enhance the color purity of the red color luminescence as well as green color luminescence, it is preferable that minimum transmittance of the electromagnetic wave shielding body in a wavelength of from 570 nm to 605 nm is allowed to be 80% or less against a required transmittance of the red color luminescence at a peak position by using a dye having an absorption maximum in a wavelength of from 570 nm to 605 nm.

When the color purity of the blue color luminescence is low, the unwanted luminescence is decreased, a peak wavelength is shifted and a dye to absorb bluish green color luminescence may be used, in the same manner as in the cases of red color luminescence and green color luminescence. Further, absorption by the dye decreases incidence of an external light into the phosphor thereby allowing reflection of the external light on the phosphor to be decreased. These procedures can also enhance the color purity and contrast.

As a method of allowing a dye to be contained in the display filter according to the invention, there is a method which uses at least one state selected from the group consisting of: (1) a polymer film in which at least one type of dye is kneaded in a transparent resin; (2) a polymer film prepared by first emulsify-dissolving at least one type of dye in a concentrated resin solution of a resin or a resin monomer/an organic solvent and, then, subjecting the resultant concentrated resin solution containing the dye to casting processing; (3) a material prepared by first adding at least one type of dye to a mixture of a resin binder and an organic solvent to prepare a coating material and, then, applying the thus-prepared coating material on a transparent substrate; and (4) a transparent adhesive containing at least one type of dye.

The term "contain" as used herein is intended to include states of being contained in a substrate, in a layer such as a coating film and in an adhesive as well as states of being coated on surfaces of the substrate and the layer.

As dyes, ordinary dyes or pigments which have a desired absorption wavelength in a visible region may be permissible. Types thereof are not particularly limited; however, examples of such dyes and pigments include organic dyes which are ordinarily available in the market such as those of an anthraquinone type, a phthalocyanine type, a methine type, an azomethine type, an oxazine type, an azo type, a styryl type, a coumarin type, a porphyrin type, a dibenzofuranone type, a diketopyrrolopyrrole type, a rhodamine type, and a xanthene type, a pyrromethene type. The type and concentration thereof are determined depending on an absorption wavelength/absorption coefficient of the dye, a tone of a transparent electrically conductive layer, transmission characteristics/transmittance required for the electromagnetic wave shielding body, a medium for dispersing the dye, a type/thickness of a coating film and the like; on this occasion, the type and concentration are not particularly limited.

When a multi-layered thin film is used in the transparent electrically conductive layer (D), in a case in which, though the near-infrared ray cutting-off capacity as well as the electromagnetic wave shielding capacity is held, higher near-infrared ray cutting-off capacity is required, or in another case in which the transparent electrically conductive layer does not hold the near-infrared ray cutting-off capacity, it is permissible to use one or more types of near-infrared absorption dyes together with the dyes described above in order to impart the display filter with the near-infrared ray cutting-off capacity.

No particular limitation is placed on the near-infrared absorbing dye, so long as it can supplement the near-infrared ray cutting-off capacity of the transparent electrically conductive layer and can absorb an intense near-infrared ray emitted from the plasma display to such an extent as is suitable for practical purposes; further, no particular limitation is placed on the concentration of the near-infrared absorbing dye. Examples of such near-infrared absorbing dyes include compounds of a phthalocyanine type, anthraquinone type, a dithiol type, and a diiminium type.

Since a temperature of a panel surface of the plasma display panel is high and a temperature of the electromagnetic wave shielding body goes up particularly in a high temperature atmosphere, it is preferable that the dye to be used in the invention has thermal resistance, for example, such that it does not significantly deteriorate itself by being decomposed at 80° C. or the like.

Further, there are some dyes which are deficient in light resistance as well as thermal resistance. When deterioration thereof by luminescence of the plasma display or an ultraviolet ray/a visible light ray of the external light comes to be a problem, it is important to decrease deterioration of the dye to be caused by the ultraviolet ray or the visible light ray by using a member which contains an ultraviolet ray absorbing agent or another member which does not allow an ultraviolet ray to pass through, or to use a dye which is not significantly deteriorated by the ultraviolet ray or the visible light ray. The same is true with cases of heat, light, moisture and a mixed environment thereof. When the dye is deteriorated, the transmission characteristics of the electromagnetic wave shielding body are changed.

As a practical matter, a case in which the surface temperature of the plasma display panel goes up to a range of from 70° C. to 80° C. is stipulated in Japanese Unexamined Patent Publication JP-A 8-220303 (1996). Further, light emitted from the plasma display panel is stipulated, for example, as 300 cd/m² (Fujitsu Limited, Image Site, Catalog AD 25-000061C October, 1997M) whereupon, when light having this value is irradiated for 20,000 hours provided that a solid angle is 2π, such irradiation comes to be 2π×20,000×300=38,000,000 (lx·hr); therefore, it is understood that light resistance of several ten millions (lx·hr) is practically required.

Further, in order to disperse a dye in a medium or a coating film, a dissolving property thereof into an appropriate solvent is important. It is permissible to allow two or more types of dyes having different absorption wavelengths from each other to be contained in one medium or coating film.

The display filter according to the invention has excellent transmission characteristics/transmittance which do not significantly impair luminance/visibility of the color plasma display and can enhance color purity and contrast of luminescent color of the color plasma display. The present inventors have found that, when at least one of one or more types of dyes which are to be contained is a tetraazaporphyrin compound, since the tetraazaporphyrin compound has a major absorption wavelength in a wavelength the same as or similar to that of unwanted luminescence of from 570 to 605 nm which is particularly required to be decreased and has a comparatively small absorption wavelength band, loss of luminance derived from absorption of favorable luminescence can be reduced; hence, a display filter which is excellent in capacity for enhancing transmission characteristics/transmittance, color purity and contrast of luminescence color was able to be obtained.

The tetraazaporphyrin compound used in the invention can be expressed by the foregoing formula (1). The formula (1) will hereinafter be also abbreviated as the following structural formula (2):

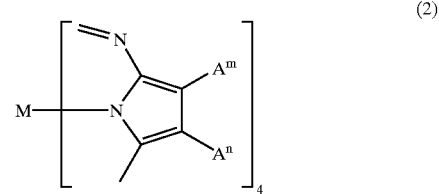

wherein $A^m$ and $A^n$ each individually represent a hydrogen atom, a halogen atom, a nitro group, a cyano group, a hydroxy group, an amino group, a carboxyl group, a sulfonic acid group, an alkyl group having carbon atoms of from 1 to 20, a halogenoalkyl group, an alkoxy group, an alkoxyalkoxy group, an aryloxy group, a monoalkylamino group, dialkylamino group, an aralkyl group, an aryl group, a heteroaryl group, an alkylthio group, or arylthio group; $A^m$ and $A^n$ each individually may form a ring except an aromatic ring via a connecting group; and M represents two hydrogen atoms, a divalent metal atom, a trivalent metal atom having one substituent, a tetravalent metal atom having two substituents, or an oxy metal atom.

Specific examples of the tetraazaporphyrin compound expressed by the formula (1) are described below. In the formula, specific examples of from $A^1$ to $A^8$ include a hydrogen atom; halogen atoms such as fluorine, chlorine, bromine and iodine atom; a nitro group; a cyano group; a hydroxy group; an amino group; a carboxyl group; a sulfonic acid group; linear-chain, branched-chain or cyclic alkyl groups each having carbon atoms of from 1 to 20 such as a methyl group, an ethyl group, an n-propyl group, an iso-propyl group, an n-butyl group, aniso-butyl group, a sec-butyl group, a t-butyl group, an n-pentyl group, a 2-methylbutyl group, a 1-methylbutyl group, a neo-pentyl group, a 1,2-dimethylpropyl group, a 1,1-dimethylpropyl group, a cyclo-pentyl group, an n-hexyl group, a 4-methylpentyl group, a 3-methylpentyl group, a 2-methylpentyl group, a 1-methylpentyl group, a 3,3- dimethylbutyl group, a 2,3-dimethylbutyl group, a 1,3-dimethylbutyl group, a 2,2-dimethylbutyl group, a 1,2-dimethylbutyl group, a 1,1-dimethylbutyl group, a 3-ethylbutyl group, a 2-ethylbutyl group, a 1-ethylbutyl group, a 1,2,2-trimethylbutyl group, a 1,1,2-trimethylbutyl group, a 1-ethyl-2-methylpropyl group, a cyclo-hexyl group, an n-heptyl group, a 2-methylhexyl group, a 3-methylhexyl group, a 4-methylhexyl group, a 5-methylhexyl group, a 2,4-dimethylpentyl group, an n-octyl group, a 2-ethylhexyl group, a 2,5-dimethylhexyl group, a 2,5,5-trimethylpentyl group, a 2,4-dimethylhexyl group, a 2,2,4-trimethyl pentyl group, an n-nonyl group, a 3,5,5-trimethylhexyl group, an n-decyl group, a 4-ethyloctyl group, a 4-ethyl-4,5-dimethylhexyl group, an n-undecyl group, an n-dodecyl group, a 1,3,5,7-tetramethyloctyl group, a 4-butyloctyl group, a 6,6-diethyloctyl group, an n-tridecyl group, a 6-methyl-4-butyloctyl group, a n-tetradecyl group, an n-pentadecyl group, a 3,5-dimethylheptyl group, a 2,6-dimethylheptyl group, a 2,4-dimethylheptyl group, a 2,2,5,5-tetramethylhexyl group, a 1-cyclo-pentyl-2,2-dimethylpropyl group, and a 1-cyclo-hexyl-2,2-dimethylpropyl group;

halogenoalkyl groups each having carbon atoms of from 1 to 20 such as a chloromethyl group, a dichloromethyl group, a fluoromethyl group, a trifluoromethyl group, a pentafluoroethyl group, and a nonafluorobutyl group;

alkoxy groups each having carbon atoms of from 1 to 20 such as a methoxy group, an ethoxy group, an n-propoxy group, an iso-propoxy group, an n-butoxy group, an iso-butoxy group, a sec-butoxy group, a t-butoxy group, an n-pentoxy group, an iso-pentoxy group, a neo-pentoxy group, an n-hexyloxy group, and an n-dodecyloxy group;

alkoxyalkoxy groups each having carbon atoms of from 2 to 20 such as a methoxyethoxy group, an ethoxyethoxy group, a 3-methoxypropyloxy group, and a 3-(iso-propyloxy)propyloxy group;

aryloxy groups each having carbon atoms of from 6 to 20 such as a phenoxy group, a 2-methylphenoxy group, a 4-methylphenoxy group, a 4-t-butylphenoxy group, a 2-methoxyphenoxy group, and a 4-iso-propylphenoxy group;

a monoalkylamino groups each having carbon atoms of from 1 to 20 such as a methylamino group, an ethylamino group, an n-propylamino group, an n-butylamino group, and an n-hexylamino group;

dialkylamino groups each having carbon atoms of from 2 to 20 such as dimethylamino group, diethylamino group, a di-n-propylamino group, a di-n-butylamino group, and an N-methyl-N-cyclohexylamino group;

aralkyl groups each having carbon atoms of from 7 to 20 such as a benzyl group, a nitrobenzyl group, a cyanobenzyl group, a hydroxybenzyl group, a methylbenzyl group, a dimethylbenzyl group, a trimethylbenzyl group, a dichlorobenzyl group, a methoxybenzyl group, an ethoxybenzyl group, a trifluoromethylbenzyl group, a naphthylmethyl group, a nitronaphthylmethyl group, a cyanonaphthylmethyl group, a hydroxynaphthylmethyl group, a methylnaphthylmethyl group, and a trifluoromethylnaphthylmethyl group;

aryl groups each having carbon atoms of from 6 to 20 such as a phenyl group, a nitrophenyl group, a cyanophenyl group, a hydroxyphenyl group, a methylphenyl group, a dimethylphenyl group, a trimethylphenyl group, a dichlorophenyl group, a methoxyphenyl group, an ethoxyphenyl group, a trifluoromethylphenyl group, an N,N-dimethylaminophenyl group, a naphthyl group, a nitronaphthyl group, a cyanonaphthyl group, a hydroxynaphthyl group, a methylnaphthyl group, and a trifluoromethylnaphthyl group;

heteroaryl groups such as a pyrrolyl group, a thienyl group, a furanyl group, an oxazoyl group, an isoxazoyl group, an oxadiazoyl group, an imidazoyl group, a benzoxazoyl group, a benzothiazoyl group, a benzimidazoyl group, a benzofuranyl group, and an indoyl group;

alkylthio groups each having carbon atoms of from 1 to 20 such as a methylthio group, an ethylthio group, an n-propylthio group, an iso-propylthio group, an n-butylthio group, an iso-butylthio group, a sec-butylthio group, a t-butylthio group, an n-pentylthio group, an iso-pentylthio group, a 2-methylbutylthio group, a 1-methylbutylthio group, a neo-pentylthio group, a 1,2-dimethylpropylthio group, and a 1,1-dimethylpropylthio group;

arylthio groups each having carbon atoms of from 6 to 20 such as a phenylthio group, a 4-methylphenylthio group, a 2-methoxyphenylthio group, and a 4-t-butylphenylthio group.

Examples in which combinations of $A^1$ and $A^2$, $A^3$ and $A^4$, $A^5$ and $A^6$, and $A^7$ and $A^8$ each form a ring via a connecting group include —$CH_2CH_2CH_2CH_2$—, —$CH_2CH_2CH(NO_2)CH_2$—, —$CH_2CH(CH_3)CH_2CH_2$—, and —$CH_2CH(Cl)CH_2CH_2$—.

Examples of divalent metals shown as M include Cu, Zn, Fe, Co, Ni, Ru, Rh, Pd, Pt, Mn, Sn, Mg, Hg, Cd, Ba, Ti, Be, and Ca.

Examples of trivalent metals each having one substituent include Al—F, Al—Cl, Al—Br, Al—I, Ga—F, Ga—Cl, Ga—Br, Ga—I, In—F, InCl, In—Br, In—I, Tl—F, Tl—Cl, Tl—Br, Tl—I, Al—$C_6H_5$, Al—$C_6H_4(CH_3)$, In—$C_6H_5$, In—$C_6H_4(CH_3)$, Mn(OH), Mn(O$C_6H_5$), Mn[OSi(CH$_3$)$_3$], and Fe—Cl, Ru—Cl.

Examples of tetravalent metals each having two substituents include CrCl$_2$, SiF$_2$, SiCl$_2$, SiBr$_2$, SiI$_2$, SnF$_2$, SnCl$_2$, SnBr$_2$, ZrCl$_2$, GeF$_2$, GeCl$_2$, GeBr$_2$, GeI$_2$, TiF$_2$, TiCl$_2$, TiBr$_2$, Si(OH)$_2$, Sn(OH)$_2$, Ge(OH)$_2$, Zr(OH)$_2$, Mn(OH)$_2$, TiA$_2$, CrA$_2$, SiA$_2$, SnA$_2$, and GeA$_2$, wherein A represents any one of an alkyl group, a phenyl group, a naphthyl group and a derivative thereof; and Si(OA')$_2$, Sn(OA')$_2$, Ge(OA')$_2$, Ti(OA')$_2$, and Cr(OA')$_2$, wherein A' represents any one of an alkyl group, a phenyl group, a naphthyl group, a trialkylsilyl group, a dialkylalkoxysilyl group and a derivative thereof; Si(SA")$_2$, Sn(SA")$_2$, and Ge(SA")$_2$ wherein A" represents any one of an alkyl group, a phenyl group, a naphthyl group and a derivative thereof.

Examples of oxy metals include VO, MnO, and TiO.

Preferably, mentioned are Pd, Cu, Ru, Pt, Ni, Co, Rh, Zn, VO, TiO, Si(Y)$_2$, Ge(Y)$_2$, wherein Y represents any one of a halogen atom, an alkoxy group, an aryloxy group, an acyloxy group, a hydroxy group, an alkyl group, an aryl group, an alkylthio group, an arylthio group, a trialkylsilyloxy group, a trialkyl tin oxyo group, and a trialkyl germanium oxy group.

More preferably, mentioned are Cu, VO, Ni, Pd, Pt, and Co.

The present inventors have further found that, when the azaporphyrin compound expressed by the formula (1) is, for example, a tetra-t-butyl-tetraazaporphyrin complex or a tetra-neo-pentyl-tetraazaporphyrin complex, the compound is comparatively easily produced, a dissolving property thereof against a solvent and the complex itself are stable, the compound is excellent in absorption characteristics and, as a result of having been imparted with a t-butyl group or a tetra-neo-pentyl group, the compound is allowed to have a third dimensional form which enhances the dissolving property against a solvent and, accordingly, the dye has come to be easily contained and, on the basis of this finding, an excellent electromagnetic wave shielding body was able to be obtained.

In the display filter according to the invention, the methods (1) to (4) which allow the dye to be contained can be conducted in at least one layer selected from the group consisting of a polymer film (B) containing a dye, a transparent adhesive layer (C) or a second transparent adhesive layer containing a dye to be described below, a functional transparent layer (A) containing a dye to be described below, and the hard coat layer (F), containing a dye, which has been described above. The functional transparent layer (A) containing a dye to be described below may be any one of a film which contains a dye and, further, has various types of functions, a material in which a film which contains a dye and, further, has various types of functions is formed on a polymer film, and a material in which a film having various types of functions is formed on a substrate containing a dye.

Further, in the invention, at least two types of dyes having different absorption wavelengths from each other may be contained in a medium or a coating film, or at least two dye layers may be present.

First of all, a method (1) which comprises kneading a resin together with a dye and hot-molding the thus-kneaded resin will be described.

It is preferable to use a resin material which has transparency as high as possible when formed into a plastic plate or a polymer film. Specific examples of such resin materials include, but are not limited to, polyethylene terephthalate, polyether sulfone, polystyrene, polyethylene naphthalate, polyarylate, polyether ether ketone, polycarbonate, polyethylene, polypropylene, polyamides such as nylon 6, polyimides, cellulose type resins such as triacetylcellulose, polyurethane, fluorine-containing compounds such as polytetrafluoroethylene, vinyl compounds such as polyvinyl chloride, polyacrylic acid, polyacrylic esters, polyacrylonitrile, addition polymers of vinyl compounds, polymethacrylic acid, polymethacrylate, vinylidene compounds such as polyvinylidene chloride, copolymers of vinyl compounds or fluorine-containing compounds such as a vinylidene fluoride/trifluoroethylene copolymer, and an ethylene/vinyl acetate copolymer, polyethers such as polyethylene oxide, epoxy resins, polyvinyl alcohol, and polyvinyl butyral.

As to a preparation method, a processing temperature, a film-forming condition and the like may vary somewhat according to a dye used and a base polymer. However, usually employed are (i) a method in which a dye is mixed to powders or pellets of a base polymer, and the resulting mixture is heat-melted at a temperature of from 150 to 350° C. and formed into a plastic plate; (ii) a method in which a film is formed by an extruder; (iii) a method in which a raw film is prepared by an extruder and, then, uniaxially or biaxially stretched to a size 2 to 5 times an original size at a temperature of from 30 to 120° C. to form a film having a thickness of from 10 to 200 μm, and the like. An additive commonly used at the time of molding resins, such as a plasticizer, may be added during kneading. Although an amount of the dye to be added may vary according to absorption coefficient of the dye, thickness of a polymeric molded article to be made, intended absorption intensity, intended transmission characteristics/transmittance and the like, it usually ranges from 1 ppm to 20%, based on the weight of the polymeric molded article as a substrate.

In a casting method (2), a dye is add-dissolved in a concentrated solution of resin in which a resin or a resin monomer is dissolved in an organic solvent and, on this occasion, a plasticizer, a polymerization initiator, or an anti-oxidant is added, as desired, and the resultant concentrated solution is poured onto a mold or a drum which has a required surface contour to obtain a plastic plate or a polymer film through subsequent solvent evapolation/drying or polymerization/solvent evapolation/drying processing.

A resin selected from the group consisting of an aliphatic ester type resin, an acrylic type resin, a melamine resin, a urethane resin, an aromatic ester type resin, a polycarbonate resin, an aliphatic polyolefin resin, an aromatic polyolefin resin, a polyvinyl type resin, a polyvinyl alcohol resin, a polyvinyl-modified resin (PVB, EVA or the like) and a resin monomer of a copolymer resin thereof is usually used. As the solvent, there is used a solvent selected from the group consisting of solvents of a halogen type, an alcohol type, a ketone type, an ester type, an aliphatic hydrocarbon type, an aromatic hydrocarbon type, an ether type and a mixture type thereof.

Although a concentration of the dye may vary according to absorption coefficient of the dye, thickness of the plate or the film, intended absorption intensity, intended transmission characteristics/transmittance and the like, it is usually in a range of from 1 ppm to 20%, based on the weight of the resin monomer.

A concentration of the resin is usually in a range of from 1 to 90%, based on the entire coating material.

As to a method (3) which comprises preparing a coating material and, then, performing a coating operation, employed are a method in which a dye is dissolved in a binder resin and an organic solvent to prepare a coating material, a method in which a dye that has previously been pulverized (50 to 500 nm) is dispersed in an uncolored acrylic emulsion-based coating material to prepare an acrylic emulsion-based aqueous coating material and the like.

In the former method, a resin selected from the group consisting of an aliphatic ester type resin, an acrylic type resin, a melamine resin, a urethane resin, an aromatic ester type resin, a polycarbonate resin, an aliphatic polyolefin resin, an aromatic polyolefin resin, a polyvinyl type resin, a polyvinyl alcohol resin, a polyvinyl-modified resin (PVB, EVA or the like) and a copolymer resin thereof is usually used as a binder resin. As the solvent, there is used a solvent selected from the group consisting of: solvents of a halogen type, an alcohol type, a ketone type, an ester type, an aliphatic hydrocarbon type, an aromatic hydrocarbon type, an ether type and a mixture type thereof.

Although a concentration of the dye may vary according to absorption coefficient of the dye, thickness of such coating, intended absorption intensity, intended visible light transmittance and the like, it is usually in a range of from 0.1 to 30%, based on the weight of the binder resin.

Further, a concentration of the binder resin is usually in a range of from 1 to 50%, based on the entire coating material.

The acrylic emulsion-based aqueous coating material in a latter method can also be obtained, in the same way as in the former method, by dispersing a dye which has previously been pulverized (50 to 500 nm) in an uncolored acrylic emulsion-based coating material. An additive commonly used in a coating material, such as an antioxidant, may be added to the coating material.

The coating material prepared according to any one of the methods is applied on a transparent polymer film, a transparent resin, a transparent glass or the like by means of a bar coater, a blade coater, a spin coater, a reverse coater, a die coater, a spray gun or the like in a known coating manner to prepare a substrate containing a dye.

A protective layer may be provided on a coated surface in order to protect a coated surface, or another component of the electromagnetic wave shielding body may be bonded to the coated surface in such a manner as to protect the coated surface.

In a method (4) which uses an adhesive containing a dye, there may be used an adhesive or glue in sheet form or in liquid form such as an acrylic adhesive, a silicone type adhesive, a urethane type adhesive, a polyvinyl butyral adhesive (PVB), and an ethylene-vinyl acetate (EVA) type adhesive, a polyvinyl ether, a saturated amorphous polyester, a melamine resin or the like after being added with a dye of from 10 ppm to 30%.

In these methods, in order to enhance light resistance of the electromagnetic wave shielding body containing the dye, an ultraviolet ray absorbing agent can also be contained together with the dye. A type and a concentration of the ultraviolet absorbing agent are not particularly limited.

6. Transparent Adhesive Layer and Electrically Conductive Adhesive Layer

In the present invention, an optional transparent adhesive layer is interposed within a laminate. A transparent adhesive layer (C) according to the invention or the like is a layer comprising an optional transparent adhesive or glue. Specifically, mentioned are an acrylic adhesive, a silicone type adhesive, a urethane type adhesive, a polyvinyl butyral adhesive (PVB), an ethylene-vinylacetate (EVA) type adhesive and the like, a polyvinyl ether, a saturated amorphous polyester, a melamine resin and the like. It is important, on this occasion, that the adhesive to be used in a central portion that is a portion which a light ray emitted from the display passes through is required to be sufficiently transparent against a visible light ray.

The electrically conductive adhesive layer is an adhesive layer for the purpose of electrically connecting a transparent electrically conductive layer (D) with an earth portion (ground conductor) of a display apparatus; on this occasion, though it is necessary that the electrically conductive adhesive layer is electrically conductive, it is not necessary that the electrically conductive adhesive layer is transparent. Since it is necessary that, in the electromagnetic wave shielding body, a transparent electrically conductive layer (D) is electrically connected with an external member, the transparent adhesive layer should not significantly interfere with such an electrical connection due to the electrically conductive adhesive layer. Namely, an electrically conducting portion in which the transparent adhesive layer is not formed on the transparent electrically conductive layer (D) is necessary. For example, it is important that the transparent adhesive layer is formed such that a peripheral portion of the transparent electrically conductive layer (D) is left intact to allow it to be the conducting portion.

The electrically conductive adhesive or the electrically conductive adhesive to be used in the electrically conductive adhesive layer comprises a base agent such as an acrylic adhesive, a silicone type adhesive, a urethane type adhesive, a polyvinyl butyral adhesive (PVB), and an ethylene-vinylacetate (EVA) type adhesive, a polyvinylether, a saturated amorphous polyester, a melamine resin or the like, and carbon or metallic particles of Cu, Ni, Ag, Fe or the like dispersed in the base agent as electrically conductive particles. As to such dispersed particles, when an electrically conductive property is low, a particle diameter is small, a number of particles is large and a contact area between particles is large, it is favorable that volume resistivity of the electrically conductive adhesive or the electrically conductive adhesive is lowered. The volume resistivity of the electrically conductive adhesive or the electrically conductive adhesive to be used is from $1 \times 10^{-4}$ to $1 \times 10^3$ Ω·cm. A sheet state or a liquid form thereof is permissible so long as there exists practical adhesive strength therein.

A pressure-sensitive type adhesive in sheet form is favorably used as the adhesive. After such an adhesive in sheet form is bonded or an adhesive method is applied, bonding is performed by lamination.

The liquid form is such an adhesive as is cured by being left to stand at room temperature, being heated or being irradiated by an ultraviolet ray after being applied and bonded. As application methods, mentioned are various types of methods such as a screen printing method, a bar coating method, a reverse coating method, a gravure coating method, a die coating method, and a roll coating method; however, such an appropriate application method is usually chosen by taking into consideration a type, a viscosity, an application amount and the like of the adhesive. Although no particular limitation is placed on thickness of a layer thereof, the thickness is, in view of the volume resistivity and a required electrically conductive property, in a range of from 0.5 μm to 50 μm and preferably from 1 μm to 30 μm. Further, an electrically conductive tape of a double-faced adhesion type having an electrically conductive property on both faces which is available in the market can also favorably be used. Although no particular limitation is placed on thickness of this layer, the thickness is in a range of from about several micrometers to about several millimeters.

The adhesive may either be in sheet form or liquid form, so long as it has a practical adhesion strength. A pressure-sensitive type adhesive in sheet form is favorably used as the adhesive. After such an adhesive in sheet form is bonded or an adhesive material is applied, a bonding method is performed by laminating individual members with each other.

The liquid form is such an adhesive as is cured by being left to stand at room temperature or being heated after being applied and bonded.

As application methods, mentioned are various types of methods such as a bar coating method, a reverse coating method, a gravure coating method, a die coating method, and a roll coating method; however, such an appropriate application method is chosen by taking into consideration a type, a viscosity, an application amount and the like of the adhesive.

Although no particular limitation is placed on thickness of a layer thereof, the thickness is in a range of from 0.5 μm to 50 μm and preferably from 1 μm to 30 μm. Further, it is preferable that a surface on which the transparent adhesive layer is formed or a surface to be bonded therewith is beforehand subjected to a treatment for allowing adhesion to be easily performed such as coating for the purpose of easy adhesion and a corona discharge treatment thereby enhancing a wetting property thereof.

Further, after bonding is performed via the transparent adhesive layer, in order to remove air entrapped between members at the time of bonding, or to perform solution treatment on the adhesive and, further, to enhance adhesion strength between members, it is important that curing is performed under conditions of pressure and heating, if possible. On this occasion, the condition of pressure is from about several to 20 atms; further, although the condition of heating depends on thermal resistance of individual members, it is from about room temperature to about 80° C. However, no particular limitations are placed on these conditions. At least one layer of the transparent adhesive layers is allowed to contain a dye.

7. Functional Transparent Layer (A)

It is preferable that, in accordance with an installation method of a display or a required function for the display, the display filter according to the invention has at least one function selected from the group consisting of a hard coat property, an anti-reflection property, an anti-glare property, an antistatic property, an anti-fouling property, a gas barrier property and an ultraviolet ray cutting-off property and, further, in the display filter, a functional transparent layer (A) which a visible light ray passes through is formed on a transparent electrically conductive layer (D) either directly or via a second-transparent adhesive layer. It is preferable that one functional transparent layer (A) has a plurality of functions.

The functional transparent layer (A) according to the invention may be a functional film itself having at least one of the functions described above, a transparent substrate on which a functional film has been formed by a coating method, a printing method, or various types of known film-forming methods, or a transparent substrate having various types of functions.

In a case of the functional film itself, the functional film is formed directly on a major surface of the transparent electrically conductive layer (D) which forms the functional transparent layer (A) by a coating method, a printing method or various types of other known film-forming methods.

In a case of the transparent substrate on which the functional film has been formed, or the transparent substrate which has various types of functions, bonding maybe performed on a major surface of the transparent electrically conductive layer (D) either via an adhesive or via the adhesive containing a dye. However, no particular limitation is placed on these preparation methods.

The transparent substrate is a transparent polymer film; on this occasion, no particular limitation is placed on a type and thickness thereof and, further, a dye can be contained in the transparent substrate. Even in a case in which the functional transparent layer (A) is the functional film itself, the dye can also be contained in the film.

Since it is necessary that, in the electromagnetic wave shielding body, the transparent electrically conductive layer (D) is electrically connected with an external member, the functional transparent layer (A) should not interfere with such an electrical connection. Namely, an electrically conducting portion in which the functional transparent layer (A) is not formed on the transparent electrically conductive layer (D) is necessary. For example, the functional transparent layer (A) is formed such that a peripheral portion of the transparent electrically conductive layer is left intact to allow the peripheral portion to be the conducting portion.

Since a display screen of the display becomes hard to see by allowing lighting equipment and the like to be mirrored therein, it is necessary that the functional transparent layer (A) has at least one function of an anti-reflection (hereinafter referred to also as AR) property for suppressing reflection of an external light, an anti-glare (hereinafter referred to also as AG) property, and an anti-reflection/anti-glare (hereinafter referred to also as ARAG) property which is imparted with both of the foregoing two properties. When reflectance of a visible light ray on a surface of the electromagnetic wave shielding body is low, as described above, incidence of the external light into a phosphor of the plasma display and reflection thereof are decreased whereupon not only a phenomenon of being mirrored is prevented, but also, as a result, contrast and color purity are enhanced.

As to the functional transparent layer (A) having the anti-reflection (AR) property, elements constituting an anti-reflection film and respective film thickness of the elements are determined by carrying out an optical design with consideration for optical characteristics of the substrate on which this anti-reflection layer is formed. Specifically, mentioned are a single-layer of a thin film of a fluorine type transparent polymeric resin, magnesium fluoride, silicone type resin or silicon oxide which has a low refractive index of not greater than 1.5 and preferably not greater than 1.4 in a visible region, so as to have, for example, a quarter-wavelength optical thickness, and a laminate of two or more layers of thin films each comprising an inorganic compound such as a metal oxide, a fluoride, a silicide, a boride, a carbide, a nitride, and a sulfide, or an organic compound such as a silicone type resin, an acrylic resin and a fluorine type resin which has different refractive indices from one another in an order of a high refractive-index layer and a low refractive-index layer as viewed from the substrate.

Such a single-layered one is easily prepared, but is inferior to such a laminate of two or more layers in the anti-reflection property. A laminate of 4 layers has anti-reflection capacity over a wide wavelength range and undergoes less restriction in the optical design based on the optical characteristics of the substrate.

At the time of depositing a thin film comprising such an inorganic compound, any one of conventionally known methods such as sputtering, ion plating, vacuum deposition, and wet coating can be adopted. At the time of depositing a thin film comprising such an organic compound, any one of conventionally known methods such as a method of dry-curing after wet coating, for example, a bar coating method, a reverse coating method, a gravure coating method, a die coating method, and a roll coating method can be adopted.

Visible light ray reflectance of a surface of the functional transparent layer (A) having an anti-reflection property is 2% or less, preferably 1.3% or less, and more preferably 0.8% or less.

As used herein, the functional transparent layer (A) having an anti-glare (AG) property indicates a transparent layer which is transparent to a visible light ray and is provided with minute surface irregularities having a size of from about 0.1 $\mu$m to about 10 $\mu$m. Specifically, the functional transparent layer (A) having the anti-glare property is formed by first dispersing particles of an inorganic or organic compound such as silica, an organosilicon compound, melamine, and an acrylate in a thermosetting or photo-curable resin such as an acrylic type resin, a silicone type resin, a melamine type resin, a urethane type resin, an alkyd type resin, and a fluorine type resin to prepare ink and, then, applying the thus-prepared ink to the substrate according to a method such as a bar coating method, a reverse coating method, a gravure coating method, a die coating method, and a roll coating method and, thereafter, curing the thus-applied ink. An average diameter of the particles is in a range of from 1 $\mu$m to 40 $\mu$m. Alternatively, the anti-glare property can also be obtained by first coating a substrate with a thermosetting or photo-curable resin such as an acrylic type resin, a silicone type resin, a melamine type resin, a urethane type resin, an alkyd type resin, and a fluorine type resin and, then, pressing the thus-coated substrate against a mold having a desired haze or a surface contour and, thereafter, curing the resin. In short, it is important that the functional transparent layer (A) having the anti-glare property has appropriate surface irregularities and is not particularly limited to the methods described above.

A haze of the anti-glare property is from 0.5% to 20% and preferably from 1% to 10%. When the haze is unduly low, the anti-glare property becomes insufficient, while, when the haze is unduly high, transmittance of parallel light rays is reduced whereupon the visibility of the display is deteriorated.

The functional transparent layer (A) having the anti-reflection/anti-glare (ARAG) property can be obtained by forming the anti-reflection film on a film having an anti-glare property or a substrate. On this occasion, provided that the film having the anti-glare property is a film having a high refractive index, even when the anti-reflection film is made of a mono layer, the functional transparent layer (A) can be imparted with a relatively high anti-reflection property.

Prevention of reflection by the AR or the ARAG can enhance the light ray transmittance of the display filter.

Since the display filter according to the invention is bonded to a representation portion of the display via the transparent adhesive layer (C), reflection of a substrate glass on a surface of the representation portion is avoided. Therefore, furthermore, the filter in which the functional transparent layer (A) having a function of AR or ARAG is formed has a low reflection on a surface thereof whereupon contrast and color purity of the display can further be enhanced. Reflectance of the visible light ray on the surface of the functional transparent layer (A) having the functions of the AR or the ARAG is 2% or less, preferably 1.3% or less, and more preferably 0.8% or less.

In order to impart the display filter with scratch resistance, it is favorable that the functional transparent layer (A) has a hard coat property. As a hard coat film, mentioned are films of thermosetting type resins and photo-curable resins such as an acrylic type resin, a silicone type resin, a melamine type resin, an urethane type resin, an alkyd type resin, and a fluorine type resin; however, no particular limitation is placed on a type and a forming method thereof. A thickness of these films is from about 1 to about 100 $\mu$m. The functional transparent layer (A) may have both of the anti-reflection property and the hard coat property either by allowing the hard coat film to be used in the high refractive-index layer or a low refractive-index layer of the functional transparent layer (A) having the anti-reflection property or by allowing the anti-reflection film to be formed on the hard coat film. In the same manner as described above, the functional transparent layer (A) may have both of the anti-glare property and the hard coat property. On this occasion, it is sufficient to allow the hard coat film to have irregularities on a surface thereof by dispersing or the like particles therein; further, when the anti-reflection film is formed on such a hard coat film, the functional transparent layer (A) having both of the anti-reflection/anti-glare property and the hard coat property can be obtained. A surface hardness of the functional transparent layer (A) having the hard coat property is at least H, preferably 2H, and more preferably 3H or more in terms of pencil hardness in accordance with JIS (K-5400).

Further, the surface of the display filter tends to attract dust owing to electrostatic charge and, moreover, such static electricity may be discharged upon contact with a human body to give an electric shock thereto. Accordingly, it may be required to subject the display filter to an antistatic treatment. In order to impart an antistatic capacity to the display filter, the functional transparent layer (A) may have electric conductivity. On this occasion, it is sufficient to allow electric conductivity to be about $10^{11}$ $\Omega$/square or less in terms of a surface resistance, but the surface resistance should not detract from transparency or resolution of a display screen. As to the electrically conductive layer, mentioned are a well-known transparent electrically conductive film such as an ITO and an electrically conductive film in which electrically conductive ultrafine particles such as ultrafine particles of ITO and ultrafine particles of tin oxide are dispersed.

Further, it is preferable that a layer which constitutes the functional transparent layer (A) having at least one function selected from the group consisting of the anti-reflection property, the anti-glare property, the anti-reflection/anti-glare property, and a hard coat property has electric conductivity.

When silver is used in the multi-layered thin film, since silver lacks chemical and physical stability whereupon silver tends to be deteriorated by a contaminant, water vapor and other factors present in the environment and hence undergoes aggregation and whitening, it is important to cover a surface, on which a thin film is formed, of a transparent electrically conductive laminate with the functional transparent layer (A) having a gas barrier property so that the thin film may not be exposed to the contaminant and water vapor present in an operational environment. When the gas barrier property is expressed in terms of moisture permeability, the required moisture permeability is not greater than 10 g/m$^2$·day. Specific examples of such films having a gas barrier property include thin films of metal oxides such as silicon oxide, aluminum oxide, tin oxide, indium oxide, yttrium oxide, and magnesium oxide, and mixtures thereof; thin films of these metal oxides added with a slight amount of other elements; and those made of polyvinylidene chloride, an acrylic type resin, a silicone type resin, a melamine type resin, an urethane type resin, a fluorine type resin or the like. However, these thin films or the films are not necessarily limited thereto. Thickness of these films is in a range of from 10 to 200 nm in a case of thin films each made of a metal oxide and from about 1 to about 100 $\mu$m in a case of the films each made or a resin, and these thin films or films may have either a mono-layer or a multi-layered structure. However, it is to be understood that the thickness and structure of these thin films or films are not limited to those described above. Examples of polymer films having low moisture permeability include those made of polyethylene, polypropylene, nylon, polyvinylidene chloride, a vinylidene chloride/vinyl chloride copolymer, a vinylidene chloride/acrylonitrile copolymer, and a fluorine type resin. However, the polymer films are not particularly limited to these materials, so long as the moisture permeability thereof is not greater than 10 g/m$^2$·day. Even when the polymer film has a relatively high moisture permeability, the moisture permeability can be reduced by increasing the thickness of the film or adding an appropriate additive thereto.

Further, it is preferable that a layer constituting the functional transparent layer (A) having at least one property selected from the group consisting of: the anti-reflection property, the anti-glare property, the anti-reflection/anti-glare property, and an antistatic property, an anti-Newton ring property, and the hard coat property is a film having a gas barrier property, or a whole body or, when used concurrently with an adjacent transparent adhesive layer, the layer has the gas barrier property.

For example, as to the functional transparent layer (A) containing a dye and having the anti-reflection property, the hard coat property, the antistatic property and the gas barrier property, mentioned is a polyethylene terephthalate film containing a dye/hard coat film/ITO/silicon-containing compound/ITO/silicon-containing compound, and the like.

Further, as to the functional transparent layer (A) having the anti-reflection/anti-glare property, the hard coat property, the antistatic property and the gas barrier property, mentioned are a layer made of triacetyl cellulose film/hard coat film in which fine particles of ITO are dispersed/a silicon-containing compound, and the like.

Further, a surface of the functional transparent layer (A) may have an anti-fouling property such that stainproof against a fingerprint and the like is imparted thereto or, when a stain is attached thereto, it can easily be removed therefrom. A material having the anti-fouling property is such a material as having a non-wetting property for water and/or oils and fats; for example, a fluorine compound, and a silicon compound are mentioned. When other functions such as the anti-reflection, and antistatic property are concurrently taken into consideration, the material should not interfere with these functions. On this occasion, the surface of the functional transparent layer (A) can be imparted with the anti-fouling property while maintaining the anti-reflection property and the antistatic property by using a fluorine compound which has a low refractive index as a constituting material of an anti-reflection film, or coating an outermost surface thereof with a fluorine type organic molecule of from 1 to several molecules.

For example, as to the functional transparent layer (A) having the anti-fouling property, the anti-reflection property, the hard coat property, the antistatic property and the gas barrier property, mentioned are a mono-molecule coated film of a hard coat film/ITO/silicon-containing compound/ITO/silicon-containing compound/a film coated with a mono fluorine type organic molecule, and the like.

Further, in order to prevent deterioration of the dye contained in the electromagnetic wave shielding body by an ultraviolet ray which is irradiated from the display or contained in an external light, it is preferable that the functional transparent layer (A) has an ultraviolet ray cutting-off property. For example, an anti-reflection film comprising a mono-layer or multi-layer of an inorganic thin film which absorbs the ultraviolet ray, a substrate constituting a functional transparent film which contains an ultraviolet ray absorbing agent, and the functional transparent layer (A) having a hard coat film are suitable to this case. No particular limitation is placed on a type and a concentration of the ultraviolet ray absorbing agent.

Further, at least one of the transparent adhesive layers may contain the ultraviolet ray absorbing agent.

It is important that a member which cuts off an ultraviolet ray is disposed between a surface which the ultraviolet ray is incident on and a layer which contains the dye; on this occasion, the ultraviolet cutting-off property may vary according to durability of the dye and is not particularly limited.

8. Thickness

There is a description: "Ordinarily, as thickness of a support becomes larger, a bending energy becomes larger and, accordingly, tackiness becomes larger, but from a certain point, tackiness is decreased by influences of bending moment and other factors" in "Encyclopedia of Adhesion and Viscosity" (published by Asakura Publishing Co., Ltd.) in regard to a relationship between thickness of a support and tackiness. The present inventors have found that an optical filter film can easily be removed from a glass surface by allowing a total thickness of a transparent polymer film to be 0.3 mm or more. Since rigidity of the optical filter film is mainly controlled by the total thickness of the transparent polymer film, it is surmised that an effect according to the present invention is attributable to an effect of the bending moment. Further, with increase of the rigidity of the optical filter film, such removal can continuously be performed by a uniform strength whereupon paste remaining which would start from a removal break point on the glass plate is hardly generated.

Further, as the total thickness of the transparent polymer film becomes larger, impact resistance thereof is enhanced more; however, as a number of laminating layers becomes larger, production efficiency becomes lower whereupon, with substantial increase of the rigidity thereof, it becomes difficult to bond it direct on the display. Therefore, though the total thickness of the transparent polymer film is not particularly limited, but it is in a range of preferably from 0.3 to 1.0 mm and more preferably from 0.4 to 0.8 mm. Further, though the number of the laminating layers is not particularly limited, but it is in a range of preferably from 2 to 6 and more preferably from 2 to 4.

FIGS. 12 to 17 are cross-sectional diagrams each showing an example of a constitution of a display filter according to the invention.

Figure 12:
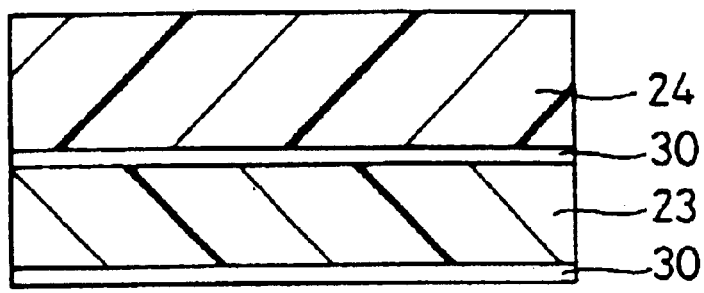
FIG. 12 is a cross-sectional view of a constitutional example of a display filter according to the invention.

In FIG. 12, a transparent adhesive layer 30, a transparent polymer film (B) 23 (150 $\mu$m) having near-infrared shielding capacity, a transparent adhesive layer 30, a transparent polymer film (B) 24 (188 $\mu$m) having a functional transparent layer (A) showing an anti-reflection function are laminated in this order to constitute a display filter.

Figure 13:
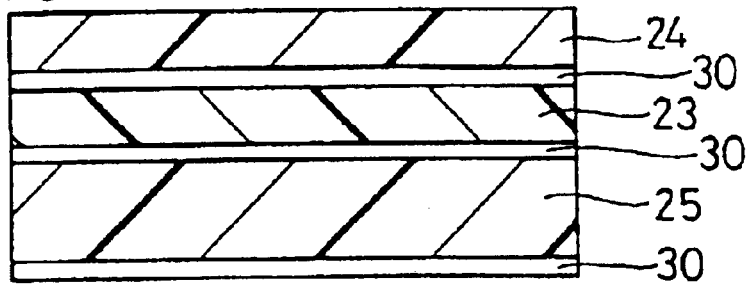
FIG. 13 is a cross-sectional view of a constitutional example of a display filter according to the invention.

In FIG. 13, a transparent adhesive layer 30, a transparent polymer film (B) 25 (200 $\mu$m) for increasing a total thickness, a transparent adhesive layer 30, a transparent polymer film (B) 23 (75 $\mu$m) having near-infrared shielding capacity, a transparent adhesive layer 30, a transparent polymer film (B) 24 (80 $\mu$m) having a functional transparent layer (A) showing an anti-reflection function are laminated in this order to constitute a display filter.

Figure 14:
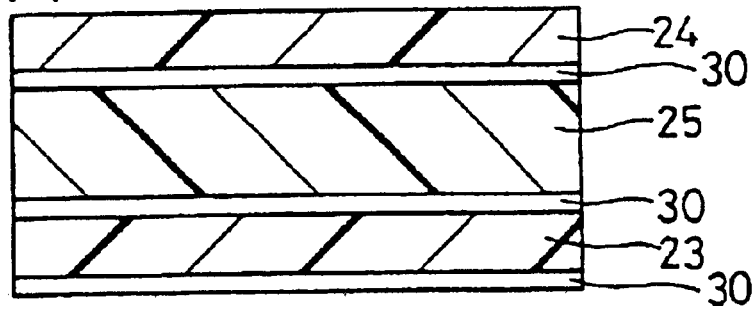
FIG. 14 is a cross-sectional view of a constitutional example of a display filter according to the invention.

In FIG. 14, a transparent adhesive layer 30, a transparent polymer film (B) 23 (75 $\mu$m) having near-infrared shielding capacity, a transparent adhesive layer 30, a transparent polymer film (B) 25 (200 $\mu$m) for increasing a total thickness, a transparent adhesive layer 30, a transparent polymer film (B) 24 (80 $\mu$m) having a functional transparent layer (A) showing an anti-reflection function are laminated in this order to constitute a display filter.

Figure 15:
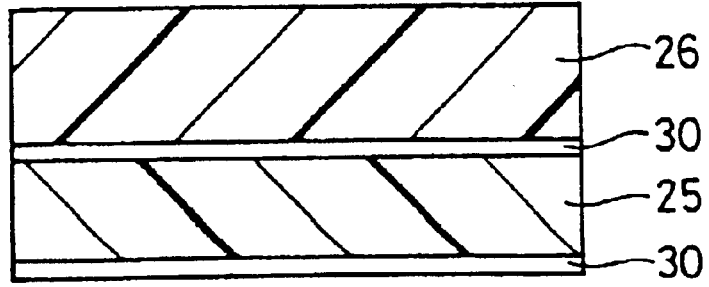
FIG. 15 is a cross-sectional view of a constitutional example of a display filter according to the invention.

In FIG. 15, a transparent adhesive layer 30, a transparent polymer film (B) 25 (200 $\mu$m) for increasing a total thickness, a transparent adhesive layer 30, a functional transparent layer (A) showing an anti-reflection function, a transparent polymer film (B) 26 (150 $\mu$m) having near-infrared shielding capacity are laminated in this order to constitute a display filter.

Figure 16:
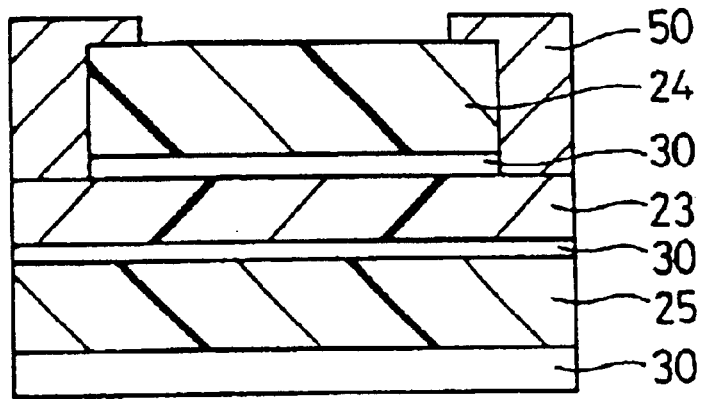
FIG. 16 is a cross-sectional view of a constitutional example of a display filter according to the invention.

In FIG. 16, a transparent adhesive layer 30, a transparent polymer film (B) 25 (200 $\mu$m) for increasing a total thickness, a transparent adhesive layer 30, a transparent polymer film (B) 23 (75 $\mu$m) having a transparent electrically conductive layer (D) showing an electromagnetic wave shielding function, a transparent adhesive layer 30, a transparent polymer film (B) 24 (150 $\mu$m) having a functional transparent layer (A) showing an anti-glare function are laminated in this order to form an electrode 50 on the transparent polymer film 23 thereby constituting a display filter.

Figure 17:
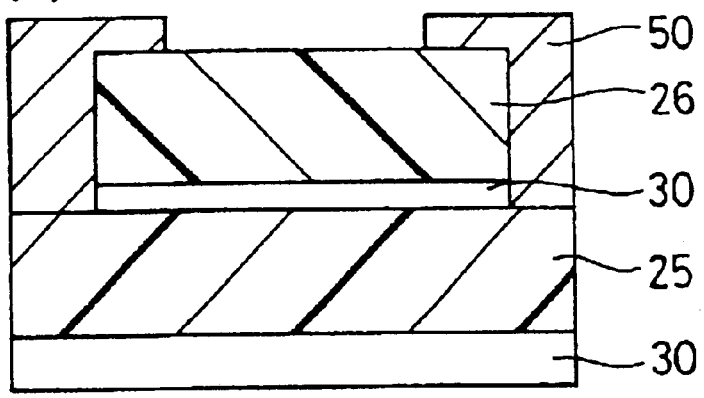
FIG. 17 is a cross-sectional view of a constitutional example of a display filter according to the invention.

In FIG. 17, a transparent adhesive layer 30, a transparent polymer film (B) 25 (200 $\mu$m) for increasing a total thickness, a transparent adhesive layer 30, a transparent polymer film (B) 26 (188 $\mu$m) having a functional transparent layer (A) showing an anti-reflection function and a transparent electrically conductive layer (D) showing an electromagnetic wave shielding function are laminated in this order to form an electrode 50 on the transparent polymer films 25 and 26 thereby constituting a display filter.

Figure 18:
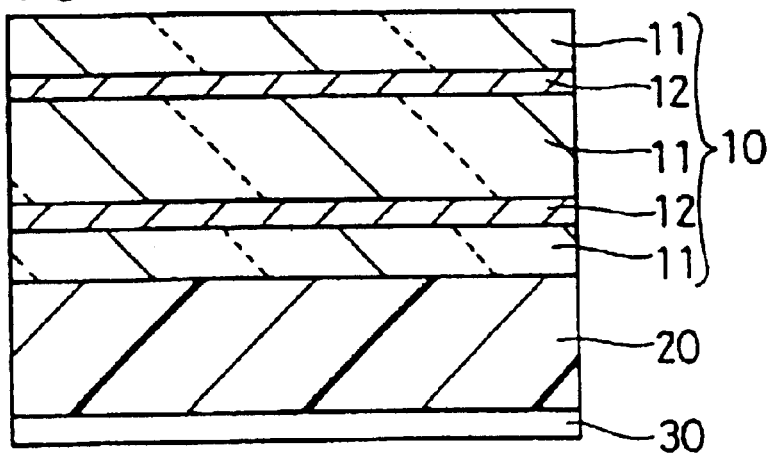
FIG. 18 is a cross-sectional view of a constitution of the transparent polymer film (B) 23 exhibiting an electromagnetic wave shielding function shown in FIG. 16.

FIG. 18 is a cross-sectional diagram showing a constitution of the transparent polymer film (B) 23 showing an electromagnetic wave shielding function shown in FIG. 16. On a polymer film (B) 20, formed is a transparent electrically conductive layer (D) 10 showing an electromagnetic wave shielding function; on this occasion, the transparent electrically conductive layer (D) 10 is constituted by laminating a transparent thin film layer (Dt) 11 having a high refractive index and a metallic thin film layer (Dm) 12 comprising silver or a silver alloy in an order of Dt/Dm/Dt/Dm/Dt. On a reverse side of a filter, disposed is a transparent adhesive layer 30 which enables the filter to be adhered to the display screen.

Figure 19:
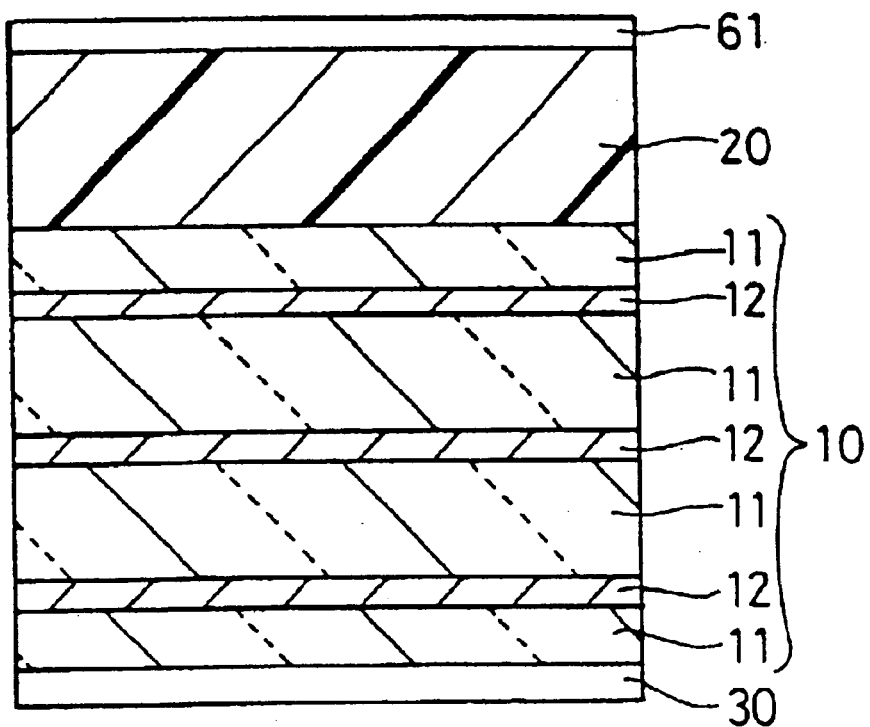
FIG. 19 is a cross-sectional view of a constitution of the transparent polymer film (B) 26 exhibiting an electromagnetic wave shielding function shown in FIG. 17.

FIG. 19 is a cross-sectional diagram showing a constitution of a transparent polymer film (B) 26 showing an electromagnetic wave shielding function shown in FIG. 17. On a polymer film (B) 20, formed is a transparent electrically conductive layer (D) 10 showing an electromagnetic wave shielding function; on this occasion, the transparent electrically conductive layer (D) 10 is constituted by laminating a transparent thin film layer (Dt) 11 having a high refractive index and a metallic thin film layer (Dm) 12 comprising silver or a silver alloy in an order of Dt/Dm/Dt/Dm/Dt/Dm/Dt. On an opposite side of the polymer film (B) 20, disposed is an anti-reflection film 61 as a functional transparent layer (A). On a reverse side of a filter, disposed is a transparent adhesive layer 30 which enables the filter to be adhered to the display screen.

Figure 20:
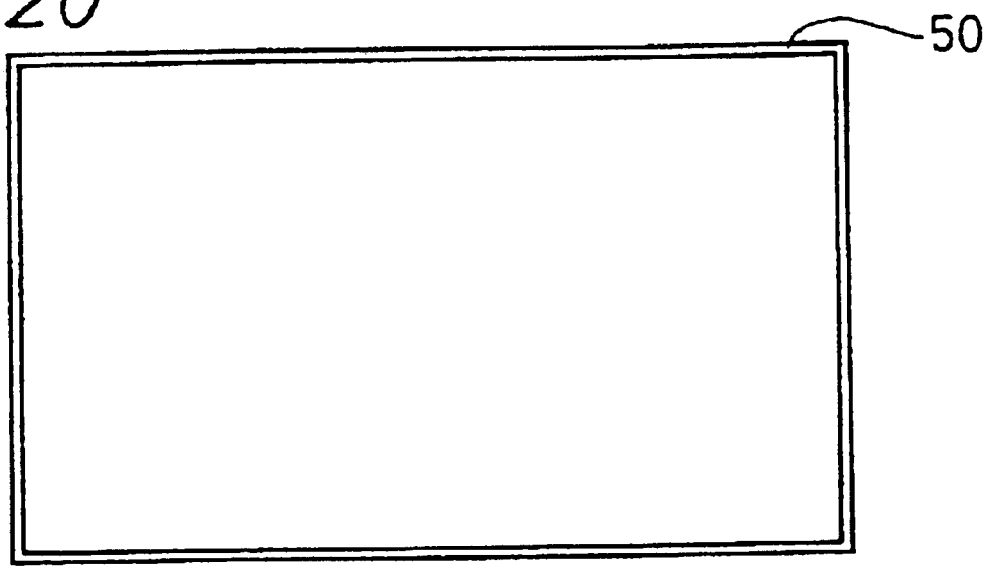
FIG. 20 is a plan view of the display filter shown in FIG. 16 or 17.

FIG. 20 is a plan view of the display filter shown in FIGS. 16 and 17. The filter is rectangular in form, and an image represented on the display is observed through a central portion of the filter. In a peripheral portion of the filter comprising long sides and short sides thereof, formed is an electrode 50 which is electrically connected with a transparent electrically conductive layer; on this occasion, the electrode 50 is connected with a ground terminal of the display.

9. Electrode

Figure 3:
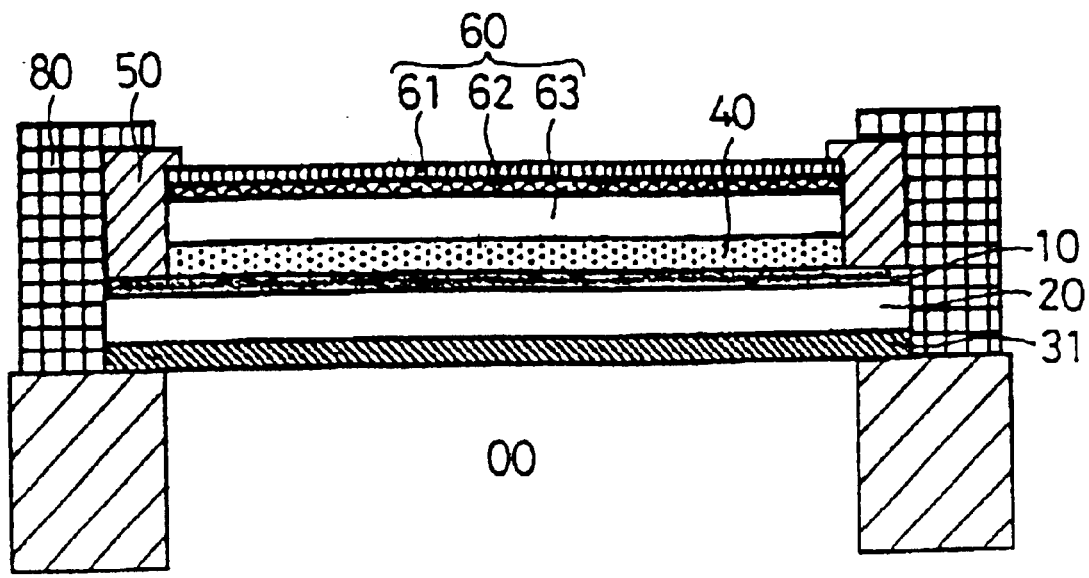
FIG. 3 is a cross-sectional view of an example (Example 1) of an electromagnetic wave shielding body according to the invention and a mounted state thereof.

In equipment requiring electromagnetic wave shielding, an electromagnetic wave is shielded by disposing a metal layer inside a case of the equipment or by using the case made of an electrically conductive material. When transparency is required as in a display screen, a window-like electromagnetic wave shielding body in which a transparent electrically conductive layer is formed is disposed. Since the electromagnetic wave absorbed in the electrically conductive layer induces electric charge, this electric charge must be escaped by grounding the electrically conductive layer. Otherwise the electromagnetic wave shielding body acts as an antenna for emitting electromagnetic waves, resulting in a reduction in electromagnetic wave shielding capacity. Accordingly, it is necessary that the electromagnetic wave shielding body and a ground portion of a main body of the display are electrically connected with each other. For this reason, when the transparent adhesive layer (C) and the functional transparent layer (A) are formed on the transparent electrically conductive layer (D) as shown in FIG. 3, it is preferable that the transparent adhesive layer (C) and the functional transparent layer (A) are formed on the transparent electrically conductive layer (D) such that an electrically conducting portion is left.

No particular limitation is placed on a form of the conducting portion, but it is important that a clearance which an electromagnetic wave is leaked through is not present between the electromagnetic wave shielding body and the main body of the display.

The term "electrode" as used herein is intended to include an electrically conducting portion in the electromagnetic wave shielding body for an external member. The electrode may be an exposed portion of the transparent electrically conductive layer or be made either by printing a metallic past having an electrically conductive property on the exposed portion or by bonding an electrically conductive material such as an electrically conductive tape, an electrically conductive adhesive to the exposed portion for the purpose of protection thereof and a favorable electric connection. Alternatively, the electrode may be formed on the functional transparent layer such that it can secure an electric connection with the transparent electrically conductive layer. As described above, thought no particular limitation is placed on a shape or a material of the electrode, it is preferable that the electrode is formed such that the exposed portion of the transparent electrically conductive layer is covered by the electrically conductive material.

However, the electrode according to the invention may be obtained by contacting the electrically conductive material with a cross-sectional portion of a film comprising the transparent electrically conductive layer according to the invention. The cross-sectional portion, that is, the cross-sectional portion of the film comprising the transparent electrically conductive layer in which at least the transparent electrically conductive layer and a film for protecting it are stratified can be observed, and a desired electrode can be obtained so long as an appropriate electrically conductive material is in contact with the transparent electrically conductive layer in the cross-sectional portion.

On this occasion, when an edge portion of the transparent adhesive layer formed on the transparent electrically conductive layer is withdrawn inside from the edge portion of the transparent electrically conductive layer and an electrode is formed by using an electrically conductive paste, it is favorable that the electrically conductive paste is penetrated into a resultant clearance whereupon a contacting area between the transparent electrically conductive layer and the electrode is increased.

FIGS. 21 to 25 are each a cross-sectional diagram showing an example of a constitution of a display filter according to the invention.

Figure 21:
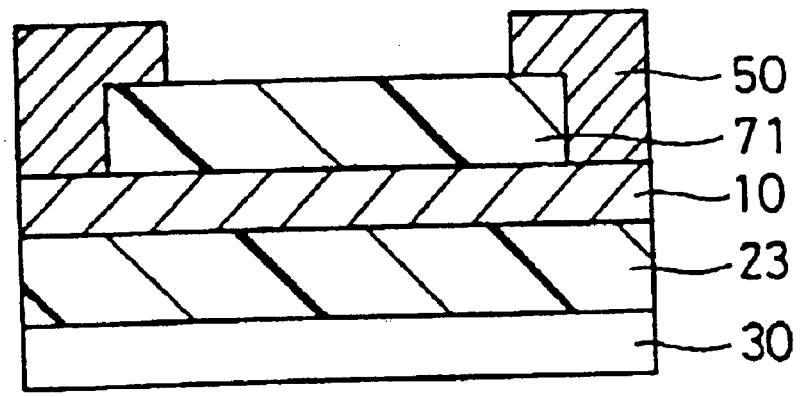
FIG. 21 is a cross-sectional view of a constitutional example of a display filter according to the invention.

In FIG. 21, a transparent adhesive layer 30, a transparent polymer film (B) 23, a transparent electrically conductive layer (D) 10, and an anti-glare film 71 which is a functional transparent layer (A) are laminated in this order to form an electrode 50 on the transparent electrically conductive layer (D) 10 thereby constituting a display filter.

Figure 22:
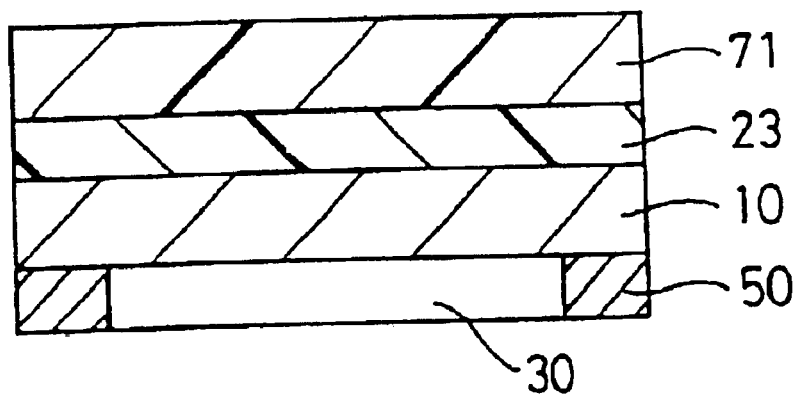
FIG. 22 is a cross-sectional view of a constitutional example of a display filter according to the invention.

In FIG. 22, from the outside toward a display side, an anti-glare film 71 which is a functional transparent layer (A), a transparent polymer film (B) 23, a transparent electrically conductive layer (D) 10 are laminated in this order to form an electrode 50 in a periphery of the transparent electrically conductive layer (D) 10. On a reverse side of the transparent electrically conductive layer (D) 10, a transparent adhesive layer 30 is disposed in a central portion thereof excluding the electrode 50 thereby allowing the resultant laminate to be bonded to a display screen.

Figure 23:
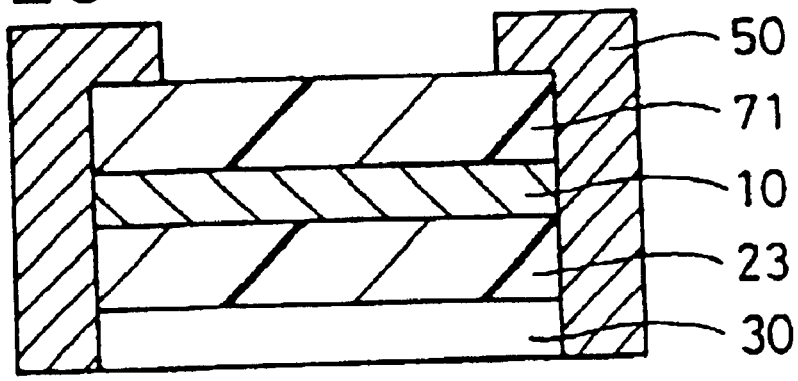
FIG. 23 is a cross-sectional view of a constitutional example of a display filter according to the invention.

In FIG. 23, a transparent adhesive layer 30, a transparent polymer film (B) 23, a transparent electrically conductive layer (D) 10, and an anti-glare film 71 which is a functional transparent layer (A) are laminated in this order to form an electrode 50 on an end surface of a side edge of the resultant laminate thereby constituting a display filter.

Figure 24:
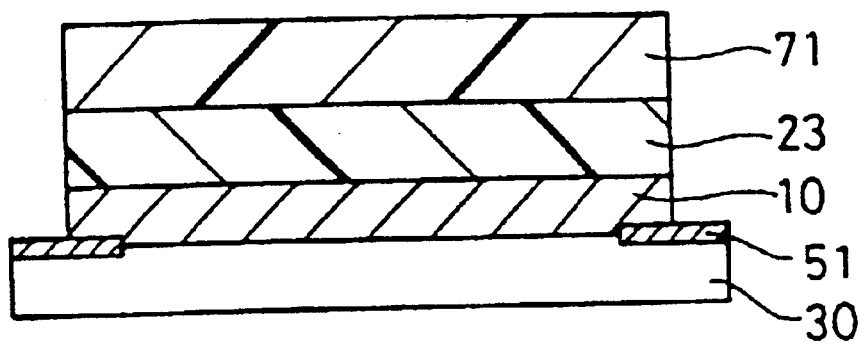
FIG. 24 is a cross-sectional view of a constitutional example of a display filter according to the invention.

In FIG. 24, a transparent adhesive layer 30, a transparent electrically conductive layer (D) 10, a transparent polymer film (B) 23, an anti-glare film 71 which is a functional transparent layer (A) are laminated in this order whereupon an electrically conductive tape 51 such as a copper tape is interposed between the transparent adhesive layer 30 and the transparent electrically conductive layer (D) 10 to secure an electrical connection to the transparent electrically conductive layer (D) 10 via a filter peripheral portion.

Figure 25:
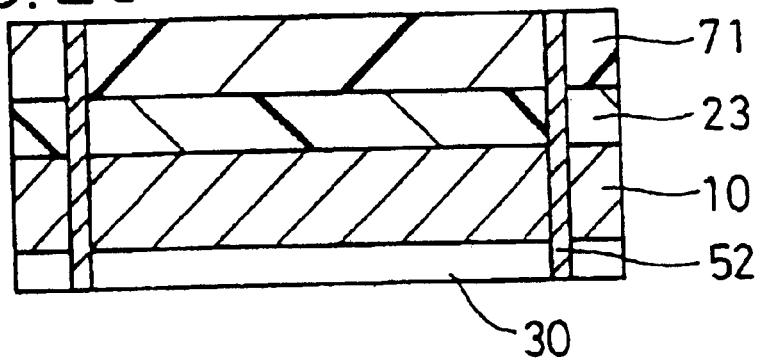
FIG. 25 is a cross-sectional view of a constitutional example of a display filter according to the invention.

In FIG. 25, a transparent adhesive layer 30, a transparent electrically conductive layer (D) 10, a transparent polymer film (B) 23, an anti-glare film 71 which is a functional transparent layer (A) are laminated in this order whereupon a through-hole electrode 52 is formed in a direction of thickness of a filter thereby securing an electrical connection to the transparent electrically conductive layer (D) 10.

Figure 26:
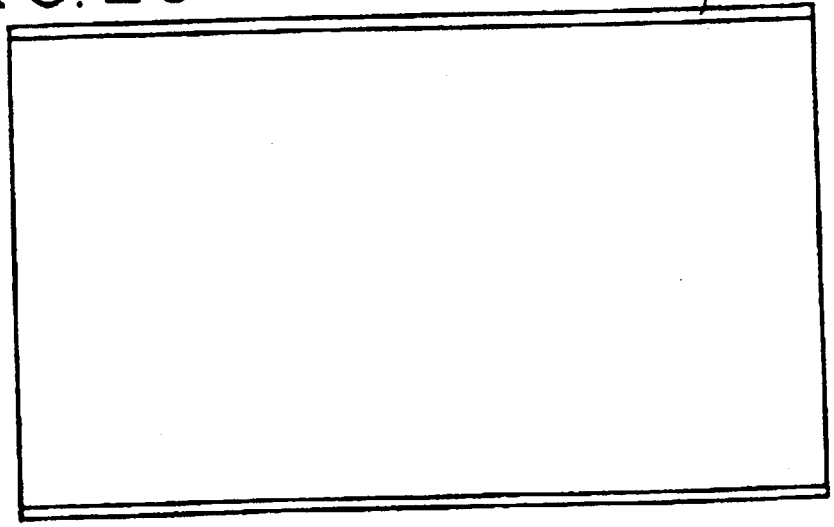
FIG. 26 is a plan view of the display filter shown in FIGS. 21 to 25.

FIG. 26 is a plan view of the display filter shown in FIGS. 21 to 25. The filter is rectangular in form, and an image represented on the display is observed by allowing it to pass through a central portion of the filter. On two long sides of the filter, formed are electrodes 50, electrically conductive tapes 51 or through-hole electrodes 52 which are electrically connected with a transparent electrically conductive layer; on this occasion, these electrodes are connected with a ground terminal of the display. Further, an electrode of the display filter shown in FIGS. 21 to 25 may, needless to mention, be disposed in an entire periphery of the filter in the same manner as in the plan view shown in FIG. 20.

As shown in FIG. 24, it is permissible that an electrically conductive tape such as a copper tape is interposed between the transparent electrically conductive layer and the transparent adhesive layer to be bonded thereon to form an electrode by drawing out a portion of the electrically conductive tape to an outside of the electromagnetic wave shielding body. On this occasion, the electrically conductive tape drawn externally into the outside becomes a substantial electrode.

As shown in FIG. 25, it is permissible that a clearance which extends from the transparent electrically conductive layer to an outermost surface of the electromagnetic wave shielding body is provided to form an electrode. No particular limitation is placed on a shape of the clearance as viewed from the surface, and it is permissible that the shape is either circular or polygonal. Further, the clearance may be formed in a line shape. There is no particularly specified size in regard to individual clearances as viewed from the surface. However, it is not favorable that the size is unduly large such that the clearance protrudes into a visibility portion. A position of the clearance to be formed is not particularly limited so long as it avoids the visibility portion. As a natural course, the position comes to be in a neighborhood of an edge portion. No particular limitation is placed on a number of clearances to be formed; however, it is preferable that the clearances are formed as many as possible over an entire periphery to enhance efficiency of drawing out an electric current. It is sufficient to dispose the clearance between the transparent electrically conductive layer and the outermost surface of the electromagnetic wave shielding body; on this occasion, it is preferable that the clearance passes through the transparent electrically conductive layer for an intention of increasing a contact area with an electrode to be formed.

There is also no particular designation in regard to a member to fill the clearance. The clearance may be filled with a metallic material or an electrically conductive paste. On this occasion, the member which fills the clearance becomes a substantial electrode.

It is preferable that an electrically conducting portion is deposited in a peripheral portion of the transparent electrically conductive layer (D) in a continuous manner. Namely, it is preferable that the conducting portion is deposited in frame form in a place excluding a central portion of the representation portion of the display.

However, even in a case in which the conducting portion is not formed in the entire periphery, since there is a given electromagnetic wave shielding capacity therein, there are many cases in which the conducting portion is used by taking into consideration a quantity of electromagnetic wave emission from the apparatus and a quantity of permissible electromagnetic wave leakage in a comprehensive manner.

For example, when a design is established such that the electrically conductive material is provided only on sides of a rectangle facing with each other to form electrodes, since each the electrode can be formed by a roll-to-roll method or a method of using the electrically conductive material as it is in a roll state, it is convenient that an optical filter can be prepared with extremely favorable production efficiency. Further, the method can also be utilized when the electrically conductive tape is used as an electrode, as previously shown.

There is no particular problem, even when another electrode is formed in another portion of the rectangle in addition to the portion of two sides of the rectangle facing with each other, or when a part in which an electrode is not formed is present within a portion of such two sides facing each other.

The electrode which covers the conducting portion becomes also a protection for the transparent electrically conductive layer (D) which is inferior in environmental resistance and scratch resistance. From the viewpoint of electric conductivity, corrosion resistance, adhesion to the transparent electrically conductive film and the like, as materials which can be used for the electrode, employable are a metal as a simple substance selected from the group consisting of: silver, gold, copper, platinum, nickel, aluminum, chromium, iron, zinc, and carbon, an alloy made of two or more of these metals, a mixture of an synthetic resin and either a simple substance of these metals or an alloy thereof, and a paste which is a mixture of borosilicate glass and either a simple substance of these metals or an alloy thereof. The electrode can be formed according to any of various conventionally known methods such as a metal plating method, a vacuum deposition method, and a sputtering method. Moreover, where a paste or the like is used for the electrode, other conventionally known methods such as a printing method and a coating method may also be employed.

No particular limitation is place on an electrically conductive material to be used, so long as it is electrically conductive. Ordinarily, a material having an electrically conductive property in paste form such as a silver paste can be employed.

As a method of forming the electrode, when a material in paste form is used, such formation thereof can be performed by first applying it on a cross-sectional portion and, then, drying it. It is permissible that the electrically conductive material is applied to a side surface of a film in a rolled state, or the material is applied on the side surface of the film while the film is being unwound by a roll-to-roll method. Further, the electrically conductive material in tape form can also be employed.

Furthermore, it is permissible that, after a transparent polymer film in which a transparent electrically conductive thin layer is formed on a transparent supporting substrate is bonded thereto, a cross-sectional portion of the resultant transparent polymer film is applied with paste.

As a method of application, from the viewpoint of efficiency and accuracy, screen printing is employed in many cases.

Further, when an electrode is formed by filling a clearance by a metallic member, after the electromagnetic wave shielding body itself may not be previously treated. A metallic ground portion in which a screw hole is formed is previously prepared in a peripheral portion of a representation portion of a display apparatus and, then, after the electromagnetic wave shielding body is bonded to the representation portion of the display apparatus including the metallic ground portion, an electrically conductive screw may be fit in the screw hole of the metallic ground portion such that it penetrates the electromagnetic wave shielding body. On this occasion, such an electrically conductive screw substantially serves as an electrode. When this method is utilized, not only it is possible to prepare the electromagnetic wave shielding body with a high productivity by means of the roll-to-roll method, but also it is easy to form an electrode over an entire peripheral portion of the electromagnetic wave shielding body.

10. Electromagnetic Wave Shielding

In order to allow leakage of an electromagnetic wave from between the electromagnetic wave shielding body and a display apparatus to be minimal, it is necessary to decrease an insulating interval between an electrically conductive layer of the electromagnetic wave shielding body and the display apparatus. When air or other insulating substances are present in a clearance, the electromagnetic wave unfavorably comes out therefrom.

When the electromagnetic wave shielding body is prepared by bonding a transparent electrically conductive film to a supporting substrate as has conventionally been done, the supporting substrate which is an insulating substance is allowed to be present between the transparent electrically conductive layer and the display apparatus; on this occasion, unless the transparent electrically conductive layer and the display apparatus were in contact with each other over an entire periphery such that electric conductivity is maintained, a sufficient electromagnetic wave shielding effect was not able to be obtained. For this reason, in a production process of the electromagnetic wave shielding body a process that the transparent electrically conductive film is bonded to a transparent supporting substrate in sheet form and also an operation that an electrode is formed in an entire peripheral portion of the sheet have been necessary.

In the invention, when the electromagnetic wave shielding body in a film state is bonded directly to the display apparatus, since a distance between the electrically conductive layer and the display apparatus is extremely short, the insulating interval can substantially be narrowed comparing with a conventional method; on this occasion, a sufficient electromagnetic wave shielding effect can favorably be obtained without forming an electrode in an entire peripheral portion. This effect is conspicuous when the transparent electrically conductive layer of the electromagnetic wave shielding body is formed to a side of the display apparatus. Namely, a sufficient electromagnetic wave shielding effect can be obtained by forming an electrode only on two long sides of a rectangle. On this occasion, it is extremely favorable that a roll-to-roll method which is a method having an extremely high productivity as a production method can be utilized.

11. Display Apparatus and Method for Production of the Same

A display apparatus according to the invention comprises a display filter functioning as an electromagnetic wave shielding body and/or a light control film which is adhered to a representation portion of the apparatus. The electromagnetic wave shielding body electrically contacts the display apparatus.

As a method for production of the display apparatus according to the invention, mentioned, but not limited thereto, are mainly following methods (1) to (10):

Method (1): the electromagnetic wave shielding body according to the invention comprising a functional transparent layer (A) and an electrically conducting portion (and an electrode)/a transparent electrically conductive layer (D)/a polymer film (B) (and a hard coat layer (F))/a transparent adhesive layer (C), or a functional transparent layer (A) and an electrically conducting portion (and an electrode)/a transparent adhesive layer (C)/a transparent electrically conductive layer (D)/a polymer film (B) (and a hard coat layer (F))/a transparent adhesive layer (C) is bonded to a representation portion of a display apparatus such that the transparent adhesive layer (C) comes to be a surface to be bonded.

After a bonding operation is performed, an electrical conducting portion of the electromagnetic wave shielding body according to the invention or an electrode formed on the electrically conducting portion and an electrically conducting portion of a main body of a display apparatus, that is, a ground portion, are electrically connected with each other by means of an electrically conductive tape, an electrically conductive adhesive, an electrically conductive paint or an electrically conductive molded member.

Method (2): After a laminate comprising a transparent electrically conductive layer (D)/a polymer film (B) (and a hard coat layer (F))/a transparent adhesive layer (C) in this order is bonded to a representation portion of a display apparatus such that that the transparent adhesive layer (C) comes to be a surface to be bonded, a functional transparent layer (A) is formed on the transparent electrically conductive layer (D) while leaving an electrically conducting portion directly or via the transparent adhesive layer (C) and, further, an electrically conducting portion of the laminate and an electrically conducting portion, that is, an ground portion, of a main body of a display apparatus are electrically connected with each other by means of an electrically conductive tape, an electrically conductive adhesive, an electrically conductive coating material or an electrically conductive molded member.

Method (3): After a transparent adhesive layer (C) is applied or bonded to a representation portion of a display apparatus and, then, a laminate comprising a functional transparent layer (A) and an electrically conducting portion (and an electrode)/a transparent electrically conductive layer (D)/a polymer film (B) (and a hard coat layer (F)) in this order is bonded to the resultant representation portion such that the polymer film (B) comes to be a surface to be bonded, an electrically conducting portion of the laminate and an electrically conducting portion of a main body of the display apparatus, that is, a ground portion are electrically connected with each other by means of an electrically conductive tape, an electrically conductive adhesive, an electrically conductive paint or an electrically conductive molded member.

Method (4): After a transparent adhesive layer (C) is applied or bonded to a representation portion of a display apparatus and, then, a transparent laminate comprising a transparent electrically conductive layer (D)/a polymer film (B) (and a hard coat layer (F)) in this order is bonded to the resultant representation portion such that the polymer film (B) comes to be a surface to be bonded, a functional transparent layer (A) is formed on the transparent electrically conductive layer (D) while leaving an electrically conducting portion directly or via a second transparent adhesive layer and, further, an electrically conducting portion of the laminate and an electrically conducting portion of a main body of the display apparatus, that is, a ground portion are electrically connected with each other by means of an electrically conductive tape, an electrically conductive adhesive, an electrically conductive paint or an electrically conductive molded member.

Method (5): An electromagnetic wave shielding body comprising a functional transparent layer (A)/polymer film (B)/a transparent electrically conductive layer (D)/a transparent adhesive layer (C) and an electrically conductive adhesive layer is bonded to at least a representation portion of a display apparatus such that the transparent adhesive layer (C) comes to a surface to be bonded and, further, to at least a ground portion of a display apparatus such that the electrically conductive adhesive layer comes to be a surface to be bonded.

Method (6): After a transparent adhesive layer (C) is formed on at least a representation portion of a display apparatus or a translucent portion on a transparent electrically conductive layer (D) of a laminate comprising the transparent electrically conductive layer (D)/a polymer film (B)/a functional transparent layer (A) and, further, an electrically conductive layer is formed on at least a ground portion of the display apparatus or the transparent electrically conductive layer (D) of the laminate, the laminate and the display apparatus are bonded to each other.

Method (7): An electromagnetic wave shielding body, comprising a functional transparent layer (A)/a polymer film (B)/a transparent electrically conductive layer (D)/a transparent adhesive layer (C) and an electrically conductive adhesive layer, in which an electrically conductive tape such as a copper tape is interposed between the transparent electrically conductive layer (D) and the polymer film (B) at an edge portion thereof is bonded to at least a representation portion of a display apparatus such that the transparent adhesive layer (C) comes to be a surface to be bonded and, further, an outer exposed portion of the electrically conductive tape is bonded to at least ground portion of the display apparatus.

Method (8): After a transparent adhesive layer (C) is formed in at least a representation portion of a display apparatus or at least a translucent portion on a transparent electrically conductive layer (D) of a laminate, comprising a transparent electrically conductive layer (D)/a polymer film (B)/a functional transparent layer (A) in this order, in which an electrically conductive tape such as a copper tape is interposed between the transparent electrically conductive layer (D) and the polymer film (B) at an edge portion thereof and, further, an electrically conductive adhesive layer is formed on at least a ground portion of the display apparatus or the transparent electrically conductive layer (D) of the laminate, the laminate and the display apparatus are bonded to each other.

Since the electromagnetic wave shielding body is excellent in transmission characteristics, transmittance and visible light ray reflectance, color purity and contrast of a plasma display can be enhanced without tremendously detracting from luminance of the plasma display by forming the electromagnetic wave shielding body in the display. Further, since the electromagnetic wave shielding body is excellent in electromagnetic wave shielding capacity which blocks an electromagnetic wave which is considered to be harmful to health and efficiently cuts off a near-infrared ray, having a wavelength region of from about 800 to about 1,100 nm, emerging from the plasma display, the electromagnetic wave shielding body exerts no adverse influence on wavelengths used in a remote controller of neighboring electronic equipment, optical communications by a transmission system or the like, and hence can prevent a malfunction thereof. Further, it has good weather resistance and environmental resistance, as well as anti-reflection property and/or an anti-glare property, scratch resistance, an anti-fouling property, an anti-electrostatic property and the like and can be provided at low cost. By comprising the electromagnetic wave shielding body according to the invention, the plasma display having excellent characteristics can be provided.

Since the electromagnetic wave shielding body according to the invention is excellent in an optical characteristic, electromagnetic wave shielding capacity, a near-infrared ray cutting-off capacity, the electromagnetic wave shielding body can advantageously be used in various types of other displays such as an FED (Field Emission Display) and a CRT (Cathode Ray Tube) which emit an electromagnetic wave and/or a near-infrared ray than the plasma display.

In regard to a method for production of the display apparatus comprising a light control film, mentioned, but not limited thereto, are mainly following two methods:

Method (9): At least a light control film according to the invention comprising a functional transparent layer (A)/a polymer film (B)/a transparent adhesive layer (C) is bonded to at least a representation portion of a display apparatus such that the transparent adhesive layer (C) comes to be a surface to be bonded.

Method (10): a transparent adhesive layer (C) is formed in at least a representation portion of a display apparatus and, then, a laminate comprising at least a transparent electrically conductive layer (D)/a polymer film (B) in this order is bonded to the display apparatus such that the polymer film (B) comes to be a surface to be bonded.

Since the light control film according to the invention is excellent in transmission characteristics, transmittance and a reflection characteristic, color purity and contrast of a plasma display can be enhanced without substantially detracting from luminance of the plasma display by forming the light control film directly in the representation portion of the display such as a color plasma display. Further, it concurrently has good scratch resistance, an anti-fouling property, an anti-electrostatic property and the like and can be provided at low cost.

Further, by forming the light control film according to the invention directly on a surface of the display and comprising the thus-formed display, the display apparatus having excellent characteristics can be provided.

EXAMPLES

The present invention is further illustrated by the following examples. However, these examples are not to be construed to limit the scope of the invention.

A thin film constituting a transparent electrically conductive layer (D) in the examples is deposited on a major surface of one side of a substrate by a magnetron DC sputtering process. Thickness of the thin film is a value determined from film-deposition conditions, and is not a value obtained by actually measuring the thin film.

A high-refractive-index transparent thin film layer (Dt) was formed by an ITO thin film; and the ITO film was deposited by using an indium oxide/a tin oxide sintered body (composition ratio is $In_2O_3:SnO_2=90:10$ wt %) or the tin oxide sintered body as a target and an argon-oxygen gaseous mixture (with a total pressure of 266 mPa and a partial pressure of oxygen of 5 mPa) as a sputtering gas.

A metallic thin film layer (Dm) is formed by a silver thin film or a silver-palladium alloy thin film; the metallic thin film was deposited by using silver or the silver-palladium alloy (palladium content being 10 wt %) as a target and argon gas (with a total pressure of 266 mPa) as a sputtering gas.

Further, surface resistance of the transparent electrically conductive layer was measured with a four-probe method (probe spacing being 1 mm). Further, with respect to visible light ray reflectance (Rvis) of a surface thereof, first of all, a small piece was cut out of an object to be measured and, next, after a transparent adhesive layer was removed therefrom and a surface thereof in a side of a polymer film (B) was roughened by a sandpaper, the surface was deprived of a reflecting property by being sprayed by a matting black paint. Using an integrating sphere (a light ray incidence angle being 6°), a total light ray reflectance of the thus-treated small piece in a visible wavelength region was measured with a spectrophotometer (U-3400; manufactured by Hitachi, Ltd.). From the reflectance thus obtained, the visible light ray reflectance (Rvis) was calculated in accordance with JIS R-3106.

Example 1

Designating a biaxially stretched polyethylene terephthalate (hereinafter referred to also as PET) film (188 μm thick) as a polymer film (A), a transparent electrically conductive layer (B) comprising 7 layers in total made up of an ITO thin film (40 nm thick), a silver thin film (11 nm thick), an ITO thin film (95 nm thick), a silver thin film (14 nm thick), an ITO thin film (90 nm thick), a silver thin film (12 nm thick) and an ITO thin film (40 nm thick) in this order as viewed from a side of the PET film was formed on one major surface of the PET film to prepare a transparent laminate 1 comprising the transparent electrically conductive layer (B) having a surface resistance of 2.2 Ω/square.

A cross-section of a PET film/a transparent electrically conductive layer is shown in FIG. 1 as an example of a polymer film (B)/a transparent electrically conductive layer (D) according to the invention. A reference numeral 10 in FIG. 1 denotes a transparent electrically conductive layer (D), a reference numeral 11 denotes a high-refractive-index transparent thin film layer (Dt), a reference numeral 12 denotes a metallic thin film layer (Dm) and a reference number 20 denotes a polymer film (B).

An organic dye was disperse-dissolved in a solvent of ethyl acetate/toluene (50:50 wt %) to prepare a diluting liquid for an acrylic adhesive. An acrylic adhesive and a diluting liquid containing a dye were mixed with each other at a mixing ratio of 80:20 wt % and, then, after the resultant mixture was applied in a thickness of 25 μm on a surface in a side of the polymer film (B) of the transparent laminate 1 by means of a comma coater and dried, a mold releasing film was laminated on an adhesive face to form a transparent adhesive layer (C) (adhesive 1) interposed between the mold releasing film and the polymer film (B) of the transparent laminate. On this occasion, a refractive index of the adhesive 1 was 1.51 and an extinction coefficient thereof was 0.

As an organic dye, a dye PD-319 manufactured by Mitsui Chemicals, Inc. having an absorption maximum in a wavelength of 595 nm for absorbing an unnecessary luminescence emitted from a plasma display and a red color dye PS-Red-G manufactured by Mitsui Chemicals, Inc. for correcting chromaticity of white color luminescence were used to adjust the acrylic adhesive/the dye-containing diluting liquid such that these dyes are contained in a dried adhesive 1 in amounts of 1150 (wt)ppm and 1050 (wt)ppm, respectively. Further, PD-319 is a tetra-t-butyl-tetraazaporphyrin/vanadyl complex expressed by the following formula (3):

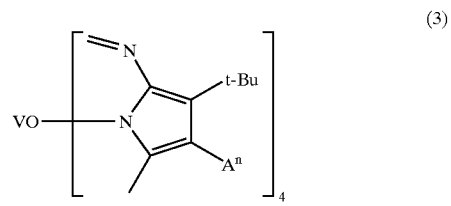

A coating liquid in which a photopolymerization initiator is added to a multi-functional methacrylate resin and, further, ITO fine particles (average particle diameter: 10 nm) are dispersed thereto was coated on one major surface of a triacetyl cellulose (TAC) film (thickness: 80 μm) by a gravure coater and cured by an ultraviolet ray to form an electrically conductive hard coat film (film thickness: 3 μm) and, then, a fluorine-containing organic compound solution was coated on the thus-formed hard coat film by a micro gravure coater and dry-cured at 90° C. to form an anti-reflection film (film thickness: 100 nm) having a refractive index of 1.4 whereupon an anti-reflection film 1 was obtained as a functional transparent layer (E) having a hard coat property (pencil hardness in accordance with JIS K-5400: 2H), a gas barrier property (in accordance with ASTM-E96, 1.8 g/m² day), an anti-reflection property (Rvis of surface: 1.0%), an antistatic property (surface resistance: $7 \times 10^9$ Ω/square) and an anti-fouling property. An adhesive/a diluting liquid comprising same raw materials as in the adhesive 1 but not containing a dye was applied on the other major surface of the anti-reflection film 1 and, then, dried to form a transparent adhesive layer (adhesive 2) having a thickness of 25 μm and, thereafter, a mold releasing film was laminated on the thus-formed transparent adhesive layer.

Figure 2:
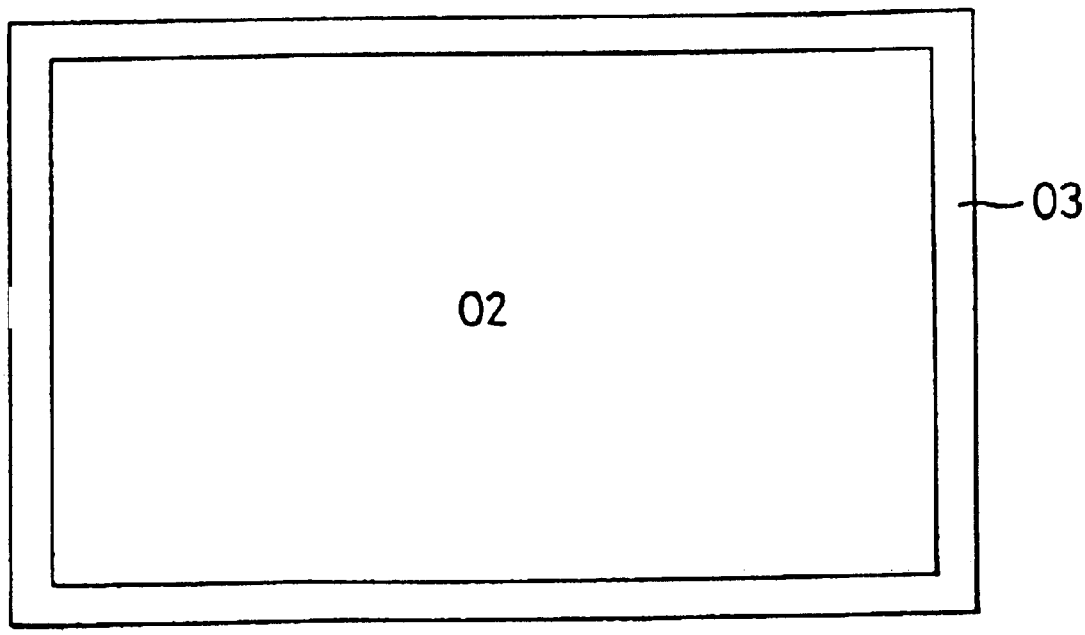
FIG. 2 is a plan view of an example of an electromagnetic wave shielding body according to the invention.

A material of a transparent laminate 1/an adhesive 1/a mold releasing film in roll form was cut into a size of 970 mm×570 mm and fixed on a supporting plate made of glass such that a surface of a transparent electrically conductive layer (D) comes on the top. Further, an anti-reflection film was laminated only on an inside portion of the transparent electrically conductive layer (D) while leaving an electrically conducting portion such that 20 mm wide of a peripheral portion thereof was exposed by using a laminator. A plan view as viewed from a surface of the transparent electrically conductive layer (D) was shown in FIG. 2 as an example of the electromagnetic wave shielding body according to the invention. In FIG. 2, a reference numeral 02 denotes a translucent portion of the electromagnetic wave shielding body and a reference numeral 03 denotes an electrically conducting portion of the electromagnetic wave shielding body.

Further, a silver paste (MSP-600F; manufactured by Mitsui Chemicals, Inc.) was screen-printed to an area of 22 mm wide of a peripheral portion of the transparent electrically conductive layer (D) such that the silver past covers an exposed electrically conducting portion and, then, dried to form an electrode of 15 μm thick. Thereafter, the resultant material was removed from the supporting plate to prepare the electromagnetic wave shielding body according to the invention having a mold releasing film on a surface of the transparent adhesive layer (C).

Thereafter, the electromagnetic wave shielding body was deprived of the mold releasing film and was bonded to a front surface (representation portion: 920 mm×520 mm) of a plasma display panel by a sheet fed laminator and, then, was subjected to an autoclave treatment under heating and pressure conditions of 60° C. and 2×105 Pa. An electrode portion of the electromagnetic wave shielding body and a ground portion of the plasma display panel were bonded to each other by using an electrically conductive copper foil adhesive tape (510FR) manufactured by Teraoka Seisakusho Co., Ltd. to obtain a display apparatus comprising the electromagnetic wave shielding body according to the invention. A cross-section of the electromagnetic wave shielding body is shown in FIG. 3 as an example of the electromagnetic wave shielding body according to the invention and a mounted state thereof. In FIG. 3, a reference numeral 00 denotes a display area, a reference numeral 10 denotes a transparent electrically conductive layer (D), a reference numeral 20 denotes a polymer film (B), a reference numeral 31 denotes a transparent adhesive layer (C) containing a dye, a reference numeral 40 denotes a transparent adhesive layer (E), a reference numeral 50 denotes an electrode, a reference numeral 60 denotes a functional transparent layer (A) having an anti-reflection property, a hard coat property, a gas barrier property, an antistatic property and an anti-fouling property, a reference numeral 61 denotes an anti-reflection film having an anti-fouling property, a reference numeral 62 denotes a hard coat film having an antistatic property, a reference numeral 63 denotes a transparent substrate in which the hard coat film 62 and the anti-reflection film 61 are formed and a reference numeral 80 denotes an electrically conductive copper foil adhesive tape.

Example 2

Polyethylene terephthalate pellets 1203 (manufactured by Unitika, Ltd.) were mixed with 0.01% by weight of a red color dye PS-Red-G manufactured by Mitsui Chemicals, Inc. for correcting chromaticity of white color luminescence and 0.015% by weight of a violet color dye PS-Violet-RC manufactured by Mitsui Chemicals, Inc., melted at a temperature of from 260° C. to 280° C. and extruded to form a film having a thickness of 200 $\mu$m. Thereafter, this film was biaxially stretched to prepare a PET film (polymer film (B)) containing a dye and having a thickness of 100 $\mu$m.

On one major surface of the PET film, a coating liquid in which alkoxysilane was decomposed by glacial acetic acid and added with a silicone type surface smoothing agent was applied by a gravure coater, and then thermally cured at 120° C. to form a hard coat film (film thickness: 10 $\mu$m, pencil hardness: 3H) thereby obtaining a PET film containing a dye in which a hard coat layer (F) is formed. On the hard coat layer, a transparent electrically conductive layer (D) comprising 5 layers in total made up of an $SnO_2$ thin film (film thickness: 40 nm), a silver thin film (film thickness: 9 nm), an $SnO_2$ thin film (film thickness: 80 nm), a silver-palladium alloy thin film (film thickness: 11 nm), and an $SnO_2$ thin film (film thickness: 40 nm) in this order and having a surface resistance of 5.3 $\Omega$/square is formed to prepare a transparent laminate 2 comprising a PET film containing a dye/a hard coat layer (F)/a transparent electrically conductive layer (D) An adhesive/a diluting liquid comprising same raw materials as in the adhesive 1 but not containing a dye was applied on a surface of PET film of the transparent laminate 2 and, then, dried to form a transparent adhesive layer (C) (adhesive 3) having a thickness of 25 $\mu$m and, thereafter, a mold releasing film was laminated on the thus-formed transparent adhesive layer (C).

A material comprising a transparent laminate 2/an adhesive 3/a mold releasing film in roll form was cut into a size of 970 mm×570 mm and fixed on a supporting plate made of glass such that a surface of a transparent electrically conductive layer (D) comes on the top.

A coating liquid in which a photopolymerization initiator is added to a multi-functional methacrylate resin and, further, organic silica fine particles (average particle size: 15 $\mu$m) are dispersed thereto was prepared.

The coating liquid was flexo-graphically printed only on an inside portion of the transparent electrically conductive layer (D) while leaving an electrically conducting portion thereof such that 20 mm wide of a peripheral portion thereof was exposed, and cured by an ultraviolet ray to form an anti-glare layer as a functional transparent layer (A) having an anti-glare property (haze value measured by a haze meter: 5%), and a hard coat property (pencil hardness: 2H). Thereafter, the resultant material was removed from the supporting plate to prepare the electromagnetic wave shielding body according to the invention having a mold releasing film on a surface of the transparent adhesive layer (C).

Thereafter, the electromagnetic wave shielding body was deprived of the mold releasing film and was bonded to a front surface (representation portion: 920 mm×520 mm) of a plasma display panel by a sheet fed laminator and, then, was subjected to an autoclave treatment under heating and pressure conditions of 60° C. and 2×105 Pa. An electrically conducting portion of the electromagnetic wave shielding body and a ground portion of the plasma display panel were connected to each other by using an electrically conductive copper foil adhesive tape (510FR) manufactured by Teraoka Seisakusho Co., Ltd. to obtain a display apparatus comprising the electromagnetic wave shielding body according to the invention.

Figure 4:
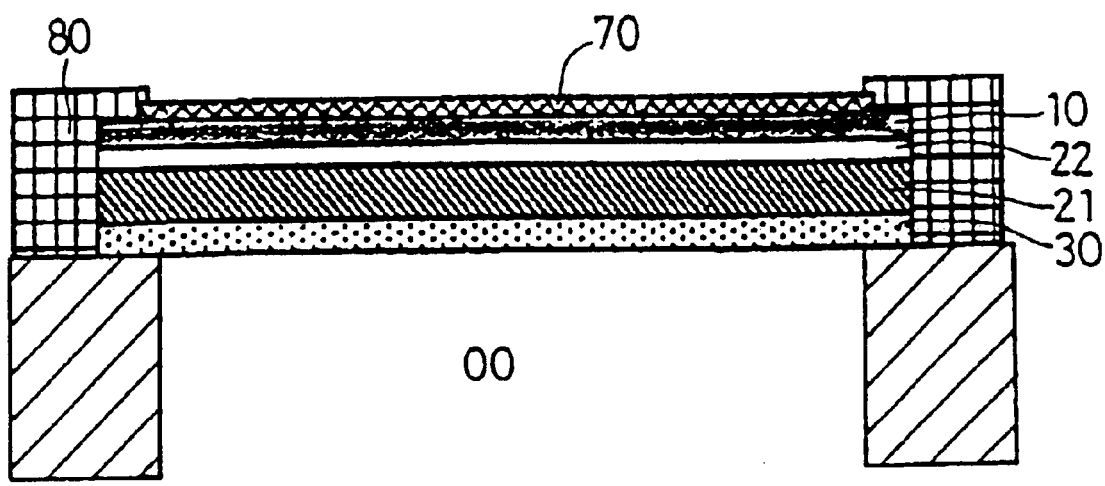
FIG. 4 is a cross-sectional view of an example (Example 2) of an electromagnetic wave shielding body according to the invention and a mounted state thereof.

A cross-section of the electromagnetic wave shielding body is shown in FIG. 4 as an example of the electromagnetic wave shielding body according to the invention and a mounted state thereof. In FIG. 4, a reference numeral 00 denotes a display area, a reference numeral 10 denotes a transparent electrically conductive layer (D), a reference numeral 21 denotes a polymer film (B) containing a dye, a reference numeral 22 denotes a hard coat layer (F), a reference numeral 30 denotes a transparent adhesive layer (C), a reference numeral 70 denotes an anti-glare layer (a functional transparent layer (E) having an anti-glare property and a hard coat property), and a reference numeral 80 denotes an electrically conductive copper foil adhesive tape.

Example 3

In the same manner as in Example 1, a laminate comprising a polymer film (B)/a transparent electrically conductive layer (D) was prepared.

Further, on a major surface of the PET film/transparent electrically conductive layer wound in roll form, opposite to a PET film thereof, a next functional transparent layer 1 was continuously formed as a functional transparent layer (A) by a roll-to-roll method. Namely, a coating liquid in which a photopolymerization initiator was added to a multi-functional methacrylate resin and, further, ITO fine particles (average particle diameter: 10 nm) were added thereto was applied by a gravure coater and, then, cured by an ultraviolet ray to form an electrically conductive hard coat film (film thickness: 3 $\mu$m) and, then, a fluorine-containing organic compound solution was coated on the thus-formed hard coat film by a micro gravure coater and dry-cured at 90° C. to form an anti-reflection film (film thickness: 100 nm) having a refractive index of 1.4 thereby forming a functional transparent layer (A) having a hard coat property (pencil hardness in accordance with JIS K5400: 2H), an anti-reflection property (Rvis of surface: 0.9%), an antistatic property (surface resistance: 7×10$^9$ $\Omega$/square), and an anti-fouling property. The a functional transparent layer (A)/a polymer film (B)/a transparent electrically conductive layer (D) in roll form was cut into a size of 970 mm×570 mm and fixed on a supporting plate made of glass such that the transparent electrically conductive layer (B) comes to the top. An organic dye was disperse-dissolved in a solvent of ethyl acetate/toluene (50:50 wt %) to prepare a diluting liquid for an acrylic adhesive. The acrylic adhesive/the diluting liquid containing a dye (80:20 wt %) were mixed and the resultant mixture was applied on the transparent electrically conductive layer (D) except for 22 mm wide of a peripheral portion thereof with a film thickness of 25 μm on a dry basis by a batch type die coater and, then, dried to form an adhesive 1 as the transparent adhesive layer (C). Further, a refractive index of the adhesive 1 was 1.51 and an extinction coefficient was 0.

As organic dyes, a dye PD-319 manufactured by Mitsui Chemicals, Inc. having an absorption maximum in a wavelength of 595 nm for absorbing an unnecessary luminescence irradiated from a plasma display and a red color dye PS-Red-G manufactured by Mitsui Chemicals, Inc. for correcting chromaticity of white color luminescence were used to adjust the acrylic adhesive/the dye-containing diluting liquid such that these dyes are contained in a dried adhesive 1 in amounts of 1150 (wt) ppm and 1050 (wt) ppm, respectively. Further, PD-319 is a tetra-t-butyl-tetraazaporphyrin/vanadyl complex expressed by the following formula (3):

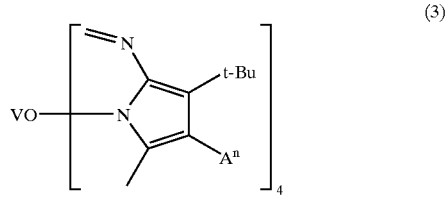

Further, a two-component type room temperature setting adhesive (3381; manufactured by Three Bond Co., Ltd.) was printed to an area of 22 mm wide of a peripheral portion of the transparent electrically conductive layer (D) by using a metal mask such that an exposed electrically conducting portion of the transparent electrically conductive layer (D) is covered and, then, dried to form an electrically conductive adhesive layer having a thickness of 25 μm.

After the thus-formed electrically conductive adhesive layer was removed from a supporting body, a mold releasing film was laminated to each of the transparent adhesive layer (C) and electrically conductive adhesive surfaces to prepare an electromagnetic wave shielding body according to the invention having a mold releasing film on one surface thereof.

Further, after being deprived of the mold releasing film, the electromagnetic wave shielding body was bonded to a front surface (representation portion: 920 mm×520 mm) of a plasma display panel by using a sheet fed laminator. On this occasion, bonding operations of the transparent adhesive layer (C) portion and the electrically conductive adhesive layer were performed such that they were in registry with at least the representation portion and at least a ground portion, respectively. After such bonding operations, the resultant plasma display panel was subjected to an autoclave treatment under heat and pressure conditions of 60° C. and 2×10$^5$ Pa to obtain a display apparatus comprising the electromagnetic wave shielding body according to the invention.

Figure 5:
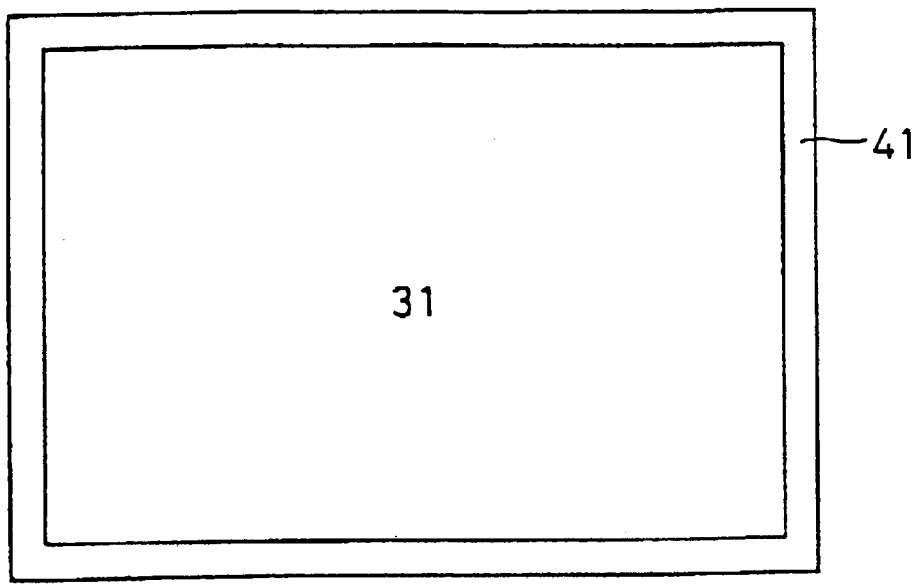
FIG. 5 is a plan view of an example of an electromagnetic wave shielding body according to the invention.

A plane as viewed from a side of a transparent adhesive layer of the electromagnetic wave shielding body is shown in FIG. 5 as a plan view showing an example of the electromagnetic wave shielding body according to the invention. In FIG. 5, a reference numeral 31 denotes a transparent adhesive layer (C) containing a dye and a reference numeral 41 denotes an electrically conductive adhesive layer.

Figure 6:
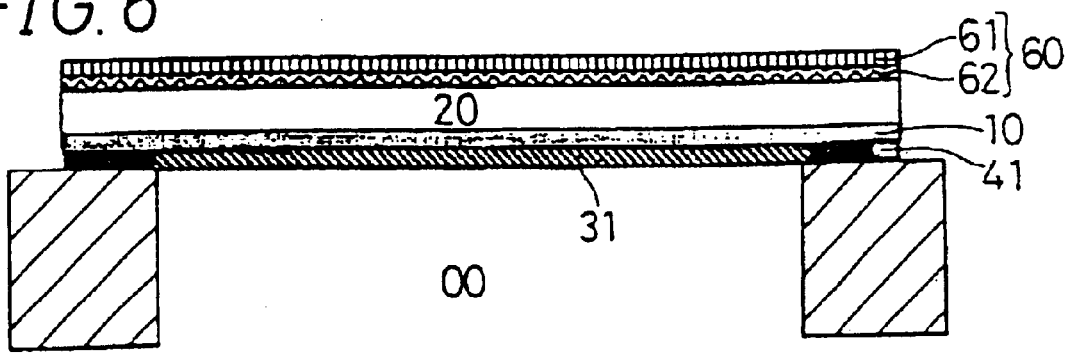
FIG. 6 is a cross-sectional view of an example (Example 3) of an electromagnetic wave shielding body according to the invention and a mounted state thereof.

A cross-section of the electromagnetic wave shielding body is shown in FIG. 6 as a cross-sectional diagram showing an example of the electromagnetic wave shielding body according to the invention and a mounted state thereof. In FIG. 6, a reference numeral 00 denotes a display area, a reference numeral 10 denotes a transparent electrically conductive layer (D), a reference numeral 20 denotes a polymer film (B), a reference numeral 31 denotes a transparent adhesive layer (C) containing a dye, a reference numeral 41 denotes an electrically conductive adhesive layer, a reference numeral 60 denotes a functional transparent layer (A) having an anti-reflection property, a hard coat property, an antistatic property and an anti-fouling property, a reference numeral 61 denotes an anti-reflection film having an anti-fouling property, and a reference numeral 62 denotes a hard coat film having an antistatic property.

Example 4

A polymer film (B) was prepared in the same manner as in Example 3.

Polyethylene terephthalate pellets 1203 (manufactured by Unitika, Ltd.) were mixed with 0.01% by weight of a red color dye PS-Red-G manufactured by Mitsui Chemicals, Inc. for correcting chromaticity of white color luminescence and 0.015% by weight of a violet color dye PS-Violet-RC manufactured by Mitsui Chemicals, Inc., melted at a temperature of from 260° C. to 280° C. and extruded to form a film having a thickness of 200 μm. Thereafter, this film was biaxially stretched to prepare a PET film which contains a dye and is a polymer film (B) containing a dye and having a thickness of 100 μm.

On one major surface of the PET film, a transparent electrically conductive layer (D) comprising 5 layers in total made up of an SnO$_2$ thin film (film thickness: 40 nm), a silver thin film (film thickness: 9 nm), an SnO$_2$ thin film (film thickness: 80 nm), a silver-palladium alloy thin film (film thickness: 11 nm), and an SnO$_2$ thin film (film thickness: 40 nm) in this order and having a surface resistance of 5.3 Ω/square is formed to prepare a transparent laminate 2 comprising a PET film containing a dye/a transparent electrically conductive layer (D) by a roll-to-roll method.

Further, on a major surface of the PET film/the transparent electrically conductive layer wound in roll form, opposite to the PET film thereof, a next functional transparent film 2 was continuously formed as a functional transparent layer (A) by a roll-to-roll method. A coating liquid in which a photopolymerization initiator was added to a multi-functional methacrylate resin and, further, organic silica fine particles (average particle diameter: 15 μm) were dispersed therein was prepared, applied and, then, cured by an ultraviolet ray to form an anti-glare layer as a functional transparent layer (A) having an anti-glare property (haze value measured by a haze meter: 5%), a hard coat property (pencil hardness: 2H).

The functional transparent layer (A)/a polymer film (B)/a transparent electrically conductive layer (D) in roll form was cut into a size of 970 mm×570 mm and fixed on a supporting plate made of glass such that the transparent electrically conductive layer (D) comes to the top.

An adhesive 2 comprising same raw materials as in the adhesive 1 in Example 1 except that a dye was not contained was formed on a mold releasing film surface in a thickness of 25 μm. The adhesive 2/the mold releasing film was laminated on the transparent electrically conductive layer while leaving 20 mm wide of a peripheral portion thereof unlaminated by using a frame-bonding laminator such that a surface of the adhesive 2 is a surface to be bonded. Further, after the mold releasing film was removed from one side thereof, an electrically conductive double-faced adhesive tape (WMFT791; manufactured by Teraoka Seisakusho Co., Ltd.) was bonded to an area of 20 mm wide of the peripheral portion thereof such that an exposed electrically conducting portion of the transparent electrically conductive layer (D) was covered.

By being removed from the supporting body, the electromagnetic wave shielding body according to the invention having a mold releasing film on one side thereof was prepared. Further, the electromagnetic wave shielding body was deprived of the mold releasing film and, then, bonded to a front surface (representation portion: 920 mm×520 mm) of a plasma display panel by a sheet fed laminator. On this occasion, bonding operations of the transparent adhesive layer (C) portion and the electrically conductive adhesive layer were performed such that they were in registry with at least the representation portion and at least a ground portion, respectively. After such bonding operations, the resultant plasma display panel was subjected to an autoclave treatment under heat and pressure conditions of 60° C. and $2 \times 10^5$ Pa to obtain a display apparatus comprising the electromagnetic wave shielding body according to the invention.

Figure 7:
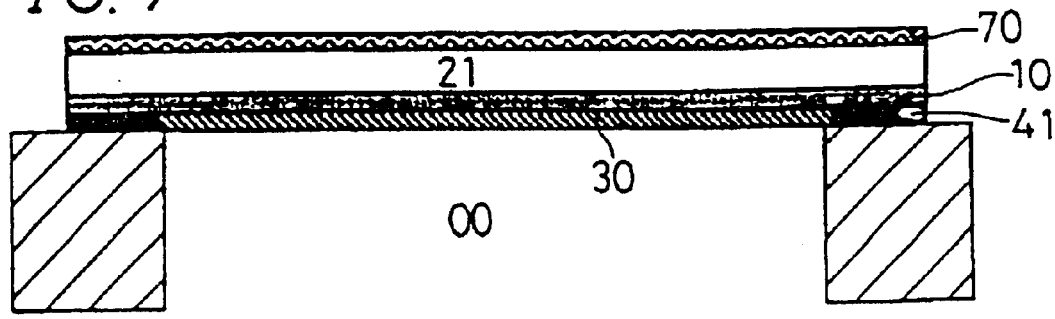
FIG. 7 is a cross-sectional view of an example (Example 4) of an electromagnetic wave shielding body according to the invention and a mounted state thereof.

A cross-section of the electromagnetic wave shielding body is shown in FIG. 7 as a cross-sectional diagram showing an example of the electromagnetic wave shielding body according to the invention and a mounted state thereof. In FIG. 7, a reference numeral 00 denotes a display area, a reference numeral 10 denotes a transparent electrically conductive layer (D), a reference numeral 21 denotes a polymer film (B) containing a dye, a reference numeral 30 denotes a transparent adhesive layer (C), a reference numeral 41 denotes an electrically conductive adhesive layer, and a reference numeral 70 denotes an anti-glare layer (a functional transparent layer (E) having an anti-glare property and a hard coat property).

Comparative Example 1

On a major surface of a PET film (thickness: 188 μm) as a polymer film (B), a transparent electrically conductive layer having a surface resistance of 15 Ω/square and comprising an ITO thin film (film thickness: 400 nm) is formed to prepare a transparent laminate 3. By using the transparent laminate 3, an electromagnetic wave shielding body is prepared in the same manner as in Example 1 except that a dye is not used to obtain a display apparatus comprising the thus-prepared electromagnetic wave shielding body.

The thus-obtained plasma displays which are display apparatuss each comprising the electromagnetic wave shielding body according to invention in Examples 1 to 4 were evaluated according to procedures described below.

1) Transmittance of Electromagnetic Wave Shielding Body

By using a CRT color analyzer (CA100) manufactured by Minolta Co., Ltd., spectral radiance of a plasma display in each case of before and after an electromagnetic wave shielding body was formed therein was determined; a ratio of radiance after the electromagnetic wave shielding body was formed therein against radiance before the electromagnetic wave shielding body was formed therein was shown in percentage.

2) Contrast Ratio of Plasma Display in Bright Place (Ratio Between Highest Luminance and Lowest Luminance)

An evaluation was conducted in each case of before and after an electromagnetic wave shielding body was formed. At a bright time of about 100 lx of an environmental luminance, with regard to a plasma display panel, a maximum luminance ($cd/m^2$) at a time of white color display and a minimum luminance ($cd/m^2$) at a time of black color display were measured by using a luminance meter (LS-110) manufactured by Minolta Co., Ltd. to determine a ratio (maximum luminance/minimum luminance) therebetween.

3) Colorimetric Purity of Luminescent Color of Plasma Display

An evaluation was conducted in each case of before and after an electromagnetic wave shielding body was formed. Measurements were conducted in both cases in which a display filter was not mounted to the plasma display and the display filter in Examples 1 and 2 was mounted thereto.

In a white color (W) display, a red color (R) display, a green color (G) display, and a blue color (B) display, RGB chromaticity (x, y), white color chromaticity, a white color temperature and a white color deviation from a black body locus were measured by using a CRT color analyzer (CA100) manufactured by Minolta Co., Ltd.

It is preferable that three primary colors of PDP luminescence comes as near as possible to a color reproduction gamut of RGB colors defined by an NTSC system. Further, it is shown that, as a ratio in percentage of an area of a triangle formed by connecting three primary colors of the PDP luminescence in an x-y chromaticity diagram against an area of the color reproduction gamut of NTSC comes nearer to 100%, the color reproduction gamut becomes larger.

4) Electromagnetic Wave Shielding Capacity

With regard to a plasma display in which an electromagnetic wave shielding body is not formed and plasma displays shown in Examples 1 to 4 and Comparative Example 1 in each of which an electromagnetic wave shielding body is disposed, measurements described below were conducted.

A dipole antenna was placed at a position 10 m away from a center of a representation portion in a perpendicular direction. Then, using a spectrum analyzer (TP4172) manufactured by Advantest Corporation, a radiation field intensity in a frequency band of from 30 MHz to 230 MHz was measured. According to a 3-m method of the VCCI, allowable values in this frequency band are 50 dBμV/m or less in Class A and 40 dBμV/m or less in Class B. Evaluation was conducted in 33 MHz and 90 MHz.

5) Near-infrared Ray Transmittance of Electromagnetic Wave Shielding Body

Evaluation was conducted on electromagnetic wave shielding bodies in Examples 1 to 4 and Comparative Example 1.

A small piece was cut out of a translucent portion of each of the electromagnetic wave shielding bodies, and parallel light ray transmittance thereof in a wavelength region of from 800 to 1,000 nm was measured by using a spectrophotometer (U-3400) manufactured by Hitachi, Ltd. Respective transmittance in wavelengths of 820 nm, 850 nm and 950 nm were evaluated.

6) Near-infrared Ray Cutting-off Capacity

With regard to a plasma display in which an electromagnetic wave shielding body is not formed and plasma displays shown in Examples 1 and 2 and Comparative Example 1 in each of which an electromagnetic wave shielding body is disposed, measurements described below were conducted.

A domestic-use VTR as an electronic apparatus using an infrared remote controller was placed from 0.2 m to 5 m away from the plasma display and examined for malfunction thereof. When the malfunction was observed, a critical distance for the malfunction was measured. From a practical point of view, it is at least 3 m or less, and preferably 1.5 m or less.

In the electromagnetic wave shielding body according to the invention in Example 1, transmittance of light emitted from the plasma display is 50% in terms of visible light ray transmittance, and, due to an employment of a dye having an absorption maximum in a wavelength of 595 nm in which an unwanted luminescence exists, a percentage of transmittance in a wavelength of 595 nm against transmittance in a wavelength of 610 nm in which a necessary luminescence exists was 38%. Further, in the plasma display comprising such a electromagnetic wave shielding body, due to an employment of the electromagnetic wave shielding body in which a functional transparent layer (A) having an anti-reflection property was formed, reflection on a display surface was suppressed and, due to transmission characteristics of the electromagnetic wave shielding body, contrast ratio in a bright place under a condition of an environmental luminance of 100 lx was enhanced to be 45 compared with 20 before the electromagnetic wave shielding body was formed therein. Further, since a mirror phenomenon scarcely occurred, a plasma display having a favorable visibility was obtained.

In the electromagnetic wave shielding body according to the invention in Example 2, transmittance of light emitted from the plasma display was 58% in terms of visible light ray transmittance and a mirror phenomenon scarcely occurred whereupon a plasma display having a favorable visibility was obtained. Contrast ratio in a bright place was improved from 20 into 37.

In the electromagnetic wave shielding body according to the invention in Example 3, transmittance of light emitted from the plasma display was 58% in terms of visible light ray transmittance and a mirror phenomenon scarcely occurred whereupon a plasma display having a favorable visibility was obtained. Contrast ratio in a bright place was improved from 20 into 37.

In the electromagnetic wave shielding body according to the invention in Example 4, transmittance of light emitted from the plasma display was 59% in terms of visible light ray transmittance and a mirror phenomenon scarcely occurred whereupon a plasma display having a favorable visibility was obtained. Contrast ratio in a bright place was improved from 20 into 37.

Figure 8:
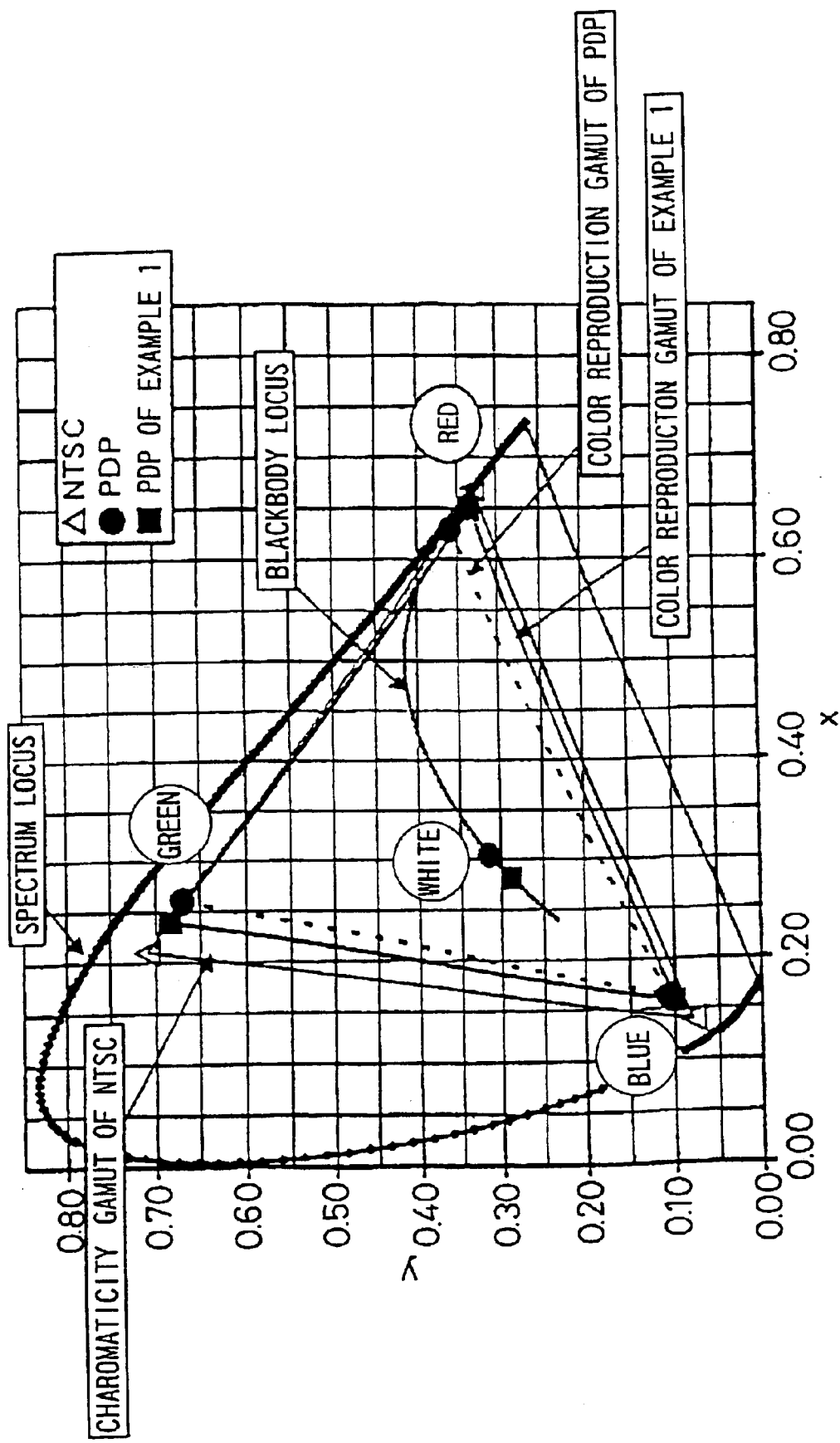
FIG. 8 is an x-y chromaticity diagram showing a color reproduction gamut in each case of before and after an electromagnetic wave shielding body is formed.

In FIG. 8, an x-y chromaticity diagram showing color reproduction gamut in each case of before and after the electromagnetic wave shielding body was formed was shown. In FIG. 8, chromaticity of each luminescence of white color (W), red color (R), green color (G), and blue color (B) before and after the electromagnetic wave shielding body according to the invention in Example 1 was formed on the PDP (plasma display panel) was plotted in the x-y chromaticity diagram. Concurrently, chromaticity of NTSC to be targeted was also plotted.

White color can be evaluated by comparing a position thereof with a black body locus which is a locus of a favorable white color chromaticity.

It has been found that, when the electromagnetic wave shielding body according to the invention was employed, chromaticity deviation of white color was small and, further, a color temperature was in a higher position than that before the electromagnetic wave shielding body in Example 1 was formed. On this occasion, the color temperature was elevated from about 7000 K to about 10000 K.

Further, a triangle formed by connecting points of RGB was shown in FIG. 8. It can be said to be preferable to allow the triangle to come as near as possible to that of NTSC. It has been found that, by using the electromagnetic wave shielding body in Example 1, chromaticity of each of red color and green color came near to that indicated by NTSC whereupon a triangle showing a color reproduction gamut became larger. When a percentage of an area of the triangle indicated by NTSC against an area of the triangle was obtained, the percentage was improved to be 85% by forming the electromagnetic wave shielding body in Example 1 whereas the percentage was 74% before the electromagnetic wave shielding body in Example 1 was formed.

Results of the evaluations 4) to 6) are summarized and shown in Table 1.

TABLE 1

| Electromagnetic wave shielding body | | None | Example 1 | Example 2 | Example 3 | Example 4 | Comparative Example 1 |
|---|---|---|---|---|---|---|---|
| Surface resistance of transparent electrically conductive layer Ω/square | | — | 2.2 | 5.3 | 2.2 | 5.3 | 15 |
| Radiation field intensity dBμ/m | 33 MHz | 59 | 38 | 46 | 39 | 46 | 52 |
|  | 90 MHz | 52 | 34 | 42 | 33 | 40 | 49 |
| Near-infrared transmittance % | 820 nm | — | 9.8 | 24 | 10 | 25 | 79 |
|  | 850 nm | — | 6.3 | 19 | 6.5 | 18 | 78 |
|  | 950 nm | — | 2.1 | 9 | 2.0 | 8.5 | 70 |
| Critical distance of malfunction m | | 5 or more | 0.5 | 3.0 | 0.5 | 3.0 | 5 or more |

From Table 1, by using the electromagnetic wave shielding body according to the invention, it can be seen that Class B or Class A of VCCI specifications is satisfied. As the surface resistance of the transparent electrically conductive layer was lower, the electromagnetic wave shielding capacity was superior.

Further, by using the electromagnetic wave shielding body according to the invention, it can be seen that the near-infrared cutting-off capacity was superior. The electromagnetic wave shielding body according to the invention using a transparent electrically conductive layer in which a metallic thin film and a high-refractive-index transparent thin film are laminated alternately had low of a near-infrared ray transmittance, was excellent in near-infrared cutting-off capacity whereupon, as a surface resistance of the transparent electrically conductive layer is lower, the near-infrared cutting-off capacity was excellent. Furthermore, by allowing the functional transparent layer (D) to have various types of functions, the electromagnetic wave shielding body according to the invention is excellent in environmental resistance and/or scratch resistance and/or an anti-fouling property and/or an antistatic property.

Example 5

On one major surface of a triacetyl cellulose (TAC) film (thickness: 80 μm) which is used as a polymer film (B), a next functional transparent film 1 as described below which is used as a functional transparent layer (A) was continuously formed by a roll-to-roll method. Namely, firstly a multi-functional methacrylate resin was added with a photopolymerization initiator and, then, coated with a coating liquid in which ITO fine particles (average particle diameter: 10 nm) were dispersed by means of a gravure coater and cured by an ultraviolet ray to form an electric conductive hard coat film (film thickness: 3 μm) and, thereafter, a fluorine-containing organic compound solution was applied on the thus-formed electric conductive hard coat film by means of a micro gravure coater and heat-cured at 90° C. to form an anti-reflection film (film thickness: 100 nm) having a refractive index of 1.4 thereby forming the functional transparent film 1 having a hard coat property (pencil hardness in accordance with JIS K5400: 2H), an anti-reflection property (Rvis of surface:0.9%), an antistatic property (surface resistance: 7×10⁹ Ω/square) and an anti-fouling property.

An organic dye was disperse-dissolved in an ethyl acetate/toluene (50:50 wt %) solvent to prepare a diluting liquid for an acrylic adhesive. The acrylic adhesive and the resultant dye-containing diluting liquid (80:20 wt %) were mixed and, then, the resultant mixture was applied in a thickness of 25 μm on a dry basis on a surface of a TAC film of an functional transparent film 1/a TAC film by means of a comma coater to form an adhesive 1 as a transparent adhesive layer (C). The mold releasing film was laminated to a surface of the transparent adhesive layer, and then, the resultant transparent adhesive layer was wound in roll form to obtain the light control film according to the invention in roll form having a mold releasing film on the surface of the transparent adhesive layer.

As an organic dye, a dye PD-319 manufactured by Mitsui Chemicals, Inc. having an absorption maximum in a wavelength of 595 nm for absorbing an unnecessary luminescence emitted from a plasma display and a red color dye PS-Red-G manufactured by Mitsui Chemicals, Inc. for correcting chromaticity of white color luminescence were used to adjust the acrylic adhesive/the dye-containing diluting liquid such that these dyes were contained in the dried adhesive 1 in amounts of 1650 (wt)ppm and 450 (wt)ppm, respectively. Further, PD-319 is a tetra-t-butyl-tetraazaporphyrin/vanadyl complex expressed by the following formula (3):

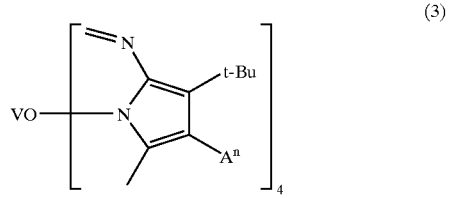

Further, the light control film was cut into sheet form and, then, the mold releasing film was removed therefrom and, thereafter, the resultant light control film was bonded to a front surface of a plasma display panel (representation portion: 920 mm×520 mm) by using a sheet fed laminator. On this occasion, such sheet cutting and registry of a position to be bonded were conducted such that the transparent adhesive layer (C) portion was allowed to be bonded to at least an entire representation portion. After such a bonding operation has been conducted, the resultant plasma display panel bonded with the light controlling sheet was subjected to an autoclave treatment under pressure and heating conditions of 2×10⁵ Pa and 60° C. to obtain a display apparatus comprising the light control film according to the invention.

Figure 9:
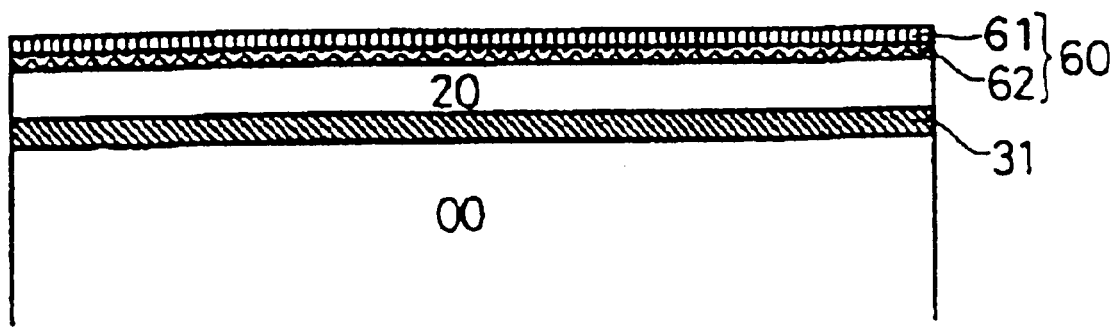
FIG. 9 is a cross-sectional view of an example (Example 5) of a light control film according to the invention and a mounted state thereof.

A cross-section of the light control film was shown in FIG. 9 as a cross-sectional diagram showing an example of the light control film according to the invention and a mounted state thereof. In FIG. 9, a reference numeral 00 denotes a display area, a reference numeral 20 denotes a polymer film (B), a reference numeral 31 denotes a transparent adhesive layer (C) containing a dye, a reference numeral 60 denotes a functional transparent layer (A) having an anti-reflection property, a hard coat property, an antistatic property, an anti-fouling property, a reference numeral 61 denotes an anti-reflection film having an anti-fouling property, and a reference numeral 62 denotes a hard coat film having an antistatic property.

Example 6

Polyethylene terephthalate (PET) pellets 1203 (manufactured by Unitika, Ltd.) were mixed with 0.018% by weight of a dye PD-319 manufactured by Mitsui Chemicals, Inc. expressed by the formula (3), 0.018% by weight of a dye PD-311 manufactured by Mitsui Chemicals, Inc. having an absorption maximum in a wavelength of 585 nm, and 0.004% by weight of a red dye PS-Red-G manufactured by Mitsui Chemicals, Inc. for correcting chromaticity of white color luminescence, melted at a temperature of from 260° C. to 280° C. and extruded to form a film having a thickness of 250 μm. Thereafter, this film was biaxially stretched to prepare a PET film containing a dye, which is a polymer film (B) containing a dye, having a thickness of 125 μm.

Further, PD-311 is a tetra-t-butyl-tetraazaporphyrin/copper complex expressed by the following formula (4):

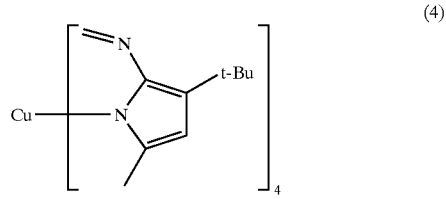

(4)

Further, on a major surface of the PET film wound in roll form, a next functional transparent film 2 was continuously formed as a functional transparent layer (A) by a roll-to-roll method. Namely, a coating liquid which had been prepared by adding a photopolymerization initiator to a multi-functional methacrylate resin and, further, dispersing organic silica fine particles (average particle diameter: 15 $\mu$m) therein was applied and, then, cured by an ultraviolet ray to form a functional transparent film 2, which is an anti-glare layer, having an anti-glare property (haze value measured by a haze meter: 5%), a hard coat property (pencil hardness: 2H). An adhesive 2 comprising same raw materials as in the adhesive 1 in Example 1 except that a dye was not contained was formed on a surface of the PET film of the functional transparent film 2/the dye-containing PET film. The mold releasing film was laminated on a surface of the transparent adhesive layer and, then, the resultant transparent adhesive layer was wound in roll form to obtain the light control film according to the invention in roll form having a mold releasing film on the surface of the transparent adhesive layer thereof.

Further, the light control film was cut into sheet form and, then, the mold releasing film was removed therefrom and, thereafter, the resultant light control film was bonded to a front surface of a plasma display panel (representation portion: 920 mm×520 mm) by using a sheet fed laminator. On this occasion, such sheet cutting and registry of a position to be bonded were conducted such that the transparent adhesive layer (C) portion was allowed to be bonded to at least an entire representation portion. After such a bonding operation has been conducted, the resultant plasma display panel bonded with the light controlling sheet was subjected to an autoclave treatment under pressure and heating conditions of $2 \times 10^5$ Pa and 60° C. to obtain a display apparatus comprising the light control film according to the invention.

Figure 10:
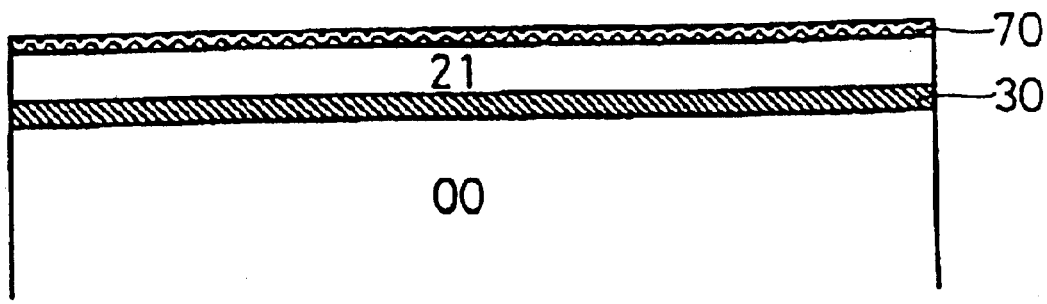
FIG. 10 is a cross-sectional view of an example (Example 6) of a light control film according to the invention and a mounted state thereof.

A cross-section of the light control film was shown in FIG. 10 as a cross-sectional diagram showing an example of the light control film according to the invention and a mounted state thereof. In FIG. 10, a reference numeral 00 denotes a display area, a reference numeral 21 denotes a transparent adhesive layer (C) containing a dye, a reference numeral 30 denotes a transparent adhesive layer (C), a reference numeral 70 denotes an anti-glare layer (a functional transparent layer (A) having an anti-glare property, and a hard coat property).

The thus-obtained plasma displays which are display apparatuses each comprising the light control film according to the invention in Examples 5 and 6, as well as the plasma display before the light control film was formed thereon, were evaluated according to procedures described below.

1) Transmittance of Light Control Film

By using a CRT color analyzer (CA100) manufactured by Minolta Co., Ltd., spectral radiance of a plasma display in each case of before and after a light control film was formed therein was determined; a ratio of radiance after the light control film was formed therein against radiance before the light control film was formed therein was shown in percentage.

2) Contrast Ratio of Plasma Display in Bright Place (Ratio Between Highest Luminance and Lowest Luminance)

An evaluation was conducted in each case of before and after a light control film was formed. At a bright time of about 100 lx of an environmental luminance, a maximum luminance ($cd/m^2$) at a time of white color display and a minimum luminance ($cd/m^2$) at a time of black color display of a plasma display panel were measured by using a luminance meter (LS-110) manufactured by Minolta Co., Ltd. to determine a ratio (maximum luminance/minimum luminance) therebetween.

3) Colorimetric Purity of Luminescent Color of Plasma Display

An evaluation was conducted in each case of before and after a light control film was formed.

In a white color (W) display, a red color (R) display, a green color (G) display, and a blue color (B) display, RGB chromaticity (x, y), white color chromaticity, a white color temperature and a white color deviation from a black body locus were measured by using a CRT color analyzer (CA100) manufactured by Minolta Co., Ltd.

It is preferable that three primary colors of PDP luminescence comes as near as possible to a color reproduction gamut of RGB colors defined by an NTSC system. Further, it is shown that, as a ratio in percentage of an area of a triangle formed by connecting three primary colors of the PDP luminescence in an x-y chromaticity diagram against an area of the color reproduction gamut of NTSC comes nearer to 100%, the color reproduction gamut becomes larger.

In the light control film according to the invention in Example 5, transmittance of light emitted from the plasma display is 69% in terms of visible light ray transmittance, and, due to an employment of a dye having an absorption maximum in a wavelength of 595 nm in which an unwanted luminescence exists, a percentage of transmittance in a wavelength of 595 nm against transmittance in a wavelength of 610 nm in which a necessary luminescence exists was 21%. Further, in the plasma display comprising such a light control film, due to an employment of the light control film in which a functional transparent layer (A) having an anti-reflection property was formed, reflection on a display surface was suppressed and, due to transmission characteristics of the light control film, contrast ratio in a bright place under a condition of an environmental luminance of 100 lx was enhanced to be 41 compared with 20 before the light control film was formed therein. Further, since luminance was not substantially impaired and a mirror phenomenon scarcely occurred, a plasma display having a favorable visibility was obtained. Moreover, color purity of red color luminescence and green color luminescence was remarkably improved. Such an improvement of the green color luminescence is due to a fact that yellowish green color luminescence by a dye having an absorption wavelength of 595 nm has been decreased.

In the same manner as above, in the light control film according to the invention in Example 6, transmittance of light emitted from the plasma display is 70% in terms of visible light ray transmittance, and, due to an employment of a dye having an absorption maximum in a wavelength of 585 nm in which an unwanted luminescence exists in the same manner as in the dye having an absorption maximum in a wavelength of 595 nm in which an unwanted luminescence exists, a percentage of transmittance in a wavelength of 595 nm against transmittance in a wavelength of 610 nm in which a necessary luminescence exists was 30%. Further, in the plasma display comprising such a light control film, due to transmission characteristics of the light control film, contrast ratio in a bright place under a condition of an environmental luminance of 100 lx was enhanced to be 37 compared with 20 before the light control film was formed therein. Further, since luminance was not substantially impaired and a mirror phenomenon scarcely occurred, a plasma display having a favorable visibility was obtained. Moreover, color purity of red color luminescence and green color luminescence was remarkably improved. Such an improvement of the green color luminescence is due to a fact that yellowish green color luminescence by dyes having absorption wavelengths of 595 nm and 585 nm has been decreased. Particularly, by using the dye having an absorption wavelength of 585 nm for absorbing short wavelength, such an effect as described above was conspicuous.

Figure 11:
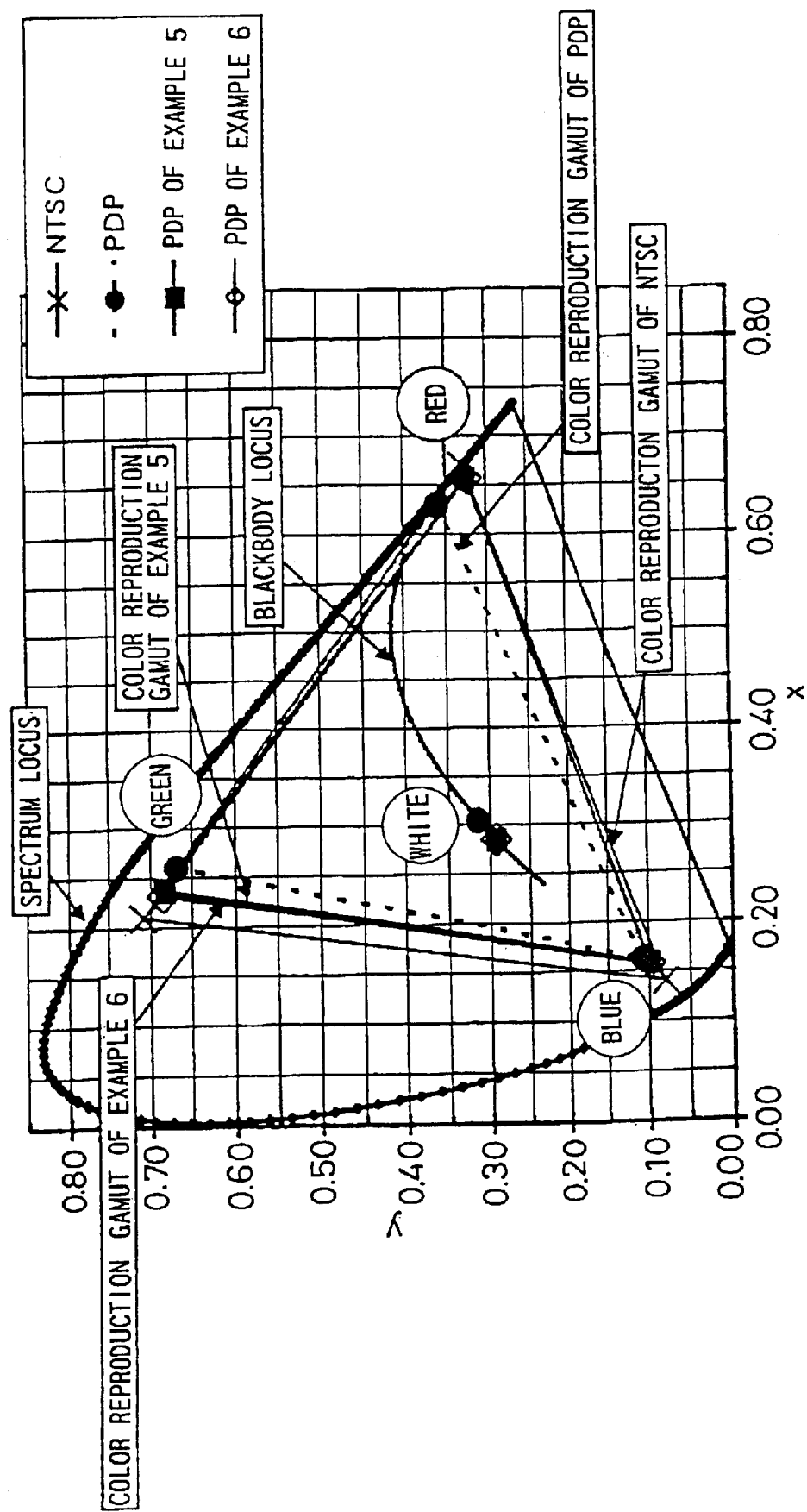
FIG. 11 is an x-y chromaticity diagram showing a color reproduction gamut in each case of before and after a light control film is formed.

In FIG. 11, an x-y chromaticity diagram showing color reproduction gamut in each case of before and after the light control film according to the invention was formed was shown.

In FIG. 11, chromaticity of each luminescence of white color (W), red color (R), green color (G), and blue color (B) was plotted in the x-y chromaticity diagram in each case of before and after the light control film in Example 5 was formed on the PDP (plasma display panel). Concurrently, chromaticity of NTSC to be targeted was also plotted.

White color can be evaluated by comparing a position thereof with a black body locus which is a locus of a favorable white color chromaticity.

It has been found that, when the electromagnetic wave shielding body according to the invention was employed, chromaticity deviation of white color was small and, further, a color temperature was in a higher position than that before the light control film in Example 5 or Example 6 was formed. On this occasion, the color temperature was elevated from about 7000 K to about 9500 K and a white color deviation showing a deviance from the black body locus was approximately 0.

Further, a triangle formed by connecting points of RGB was shown in FIG. 11. It can be said to be preferable to allow the triangle to come as near as possible to that of NTSC. It has been found that, by using the light control film in Example 5 or Example 6, chromaticity of each of red color and green color came near to that indicated by NTSC whereupon a triangle showing a color reproduction gamut became larger. When a percentage of an area of the triangle indicated by NTSC against an area of the triangle was obtained, the percentage was improved to be 86% by forming the light control film in Example 5 whereas the percentage was 74% before the light control film in Example 5 was formed. Further, the percentage was improved to be 88% in the case of forming the light control film in Example 6.

Furthermore, by allowing the functional transparent layer (A) to have various types of functions, the light control film according to the invention is excellent in scratch resistance and/or an anti-fouling property and/or an antistatic property.

Example 7

Polyethylene terephthalate pellets 1203 (manufactured by Unitika, Ltd.) were mixed with 0.15% by weight of each of near-infrared absorbing dyes SIR-128 and SIR-130 manufactured by Mitsui Chemicals Inc., melted at about 280° C., extruded and biaxially stretched to prepare a near-infrared shielding film (B) having a thickness of 150 μm. Further, as allowing a solvent of ethyl acetate/toluene (50:50 wt %) to be a diluting liquid, an acrylic adhesive and the diluting liquid were mixed with each other at a mixing ratio of 80:20 and, then, the resultant mixture was applied on a surface of the near-infrared shielding film with a film thickness of 25 μm on a dry basis by means of a comma coater and dried to form an adhesive layer on which a mold releasing film was thereafter laminated.

On the resultant near-infrared shielding film (B), an anti-reflection film comprising a base film having the thickness of 188 μm (under the trade name of "ReaLook 1200"; manufactured by NOF Corporation) was laminated and, then, the resultant laminate was cut to a size of 960 mm long×550 mm wide to obtain an optical filter film comprising a transparent polymer film having a total thickness of 0.338 mm.

Thus-obtained film was bonded to a semi-tempered glass plate having a size of 980 long×580 mm wide×2.5 mm thick.

Example 8

Polyethylene terephthalate pellets 1203 (manufactured by Unitika, Ltd.) were mixed with 0.3% by weight of each of near-infrared absorbing dyes SIR-128 and SIR-130 manufactured by Mitsui Chemicals Inc., melted at about 280° C., extruded and biaxially stretched to prepare a near-infrared shielding film having a thickness of 75 μm. Further, as allowing a solvent of ethyl acetate/toluene (50:50 wt %) to be a diluting liquid, an acrylic adhesive and the diluting liquid were mixed with each other at a mixing ratio of 80:20 and, then, the resultant mixture was applied on a surface of the near-infrared shielding film in a film thickness of 25 μm on a dry basis by means of a comma coater and dried to form an adhesive layer on which a mold releasing film was thereafter laminated.

By using a similar method to that described above, a transparent polymer film for increasing a total thickness having a thickness of 200 μm was prepared without adding a near-infrared absorbing dye.

On the resultant near-infrared shielding film, an ant-reflection film (under the trade name of "ReaLook 2200"; manufactured by NOF Corporation) comprising a base film having a thickness of 80 μm was laminated and, then, the resultant laminate was cut to a size of 960 mm long×550 mm wide and bonded to the transparent polymer film for increasing a total thickness having a thickness of 200 μm thereby obtaining an optical filter film comprising a transparent polymer film having a total thickness of 0.355 mm. This optical filter film was bonded to a semi-tempered glass plate having a size of 980 long×580 mm wide×2.5 mm thick.

Example 9

On a major surface of the near-infrared shielding film having a thickness of 150 μm as shown in Example 7, a next functional transparent film was continuously formed as a functional transparent layer (A) by a roll-to-roll method. Namely, a coating liquid which had been prepared by adding a photopolymerization initiator to a multi-functional methacrylate resin and, further, dispersing organic silica fine particles (average particle diameter: 15 μm) therein was applied and, then, cured by an ultraviolet ray to form a functional transparent layer which has anti-glare capacity having an anti-glare property (haze value measured by a haze meter: 5%), a hard coat property (pencil hardness: 2H).

The transparent polymer film for increasing a total thickness having a thickness of 200 μm as shown in Example 14 was laminated to a transparent polymer film having such a near-infrared shielding function and an anti-glare function and cut to a size of 960 mm long×550 mm wide to obtain an optical filter film comprising a transparent polymer film having a total thickness of 0.350 mm. Thus-obtained optical filter film was bonded to a semi-tempered glass plate having a size of 980 long×580 mm wide×2.5 mm thick.

Example 10

A polyethylene terephthalate film having a thickness of 75 μm was prepared by an extrusion and biaxially stretching operations and, then, on one major surface of the thus-prepared polyethylene terephthalate film, 5 layers made up of an $SnO_2$ thin film (film thickness: 40 nm), a silver thin film (film thickness: 9 nm), an $SnO_2$ thin film (film thickness: 80 nm), a silver-palladium alloy thin film (film thickness: 11 nm), and an $SnO_2$ thin film (film thickness: 40 nm) were formed in this order as viewed from the polyethylene terephthalate film whereupon a transparent polymer film having electromagnetic wave shielding capacity was prepared in which a transparent electrically conductive thin film layer (D) having a surface resistance of 5.3 Ω/square was contained.

An adhesive layer was formed on the electromagnetic wave shielding film by procedures described below.

An organic dye was disperse-dissolved in a solvent of ethyl acetate/toluene (50:50 wt %) to prepare a diluting liquid for an acrylic adhesive. As an organic dye, a dye PD-319 manufactured by Mitsui Chemicals, Inc. having an absorption maximum in a wavelength of 595 nm for absorbing an unnecessary luminescence emitted from a plasma display and a red color dye PS-Red-G manufactured by Mitsui Chemicals, Inc. for correcting chromaticity of white color luminescence were used to adjust the acrylic adhesive/the dye-containing diluting liquid such that these dyes were contained in the dried adhesive in amounts of 1150 (wt)ppm and 1050 (wt)ppm, respectively.

The acrylic adhesive and the resultant dye-containing diluting liquid were mixed (80:20 wt %) and, then, the resultant mixture was applied in a film thickness of 25 μm on a dry basis on a surface thereof in side of the electromagnetic wave shielding film by means of a comma coater, dried and laminated with a mold releasing film on an adhesive surface thereof to form a transparent adhesive layer thereon.

The thus-prepared film was laminated on the transparent polymer film for increasing a total thickness having a thickness of 200 μm as shown in Example 8 such that the transparent electrically conductive thin film layer comes to the top and, then, cut to a size of 960 mm long×550 mm wide.

Further, an anti-reflection film comprising a base film having a thickness of 188 μm (ReaLook 1200; manufactured by NOF Corporation) was cut to a size of 920 mm long×510 mm wide and, then, the thus-cut anti-reflection film was bonded inside the transparent electrically conductive layer such that 20 mm wide of a peripheral portion thereof was exposed. Furthermore, a silver paste (MSP-600F; manufactured by Mitsui Chemicals, Inc.) was screen-printed thereon such that an exposed electrically conducting portion of the transparent electrically conductive layer was covered in an area of 22 mm wide of the peripheral portion thereof and dried to form an electrode having a thickness of 15 μm. By this procedure, an optical filter film comprising a transparent polymer film having a total thickness of 0.463 mm was obtained. This film was bonded to a semi-tempered glass plate having a size of 980 long×580 mm wide×2.5 mm thick.

Example 11

A polyethylene terephthalate film having a thickness of 200 μm was prepared by an extrusion and biaxially stretching operations and, then, on one major surface of the thus-prepared polyethylene terephthalate film, a transparent electrically conductive thin layer (F) comprising 7 layers in total made up of an ITO thin film (40 nm thick), a silver thin film (11 nm thick), an ITO thin film (95 nm thick), a silver thin film (14 nm thick), an ITO thin film (90 nm thick), a silver thin film (12 nm thick) and an ITO thin film (40 nm thick) in this order as viewed from a side of the polyethylene terephthalate film was formed whereupon an electromagnetic wave shielding film comprising the transparent electrically conductive layer having a surface resistance of 2.2 Ω/square was prepared.

On the other major surface on which the transparent electrically conductive thin layer of the thus-prepared electromagnetic wave shielding film was not formed, a next functional transparent layer was continuously formed by means of a roll-to-roll method. Namely, a coating liquid in which a photopolymerization initiator is added to a multifunctional methacrylate resin and, further, ITO fine particles (average particle diameter: 10 nm) were dispersed thereto was coated by a gravure coater and cured by an ultraviolet ray to form an electrically conductive hard coat film (film thickness: 3 μm) and, then, a fluorine-containing organic compound solution was coated on the thus-formed hard coat film by a micro gravure coater and dry-cured at 90° C. to form an anti-reflection film (film thickness: 100 nm) having a refractive index of 1.4 whereupon a functional transparent layer having a hard coat property (pencil hardness in accordance with JIS K-5400: 2H), an anti-reflection property (Rvis of surface: 0.9%), an antistatic property (surface resistance: $7 \times 10^9$ Ω/square) and an anti-fouling property was formed.

Further, as allowing a solvent of ethyl acetate/toluene (50:50 wt %) to be a diluting liquid, an acrylic adhesive and the diluting liquid were mixed with each other at a mixing ratio of 80:20 and, then, the resultant mixture was applied on a surface of the transparent electrically conductive layer in a film thickness of 25 μm on a dry basis by means of a comma coater, dried and laminated with a mold releasing film to form a transparent adhesive layer.

Further, the electromagnetic wave shielding film having the functional transparent layer was cut to a size of 920 mm long×510 mm wide and, then, the thus-cut electromagnetic wave shielding film was bonded to an inside surface of a transparent polymer film for increasing a total thickness, which has been cut to a size of 960 mm long×550 mm wide, having a thickness of 200 μm such that 20 mm wide each of a peripheral portion thereof was left.

Furthermore, a silver paste (MSP-600F; manufactured by Mitsui Chemicals, Inc.) was screen-printed in an area of 22 mm wide of the peripheral portion thereof such that an electrically conducting portion in a direction of a thickness cross-section of the transparent electrically conductive layer was covered, and dried to form an electrode having a thickness of 15 μm. By this procedure, an optical filter film comprising a transparent polymer film having a total thickness of 0.4 mm was obtained. This optical filter film was bonded to a semi-tempered glass plate having a size of 980 long×580 mm wide×2.5 mm thick.

Comparative Example 2

The near-infrared shielding film having a thickness of 150 µm as shown in Example 9 and the anti-reflection film comprising a base film having a thickness of 80 µm were bonded to each other to obtain an optical filter film having a total film thickness of 0.230 mm. The thus-obtained optical filter film was bonded to a semi-tempered glass plate having a size of 980 long×580 mm wide×2.5 mm thick.

Comparative Example 3

The electromagnetic wave shielding film having a thickness of 75 µm as shown in Example 10 and the anti-reflection film comprising a base film having a thickness of 188 µm were bonded to each other to obtain an optical filter film having a total film thickness of 263 µm. The thus-obtained optical filter film was bonded to a semi-tempered glass plate having a size of 980 long×580 mm wide×2.5 mm thick.

On samples thus obtained by bonding respective optical filter films to respective glass plates, an enhancement of shock resistance, a peeling property, and a state of a remaining adhesive on a glass plate were examined.

In regard to a shock resistance test, a steel ball having a weight of 500 g was dropped on a film sample bonded to a glass plate from 1.5 m high and a state of damage of the substrate glass was examined. 5 sheets of samples were subjected to each test.

In regard to tests of the peeling property and paste remaining on glass, after an optical film was bonded to a glass plate and left still for one hour and, the film was peeled off the glass plate to examine a state at the time of such peeling.

Results thus obtained are shown in Table 2.

TABLE 2

| | Film total thickness (mm) | Shock resistance test | Film peeling property | Adhesive remaining on glass |
|---|---|---|---|---|
| Example 7 | 0.338 | No problem | Easy peeling | No |
| Example 8 | 0.355 | No problem | Easy peeling | No |
| Example 9 | 0.350 | No problem | Easy peeling | No |
| Example 10 | 0.463 | No problem | Easy peeling | No |
| Example 11 | 0.400 | No problem | Easy peeling | No |
| Comparative Example 2 | 0.155 | Glass partially flown to reverse surface | Difficult peeling | Yes |
| Comparative Example 3 | 0.230 | Glass partially flown to reverse surface | Difficult peeling | Yes |

As is evident from Table 2, it can be seen that shock resistance, a peeling property, and a state of paste remaining on a glass plate have been enhanced in all examples.

As described above, the invention can aim for enhancing a protection function and workability of a display panel by allowing a total thickness of a transparent polymer film constituting an optical filter film to be 0.3 mm or more and provide the optical filter film capable of being bonded directly on a front surface of a display.

Example 14

A roll of a polyethylene terephthalate film (558 mm wide, 500 m long and 75 µm thick) was prepared as a transparent polymer film (B). On one major surface thereof, a transparent electrically conductive thin film layer (D) was deposited by a DC magnetron sputtering method by means of a roll coater. In the transparent electrically conductive thin film layer, a thin film layer (Dt) comprising an oxide of indium and tin and a silver thin film layer (Dm) are laminated in an order of B/Dt (40 nm thick)/Dm (15 nm thick)/Dt (80 nm thick)/Dm (20 nm thick)/Dt (80 nm thick)/Dm (15 nm thick)/Dt (40 nm thick)/Dm (15 nm thick)/Dt (40 nm thick). The thin film layer comprising an oxide of indium and tin constitutes a high-refractive-index transparent thin film layer while the silver thin film layer constitutes a metallic thin film layer comprising silver or a silver alloy. For depositing the thin film layer comprising the oxide of indium and tin, an indium oxide/a tin oxide sintered body ($In_2O_3$:$SnO_2$=90:10 wt %) was used as a target and an argon-oxygen gaseous mixture (total pressure of 266 mPa; partial pressure of oxygen of 5 mPa) was used as a sputtering gas. For depositing a silver thin film layer, silver was used as a target and an argon gas (total pressure of 266 mPa) was used as a sputtering gas. For depositing a titanium layer, titanium was used as a target and an argon gas (total pressure of 266 mPa) was used as a sputtering gas.

Next, a roll of an anti-glare film (548 mm wide, 500 m long, 100 µm thick) was prepared in a state in which a transparent adhesive (100 µm thick) was bonded to a side thereof opposite to an anti-glare layer.

Subsequently, the thus-prepared anti-glare film was bonded on a transparent electrically conductive thin film layer of the transparent electrically conductive thin film via the transparent adhesive by means of a roll-to-roll method to prepare one roll. A center position of the transparent electrically conductive film was allowed to be in registry with a center position of the anti-glare film in a width direction. Further, on a surface opposite to the anti-glare layer of a bonded body made up of the transparent electrically conductive thin film and the anti-glare film, bonded was a transparent adhesive (100 µm thick) by a roll-to-roll method. Subsequently, a silver paste was applied to respective transparent electrically conductive thin film layer portions of 5 mm wide of both end parts of the roll by a roll coat method. On this occasion, a transfer rate of the roll was 0.5 m/s.

The resultant film was cut to a size of 958 mm long to prepare an electromagnetic wave shielding body. A cross-sectional diagram thereof was shown in FIG. 21. In FIG. 21, a reference numeral 23 denotes a transparent polymer film (B) having an electromagnetic wave shielding function, a reference numeral 30 denotes a transparent adhesive layer (C), and a reference numeral 24 denotes a transparent polymer film (B) having a functional transparent layer (A).

A time required for forming an electrode per sheet of the electromagnetic wave shielding body therein was examined.

Subsequently, the electromagnetic wave shielding body was attached to a front face of a plasma display panel (PX-42VP1; manufactured by NEC Corporation) via the transparent adhesive layer.

The electrode disposed on a surface facing to a viewer thereof was allowed to come into contact with a metallic member on a plate which is wired such that an electric current can be led to an outside of the display.

After the plasma display panel was actuated, an intensity of electromagnetic wave discharged externally was measured in accordance with FCC specifications Part 15J to examine whether or not the resultant measurements complied with Class A standards. A cross-sectional diagram was shown in FIG. 22.

Example 15

A roll of an anti-glare film (554 mm wide, 500 m long and 100 µm thick) was prepared and, then, a transparent electrically conductive thin film layer was formed on a surface opposite to an anti-glare layer thereof in the same manner as in Example 14. Subsequently, a transparent adhesive (548 mm wide and 100 μm thick) and an electrically conductive adhesive (3 mm wide and 100 μm thick) were bonded to the thus-formed transparent electrically conductive thin film layer by a roll-to-roll method. The electrically conductive adhesive was bonded to positions of both edge portions of the roll while the transparent adhesive was bonded to a remaining portion. By these procedures, an electromagnetic wave shielding body was prepared.

The electromagnetic wave shielding body was attached to a front face of a plasma display panel (PX-42VP1; manufactured by NEC Corporation). On each of 2 long sides of the plasma display panel, a copper foil tape was previously bonded along an edge portion thereof by 6 mm wide. An overlapped portion by the electrically conductive adhesive and the copper foil tape becomes a substantial electrode. The electrode positioned in a side of a viewing surface was allowed to come into contact with a plate type metallic member which is wired such that an electric current can be led to an outside of the display. Other arrangements than those described above are made in the same manner as in Example 14.

Example 16

A transparent electrically conductive thin film was prepared in the same manner as in Example 14.

Subsequently, a roll of an anti-glare film (558 mm wide, 500 m long, and 100 μm) was prepared. Center positions of the transparent electrically conductive thin film and the anti-glare film were allowed to be in registry with each other in a width direction. Further, on a surface opposite to the anti-glare layer of the resultant bonded body made up of the transparent electrically conductive thin film and the anti-glare film, bonded was a transparent adhesive (100 μm thick) by a roll-to-roll method.

A silver paste was applied to an edge portion of the roll. By the above-described procedures, an electromagnetic wave shielding body was prepared. A cross-sectional diagram was shown in FIG. 23.

A time required for forming an electrode per sheet of the electromagnetic wave shielding body therein was examined.

Subsequently, the electromagnetic wave shielding body was attached to a front face of a plasma display panel (PX-42VP1; manufactured by NEC Corporation). The electrode disposed was allowed to come into contact with a plate type metallic member which is wired such that an electric current can be led to an outside of the display.

After the plasma display panel was actuated, an intensity of electromagnetic wave discharged externally was measured in accordance with FCC specifications Part 15J to examine whether or not the resultant measurements complied with Class A standards.

Comparative Example 4

In the same manner as in Example 14, a roll of a polyethylene terephthalate film (558 mm wide, 500 m long and 75 μm thick) was prepared as a transparent polymer film (B) and, then, on one major surface thereof, formed was a transparent electrically conductive thin film layer.

A transparent adhesive (100 μm thick) was bonded to a surface opposite to a surface of the above-described film by a roll-to-roll method.

Further, while the resultant film was cut, it was bonded to a glass substrate (size being 560 mm×960 mm; thickness being 3 mm) via an adhesive of weak adhesive strength.

Subsequently, a roll of an anti-glare type film (548 mm wide, 500 m long and 100 μm thick) was prepared in a state in which a transparent adhesive was bonded to a side opposite to an anti-glare layer thereof and, then, on the transparent electrically conductive thin film layer of the above-described bonded body, the thus-prepared roll was bonded while it was cut. On this occasion, the thus-cut roll was bonded such that an edge thereof was positioned 5 mm inside from a peripheral portion of the transparent electrically conductive thin film layer.

A silver paste was applied by using a screen printing method such that an entire exposed portion of the transparent electrically conductive thin film layer positioned in a peripheral part thereof was covered and dried. After the silver paste was dried, the resultant film was removed from the glass substrate. By the above-described procedures, an electromagnetic wave shielding body was prepared. The others were conducted in the same manner as in Example 14.

Results are shown in Table 3.

TABLE 3

|  | Electrode formation time (second) (per sheet of electromagnetic wave shielding body) | Electromagnetic wave shielding effect (whether or not being within FCC Class A standards) |
|---|---|---|
| Example 14 | 2 | No problem |
| Example 15 | 2 | No problem |
| Example 16 | 0.5 | No problem |
| Comparative Example 4 | 180 | No problem |

As is evident from Table 3, in all examples, in regard to the electromagnetic wave shielding effect, there is no problem in the same manner as in a conventional case as shown in Comparative Example 4. Further, it can be seen that a time required for forming the electrode has substantially been decreased thereby substantially improving production efficiency.

Example 17

A roll of a polyethylene terephthalate film (565 mm wide, 500 m long and 75 μm thick) was prepared as a transparent polymer film (B). On one major surface thereof, a transparent electrically conductive layer (D) was deposited by a DC magnetron sputtering method by means of a roll coater. In the transparent electrically conductive thin film layer, a thin film layer (Dt) comprising an oxide of indium and tin and a silver thin film layer (Dm) are laminated in an order of B/Dt (40 nm thick)/Dm (15 nm thick)/Dt (80 nm thick)/Dm (20 nm thick)/Dt (80 nm thick)/Dm (15 nm thick)/Dt (40 nm thick)/Dm (15 nm thick)/Dt (40 nm thick). The thin film layer comprising an oxide of indium and tin constitutes a high-refractive-index transparent thin film layer while the silver thin film layer constitutes a metallic thin film layer comprising silver or a silver alloy. For depositing the thin film layer comprising the oxide of indium and tin, an indium oxide/a tin oxide sintered body ($In_2O_3$:$SnO_2$=90:10 wt %) was used as a target and an argon-oxygen gaseous mixture (total pressure of 266 mPa; partial pressure of oxygen of 5 mPa) was used as a sputtering gas. For depositing a silver thin film layer, silver was used as a target and an argon gas (total pressure of 266 mPa) was used as a sputtering gas. For depositing a titanium layer, titanium was used as a target and an argon gas (total pressure of 266 mPa) was used as a sputtering gas.

Next, a roll of an anti-glare film having a width of 565 mm and a length of 500 m was prepared in a state in which a transparent adhesive was bonded to a side thereof opposite to an anti-glare layer.

Subsequently, the thus-prepared anti-glare film was bonded on a transparent electrically conductive thin film layer of the transparent electrically conductive thin film via the transparent adhesive by a roll-to-roll method to prepare one roll. Further, on a surface opposite to the anti-glare layer of the resultant bonded body made up of the transparent electrically conductive thin film and the anti-glare film, bonded was a transparent adhesive by a roll-to-roll method.

Further, while the resultant film was cut, it was bonded to a transparent supporting substrate via a transparent adhesive.

Further, a silver paste was applied to an entire periphery of an edge portion of the film by using a screen printing method such that a side surface thereof was covered and, then, dried.

By the above-described procedures, an electromagnetic wave shielding body was prepared. A cross-sectional diagram was shown in FIG. 23.

2 points on the electrode which are remotest from each other were selected and, then, resistance therebetween was examined.

Further, a bonding time required for every sheet of the electromagnetic wave shielding body was examined. Furthermore, a bonding time required for every sheet of an optical filter comprising the transparent electrically conductive film and the anti-glare film was determined by dividing a total bonding time required for total roll-to-roll methods employed by a number of sheets of film which can be cut out of the roll.

Example 18

A roll of an anti-glare film having a width of 565 mm and a length of 500 m was prepared and, then, a transparent electrically conductive thin film layer was formed on a surface opposite to an anti-glare layer thereof in the same manner as in Example 17. Subsequently, a transparent adhesive was bonded on the transparent electrically conductive thin film layer by a roll-to-roll method.

While the thus-obtained film was being cut, it was bonded to a transparent supporting substrate via the transparent adhesive.

Further, a silver paste was applied to an entire periphery of an edge portion of the film such that a side surface thereof is covered by a screen printing method and, then, dried. By the above-described procedures, an electromagnetic wave shielding body was prepared.

On this occasion, 2 points on the electrode which are remotest from each other were selected and, then, resistance therebetween was examined.

Further, a bonding time required for every sheet of the electromagnetic wave shielding body was examined.

Example 19

A roll of an anti-glare film having a width of 565 mm and a length of 500 m was prepared and, then, a transparent electrically conductive thin film layer was formed on a surface opposite to an anti-glare layer thereof in the same manner as in Example 17 to prepare a roll of an anti-glare transparent electrically conductive film having a length of 500 m.

2 rolls of copper tapes (each being 15 mm wide, 75 $\mu$m thick and 500 m long; electrically conductive adhesive being attached to one side thereof) were prepared.

A copper tape was bonded to each of both edge portions of the anti-glare transparent electrically conductive film. A bonding operation was conducted such that a transparent electrically conductive layer formed as having an anti-glare transparent electrically conductive property came into contact with the electrically conductive adhesive of the copper tape. Further, an overlapping width between each copper tape and the anti-glare transparent electrically conductive film was allowed to be 10 mm. Bonding therebetween was conducted by a roll-to-roll method.

A roll of a transparent adhesive (575 mm wide, 25 $\mu$m thick and 500 m long) was prepared. The thus-prepared transparent adhesive was bonded on an anti-glare transparent electrically conductive film with a side face being bonded with a copper tape and, then, while keeping such a configuration, the resultant film was further cut out to be a sheet having a length of 958 mm and, thereafter, on a side on which the transparent electrically conductive layer and the copper tape had not been bonded of the thus-cut out sheet, an adhesive was allowed to be bonded. On this occasion, a bonding operation was conducted by a roll-to-roll method. By the above-described procedures, an electromagnetic wave shielding body was prepared. A cross-section thereof was shown in FIG. 24.

On this occasion, 2 points on the electrode which are remotest from each other were selected and, then, resistance therebetween was examined.

Further, a bonding time required for every sheet of the electromagnetic wave shielding body was examined.

Example 20

A roll of an anti-glare film having a width of 565 mm and a length of 500 m was prepared and, then, on a surface opposite to an anti-glare layer thereof, formed was a transparent electrically conductive thin film layer in the same manner as in Example 17. Subsequently, a transparent adhesive was bonded on the transparent electrically conductive thin film layer by a roll-to-roll method and, then, while keeping such a configuration, the resultant film was further cut out to be a sheet having a length of 958 mm thereby preparing an electromagnetic wave shielding body.

A glass substrate (size being 545 mm×960 mm, thickness being 3 mm) was prepared and, then, on each of 2 long sides thereof, disposed was a copper plate (size being 10 mm×960 mm, thickness being 3 mm). In this copper plate, provided were screw holes. These screw holes were formed at an interval of 30 mm in a longitudinal direction across the copper plate in a range of from one end to the other end thereof. On the resultant supporting substrate comprising a glass plate and the copper plate, bonded was an electromagnetic wave shielding body. Next, screws were fitted to respective screw holes which had been provided in the copper plate. A screw-fitting operation was conducted such that each of the screws was allowed to penetrate the electromagnetic wave shielding body from an outermost surface thereof. On this occasion, the screw became a substantial through-hole electrode. By the above-described procedures, an electromagnetic wave shielding body was prepared. A cross-sectional diagram was shown in FIG. 25.

On this occasion, 2 points on the electrode which are remotest from each other were selected and, then, resistance therebetween was examined.

Further, a bonding time required for every sheet of the electromagnetic wave shielding body was examined.

Comparative Example 5

A roll having a width of 565 mm and a length of 500 m of a polyethylene terephthalate film (75 $\mu$m thick) was prepared as a transparent polymer film (B). On one major surface thereof, a transparent electrically conductive thin film layer was formed.

On a surface of the above-described film that is opposite to a surface on which the transparent electrically conductive thin film was formed, a transparent adhesive was bonded by a roll-to-roll method.

Further, while the resultant film was being cut, the thus-cut film was bonded to a transparent supporting substrate via the transparent adhesive.

Subsequently, a roll of an anti-glare film having a width of 565 mm and a length of 500 m was prepared in a state in which a transparent adhesive was bonded on a side opposite to an anti-glare layer and, then, while the resultant film was being cut, the thus-cut film was bonded to the transparent electrically conductive thin film layer of such a laminate. On this occasion, a bonding operation was conducted such that an edge of the thus-cut film was positioned 5 mm inside from a peripheral portion of the transparent electrically conductive thin film layer.

Further, a silver paste was applied by a screen printing method such that an entire circumference of an exposed portion of the transparent electrically conductive thin film layer in a peripheral part was covered and, then, dried. By the above-described procedures, an electromagnetic wave shielding body was prepared.

On this occasion, 2 points on the electrode which are remotest from each other were selected and, then, resistance therebetween was examined.

Further, a bonding time required for every sheet of the electromagnetic wave shielding body was examined.

Results obtained are shown in Table 4.

TABLE 4

| | Lamination time per sheet of electromagnetic wave shielding body (second) | Resistance between electrodes (Ω) |
| --- | --- | --- |
| Example 17 | 180 | 7.2 |
| Example 18 | 120 | 7.3 |
| Example 19 | 120 | 7.1 |
| Example 20 | 120 | 7.3 |
| Comparative Example 5 | 230 | 7.1 |

As is evident from Table 4, in all the examples, electric resistance between electrodes has scarcely been decreased compared with a conventional electrode type material as shown in the comparative example. Further, it can be seen that, in all the examples, a film-bonding time required per sheet of the electromagnetic wave shielding body has substantially been reduced whereupon production efficiency of the electromagnetic wave shielding body has substantially been enhanced.

Example 21

Same procedures as in Example 1 were taken except for those described below.

A transparent laminate 1 was prepared as described below.

Polyethylene terephthalate pellets 1203 (manufactured by Unitika, Ltd.) were mixed with 0.25% by weight and 0.23% by weight of near-infrared ray absorption dyes SIR-128 and SIR-130 respectively, each manufactured by Mitsui Chemicals Inc., melted in a range of from 260° C. to 280° C., and extruded by a twin-screw extruder to prepare a polymer film (B) having a thickness of 188 μm.

Figure 27:
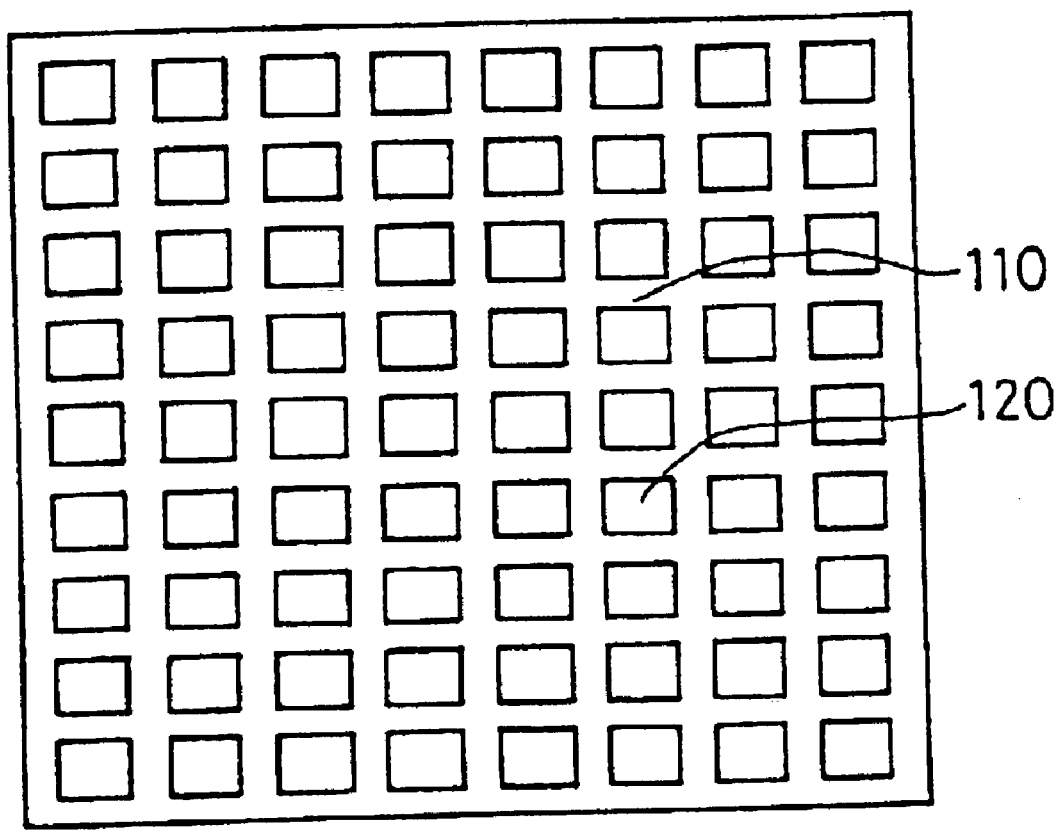
FIG. 27 is a diagram showing an example of a metal pattern.

On one major surface of the thus-prepared polymer film (B), a polyester type adhesive containing a cross-linking agent was coated in a thickness of 10 μm. Next, on the resultant film, a silver foil having a thickness of 7 μm, a hole diameter of 1 μm, and a porosity of 12% was laminated. On this occasion, molybdenum had previously been formed on both of the major surfaces of this silver foil by a sputtering method such that a thickness of molybdenum was allowed to be 50 μm. Next, by using a thermosetting type ink, a lattice pattern having a lattice width of 20 μm and a mesh size of 150 μm×150 μm was printed on a metal layer by a screen printing method. After the thus-used ink was cured by heating at 90° C. for 5 minutes, the metal layer of a portion which had not been protected by the ink was removed by an aqueous solution of ferric chloride and, then, the ink was removed by a solvent. Thus, a laminate having a metal layer in a pattern as shown in FIG. 27, and an open area ratio of 75% was able to be obtained. When average transmittance of a visible light ray was measured, it was 67%. When sheet resistance was measured, it was 0.11 Ω/square.

Example 22

Same procedures as in Example 3 have been taken except for those described below.

A polymer film (B)/a transparent electrically conductive layer (D) was prepared by procedures described below.

Polyethylene terephthalate pellets 1203 (manufactured by Unitika, Ltd.) were mixed with 0.25% by weight and 0.23% by weight of near-infrared ray absorption dyes SIR128 and SIR130 respectively, each manufactured by Mitsui Chemicals Inc., melted in a range of from 260° C. to 280° C., and extruded by a twin-screw extruder to prepare a polymer film (B) having a thickness of 188 μm.

On the thus-prepared polymer film (B), a silver foil having a thickness of 7 μm, a hole diameter of 1 μm and a porosity of 8% was laminated by using an acrylic adhesive. On this occasion, a chromate treatment had previously been performed on both surfaces of this silver foil. Next, an alkali-developing type photo-resist was applied on a copper layer and, then, the thus-applied photo-resist was pre-baked, exposed to light by using a photo-mask and developed to form a lattice pattern having a lattice width of 25 μm and a mesh size of 125 μm×125 μm thereon and, thereafter, a metal layer of a portion which had not been protected by the photo-resist was etched by an aqueous solution of ferric chloride and, next, the photo-resist was removed in an alkali solution. Thus, a laminate having a metal layer in a pattern as shown in FIG. 27 and an open area ratio of 69% was able to be obtained. When visible light transmittance thereof was measured, it was 65% and, sheet resistance thereof was 0.07 Ω/square.

From Table 5, it can be seen that, by using the electromagnetic wave shielding body according to the invention, Class B or Class A of the VCCI specifications can be satisfied. As the surface resistance of the transparent electrically conductive layer became lower, electromagnetic wave shielding capacity was excellent.

Further, it can be seen that, by using the electromagnetic wave shielding body according to the invention, it is excellent in near-infrared ray cutting-off capacity.

The electromagnetic wave shielding body according to the invention which uses a metallic mesh layer is excellent in visible light transmittance, as well as electromagnetic wave shielding capacity and a near-infrared light shielding property.

Further, by allowing the functional transparent layer (A) of the electromagnetic wave shielding body according to the invention to have various types of functions, the electromagnetic wave shielding body according to the invention is excellent in environmental resistance and/or scratch resistance and/or an anti-fouling property and/or an antistatic property.

TABLE 5

| Electromagnetic wave shielding body | | None | Example 21 | Example 22 | Comparative Example 1 |
|---|---|---|---|---|---|
| Surface resistance of transparent electrically conductive layer Ω/square | | — | 0.11 | 0.07 | 15 |
| Radiation field intensity dBµ/m | 33 MHz | 59 | 21 | 19 | 52 |
|  | 90 MHz | 52 | 24 | 21 | 49 |
| Near-infrared light transmittance % | 820 nm | — | 20 | 20 | 79 |
|  | 850 nm | — | 5 | 5 | 78 |
|  | 950 nm | — | 10 | 10 | 70 |
| Critical distance of malfunction m | | 5 or more | 0.8 | 0.8 | 5 or more |

EFFECT OF THE INVENTION

As described above in detail, according to the invention, a display filter that functions as a light controlled film which is excellent in a transmission characteristic, transmittance, and a reflection characteristic can be realized in a low cost manner. By forming the display filter directly on a screen of a display apparatus such as a plasma display, it is possible to enhance color purity and contrast thereof without tremendously detracting from luminance of the display and to realize the display apparatus having an excellent image.

Further, it is possible to realize a display filter that is excellent in a transmission characteristic, transmittance, and visible light ray reflectance and functions as an electromagnetic wave shielding body which blocks an electromagnetic wave to be emitted from a display apparatus such as a plasma display in a low cost manner. Furthermore, since the electromagnetic wave shielding body efficiently cuts off a near-infrared light, in a neighborhood of from 800 nm to 1,000 nm, emerging from the display, it exerts no adverse influence on wavelengths used in a remote controller of neighboring electronic equipment, optical communications by a transmission system or the like, and hence can prevent a malfunction thereof. Still further, it has good weather resistance and environmental resistance, as well as an anti-reflection property and/or an anti-glare property, scratch resistance, an anti-fouling property, an anti-electrostatic property and the like and can realize a display apparatus having an excellent image.

Still furthermore, by allowing a total thickness of a transparent polymer film which constitutes the display filter to be 0.3 mm or more, enhancement of a protection function and workability of the display panel can be aimed for and the electromagnetic wave shielding body or the light control film to be directly bonded to a front surface of the display can be provided.

Even still furthermore, by appropriately designing an electrode shape of the electromagnetic wave shielding body, sufficient electromagnetic wave shielding effect can be provided and, moreover, a time required for forming the electrode has substantially been reduced thereby substantially enhancing production efficiency.

What is claimed is:

1. A display filter capable of being adhered to a display screen and having predetermined filter characteristics, comprising:
   a functional transparent layer (A) disposed in an atmospheric side, having an anti-reflection property and/or an anti-glare property;
   a transparent adhesive layer (C) disposed in a display side, for allowing the display filter to be adhered to the screen; and
   a polymer film (B) disposed as a substrate between the functional transparent layer (A) and the transparent adhesive layer (C), wherein a dye having an absorption maximum in a wavelength range from 570 to 605 nm is contained in the display filter.

2. The display filter of claim 1, wherein the functional transparent layer (A) further has at least one function selected from the group consisting of a hard Coat property, an antistatic property, an anti-fouling property, a gas barrier property and an ultraviolet cutting-off property.

3. The display filter of claim 1, wherein visible light ray reflectance on a surface of the functional transparent layer (A) is 2% or less.

4. The display filter of claim 1, wherein visible light ray transmittance is from 30 to 85%.

5. The display filter of claim 1, wherein transmittance minimum in a wavelength range of from 800 to 1100 nm is 20% or less.

6. The display filter of claim 1, wherein a total thickness of the polymer film in entirety of the filter is 0.3 nm or more.

7. The display filter of claim 1, wherein a polymer film for increasing a total thickness capable of containing a dye is provided.

8. A display apparatus, comprising:
   a display for representing an image; and
   a display filter of claim 1, disposed on a display screen.

9. The display filter of claim 1, wherein at least one dye is contained in at least one layer selected from the group consisting of: the functional transparent layer (A), the polymer film (B) and the transparent adhesive layer (C).

10. The display filter of claim 9, wherein a near-infrared ray absorption dye having an absorption maximum in a wavelength range of from 800 to 1100 nm is contained.

11. The display filter of claim 1, wherein the dye is a tetraazaporphyrin compound.

12. The display filter of claim 11, wherein the tetraazaporphyrin compound is expressed by the following formula (1):
   wherein $A^1$ to $A^8$ each individually represent a hydrogen atom, a halogen atom, a nitro group, a cyano group, a hydroxy group, a sulfonic acid group, an alkyl group having carbon

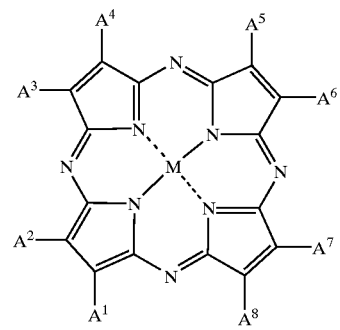

(1)

atoms of from 1 to 20, a halogenoalkyl group, an alkoxy group, an alkoxyalkoxy group, aryloxy group, a monoalkylamino group, dialkylamino group, an aralkyl group, an aryl group, a heteroaryl group, an alkylthio group, or an arylthio group; combinations of $A^1$ and $A^2$, $A^3$ and $A^4$, $A^5$ and $A^6$, and $A^7$ and $A^8$ may each individually form a ring except an aromatic ring via a connecting group; and M represents two hydrogen atoms, a divalent metal atom, a trivalent metal atom having one substituent, a tetravalent metal atom having two substituents, or an oxy metal atom.

13. The display filter of claim 1, wherein a hard coat layer (F) is formed on both surfaces or one surface of the polymer film (B).

14. The display filter of claim 13, wherein at least one dye is contained in at least one layer selected from the group consisting of: the functional transparent layer (A), the polymer film (B), the transparent adhesive layer (C) and the hard coat layer (F).

15. The display filter of claim 14, wherein a near-infrared ray absorption dye having an absorption maximum in a wavelength range of from 800 to 1100 nm is contained.

16. The display filter of claim 1, wherein an adhesive layer (E) is disposed between the functional transparent layer (A) and the polymer film (B).

17. The display filter of claim 16, wherein at least one dye is contained in at least one layer selected from the group consisting of: the functional transparent layer (A), the polymer film (B), the transparent adhesive layer (C) and the adhesive layer (E).

18. The display filter of claim 17, wherein a near-infrared ray absorption dye having an absorption maximum in a wavelength range of from 800 to 1100 run is contained.

19. The display filter of claim 16, wherein a hard coat layer (F) is formed on both surfaces or one surface of the polymer film (B).

20. The display filter of claim 19, wherein at least one dye is contained in at least one layer selected from the group consisting of: the functional transparent layer (A), the polymer film (B), the transparent adhesive layer (C), the adhesive layer (E) and the hard coat layer (F).

21. The display filter of claim 20, wherein a near-infrared ray absorption dye having an absorption maximum in a wavelength range of from 800 to 1100 nm is contained.

22. The display filter of claim 1, wherein a transparent electrically conductive layer (D) having a surface resistance of from 0.01 to 30 Ω/square is disposed between the functional transparent layer (A) and the polymer film (B) and/or between the polymer film (B) and the transparent adhesive layer (C).

23. The display filter of claim 22, wherein a communicating hole which communicates from an outermost surface of the filter through to at least the transparent electrically conductive layer (D) is formed along a thickness direction of the filter wherein an electrode which electrically is connected with the transparent electrically conductive layer (D) is formed inside the communication hole.

24. The display filter of claim 22, wherein an electrically conductive tape is interposed between the transparent electrically conductive layer (D) and a layer adjacent to the transparent electrically conductive layer (D).

25. The display filter of claim 22, wherein the transparent electrically conductive layer (D) is constituted by firstly depositing a repeating unit (Dt)/(Dm) comprising a high-refractive-index transparent thin film layer (Dt) and a metallic thin film layer (Dm) while repeating the repeating unit from 2 times to 4 times and, then, on the resultant deposit, further depositing a high-refractive-index thin film layer (Dt).

26. The display filter of claim 25, wherein at least one layer of a plurality of high-refractive-index transparent thin film layers (Dt) is formed by an oxide containing, as a major component, at least one metal selected from the group consisting of indium, tin and zinc.

27. The display filter of claim 25, wherein at least one layer of a plurality of metallic thin film layers (Din) is formed of silver or an alloy comprising silver.

28. The display filter of claim 22, wherein a hard coat layer (F) is formed on both surfaces or one surface of the polymer film (B).

29. The display filter of claim 28, wherein at least one dye is contained in at least one layer selected from the group consisting of: the functional transparent layer (A), the polymer film (B), the transparent adhesive layer (C), a transparent electrically conductive layer (D) and the hard coat layer (F).

30. The display filter of claim 29, wherein a near-infrared ray absorption dye having an absorption maximum in a wavelength range of from 800 to 1100 nm is contained.

31. The display filter of claim 22, wherein at least one dye is contained in at least one layer selected from the group consisting of: the functional transparent layer (A), the polymer film (B), the transparent adhesive layer (C) and a transparent electrically conductive layer (D).

32. The display filter of claim 31, wherein a near-infrared ray absorption dye having an absorption maximum in a wavelength range of from 800 to 1100 nm is contained.

33. The display filter of claim 22, wherein a portion or entirety of the transparent electrically conductive layer (D) is constituted by an electrically conductive mesh.

34. The display filter of claim 33, wherein an electrode electrically connected with the transparent electrically conductive layer (D) is formed.

35. The display filter of claim 34, wherein an electrode is formed in an electrically conducting portion a part of which is exposed.

36. The display filter of claim 35, wherein the filter is shaped into a rectangle and electrodes are formed in two surrounding sides facing to each other.

37. The display filter of claim 35, where the electrode electrically connected with the transparent electrically conductive layer (D) is formed on a surface of a peripheral edge of the filter.

38. The display filter of claim 22, wherein an electrode electrically connected with the transparent electrically conductive layer (D) is formed.

39. A method for production of a display apparatus, comprising the steps of:
   laminating a display filter of claim 38 on a display screen of a display apparatus via a transparent adhesive layer (C); and
   electrically connecting ground conductor of the display apparatus and the electrode of the transparent electrically conductive layer (D).

40. The display filter of claim 38, wherein the electrode electrically contacting with the transparent electrically conductive layer (D) is continuously formed along a circumferential direction in a peripheral portion of the filter.

41. The display filter of claim 40, wherein the filter is shaped into a rectangle and electrodes are formed in two surrounding sides facing to each other.

42. The display filter of claim 40, where the electrode electrically connected with the transparent electrically conductive layer (D) is formed on a surface of a peripheral edge of the filter.

43. The display filter of claim 38, wherein the electrode electrically contacting with the transparent electrically conductive layer (D) is continuously formed along a circumferential direction in a peripheral portion of the filter.

44. The display filter of claim 43, wherein the filter is shaped into a rectangle and electrodes are formed in two surrounding sides facing to each other.

45. The display filter of claim 43, where the electrode electrically connected with the transparent electrically conductive layer (D) is formed on a surface of a peripheral edge of the filter.

46. The display filter of claim 38, wherein an electrode is formed in an electrically conducting portion a part of which is exposed.

47. The display filter of claim 46, wherein the filter is shaped into a rectangle and electrodes are formed in two surrounding sides facing to each other.

48. The display filter of claim 46, where the electrode electrically connected with the transparent electrically conductive layer (D) is formed on a surface of a peripheral edge of the filter.

49. The display filter of claim 22, wherein an adhesive layer (B) is disposed between the functional transparent layer (A) and the polymer film (B).

50. The display filter of claim 49, wherein a hard coat layer (F) is formed on both surfaces or one surface of the polymer film (B).

51. The display filter of claim 50, wherein at least one dye is contained in at least one layer selected from the group consisting of: the functional transparent layer (A), the polymer film (B), the transparent adhesive layer (C), a transparent electrically conductive layer (D), the adhesive layer (E) and the hard coat layer (F).

52. The display filter of claim 51, wherein a near-infrared ray absorption dye having an absorption maximum in a wavelength range of from 800 to 1100 nm is contained.

53. The display filter of claim 49, wherein at least one dye is contained in at least one layer selected from the group consisting of: the functional transparent layer (A), the polymer film (B), the transparent adhesive layer (C), a transparent electrically conductive layer (D) and the adhesive layer (E).

54. The display filter of claim 53, wherein a near-infrared ray absorption dye having an absorption maximum in a wavelength range of from 800 to 1100 nm is contained.

55. A method of production of a display apparatus, comprising the steps of:

laminating a laminate filter comprising a polymer film (B), a transparent electrically conductive layer (D), and a transparent adhesive layer (C) on a display screen via the transparent adhesive layer (C);

arranging a functional transparent layer (A) having an anti-reflection property and/or an anti-glare property on the laminate filter directly or via a second adhesive layer; and electrically connecting ground conductor of the display apparatus and the transparent electrically conductive layer (D), wherein a dye having an absorption maximum in a wavelength range from 570 to 605 nm is contained in the laminate filter.

56. A method for production of a display apparatus, characterized by comprising the steps of:

arranging an adhesive layer on a display screen of a display apparatus;

bonding a laminate filter comprising a polymer film (B), a transparent electrically conductive layer (D), and a functional transparent layer (A) having an anti-reflection property and/or an anti-glare property on the display screen via the adhesive layer; and electrically connecting ground conductor and the transparent electrically conductive layer (D), wherein a dye having an absorption maximum in a wavelength range from 570 to 605 nm is contained in the laminate filter.

57. A method for production of a display apparatus, comprising the steps of:

arranging an adhesive layer on a display screen;

bonding a laminate filter comprising a polymer film (B), and a transparent electrically conductive layer (D) on the display screen via the adhesive layer;

arranging a functional transparent layer (A) having an anti-reflection property and/or an anti-glare property on the laminate filter directly or via a second adhesive layer; and electrically connecting a ground conductor and the transparent electrically conductive layer (D), wherein a dye having an absorption maximum in a wavelength range from 570 to 605 nm is contained in the laminate filter.

* * * * *

UNITED STATES PATENT AND TRADEMARK OFFICE
CERTIFICATE OF CORRECTION

PATENT NO. : 6,965,191 B2 Page 1 of 1
DATED : November 15, 2005
INVENTOR(S) : Katsuhiko Koike et al.

It is certified that error appears in the above-identified patent and that said Letters Patent is hereby corrected as shown below:

<u>Title page,</u>
Item [30], Foreign Application Priority Data, change "2000-38410" to
-- 2000-384101 --.

Signed and Sealed this

Twenty-eighth Day of March, 2006

JON W. DUDAS
*Director of the United States Patent and Trademark Office*